United States Patent
Nishiwaki

(10) Patent No.: US 9,494,742 B2
(45) Date of Patent: Nov. 15, 2016

(54) LIGHT CAPTURING SHEET, LIGHT CAPTURING ROD, LIGHT RECEIVING DEVICE USING LIGHT CAPTURING SHEET OR LIGHT CAPTURING ROD, LIGHT EMITTING DEVICE USING LIGHT CAPTURING SHEET OR LIGHT CAPTURING ROD, AND OPTICAL-FIBER AMPLIFIER USING LIGHT CAPTURING SHEET OR LIGHT CAPTURING ROD

(71) Applicant: Panasonic Intellectual Property Management Co., Ltd., Osaka (JP)

(72) Inventor: Seiji Nishiwaki, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 110 days.

(21) Appl. No.: 14/630,275

(22) Filed: Feb. 24, 2015

(65) Prior Publication Data
US 2015/0168651 A1 Jun. 18, 2015

Related U.S. Application Data

(63) Continuation of application No. PCT/JP2014/002711, filed on May 23, 2014.

(30) Foreign Application Priority Data

Jun. 13, 2013 (JP) ................................. 2013-124786

(51) Int. Cl.
G02B 6/124 (2006.01)
G02B 6/34 (2006.01)
(Continued)

(52) U.S. Cl.
CPC ............... *G02B 6/34* (2013.01); *G01J 1/0407* (2013.01); *G02B 5/1809* (2013.01);
(Continued)

(58) Field of Classification Search
CPC ...... G02B 6/124; G02B 6/34; G02B 6/0016; G02B 6/02057; G02B 5/1814; G02B 5/1819; G02B 5/1823
See application file for complete search history.

(56) References Cited

U.S. PATENT DOCUMENTS 6,297,908 B1* 10/2001 Suga .................... G02B 5/0242
349/64
6,937,399 B2* 8/2005 Takahashi ............ G02B 5/0242
359/599

(Continued)

FOREIGN PATENT DOCUMENTS

JP 2010-508553 3/2010
WO 2007/137438 12/2007

(Continued)

OTHER PUBLICATIONS

International Search Report of PCT application No. PCT/JP2014/002711 dated Aug. 12, 2014.

(Continued)

*Primary Examiner* — Tony Ko
(74) *Attorney, Agent, or Firm* — McDermott Will & Emery LLP

(57) ABSTRACT

A light capturing sheet includes a light transmitting sheet and a plurality of optical coupling structures disposed therein. The optical coupling structures each include a first light-transmitting layer, a second light-transmitting layer, a third light-transmitting layer interposed therebetween, and a diffraction grating. Refractive indices of the first and second light-transmitting layers are lower than a refractive index of the light transmitting sheet, and a refractive index of the third light-transmitting layer is higher than the refractive indices of the first and second light-transmitting layers. The optical coupling structures are arranged in first and second directions in a plane parallel to principal surfaces of the light transmitting sheet, and in a third direction not parallel thereto.

20 Claims, 33 Drawing Sheets

(51) Int. Cl.
    *H01L 31/054*    (2014.01)
    *G02B 5/18*      (2006.01)
    *G01J 1/04*      (2006.01)
    *F21V 8/00*      (2006.01)
    *H01S 3/094*     (2006.01)
    *H02S 40/20*     (2014.01)
    *H01S 3/067*     (2006.01)

(52) U.S. Cl.
    CPC ......... *G02B 5/1819* (2013.01); *G02B 5/1823* (2013.01); *G02B 5/1842* (2013.01); *G02B 6/0006* (2013.01); *H01L 31/054* (2014.12); *H01S 3/06754* (2013.01); *H01S 3/094019* (2013.01); *H02S 40/20* (2014.12); *H01S 3/067* (2013.01); *Y02E 10/52* (2013.01)

(56) References Cited

U.S. PATENT DOCUMENTS

| 2009/0257126 A1 | 10/2009 | Walter et al. |
| 2013/0264470 A1 | 10/2013 | Nishiwaki |
| 2013/0299684 A1 | 11/2013 | Nishiwaki et al. |

FOREIGN PATENT DOCUMENTS

| WO | 2008/053078 | 5/2008 |
| WO | 2012/046414 | 4/2012 |
| WO | 2013/069248 | 5/2013 |

OTHER PUBLICATIONS

Hiroshi Nishihara et al., "Opto-Electronic Integrated Circuit", Ohmsha, p. 94, p. 243, Feb. 25, 1985.

\* cited by examiner

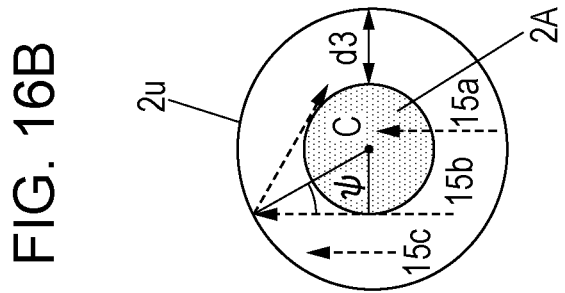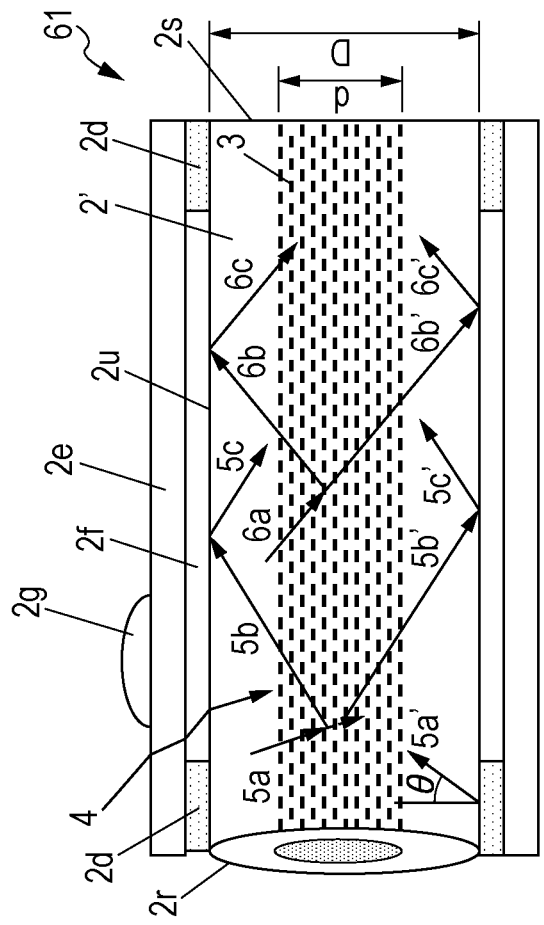

LIGHT CAPTURING SHEET, LIGHT CAPTURING ROD, LIGHT RECEIVING DEVICE USING LIGHT CAPTURING SHEET OR LIGHT CAPTURING ROD, LIGHT EMITTING DEVICE USING LIGHT CAPTURING SHEET OR LIGHT CAPTURING ROD, AND OPTICAL-FIBER AMPLIFIER USING LIGHT CAPTURING SHEET OR LIGHT CAPTURING ROD

BACKGROUND

1. Technical Field

The present application relates to light capturing sheets and light capturing rods that capture light by utilizing diffraction, and to light receiving devices using such light capturing sheets or light capturing rods, light emitting devices using such light capturing sheets or light capturing rods, and optical-fiber amplifiers using such light capturing sheets or light capturing rods.

2. Description of the Related Art

When causing light to propagate between two light propagation media having different refractive indices, since the light is transmitted and reflected at the interface, it is normally difficult to transfer the light from one light propagation medium to the other light propagation medium with high efficiency and to maintain this state. As a technique for capturing light from an ambient medium, such as air, into a transparent sheet, for example, a grating coupling technique in the related art discussed in "Hikari-Shuuseki-Kairo (Optical Integrated Circuit)" (Hiroshi Nishihara et al., Ohmsha Ltd., Feb. 25, 1985, p. 94, p. 243) is known. FIGS. 23A and 23B illustrate the principle of the grating coupling technique, and are a cross-sectional view and a plan view, respectively, of a light transmitting layer 20 provided with a linear grating having a pitch $\Lambda$ at the surface thereof. As shown in FIG. 23A, when light 23a with a wavelength $\lambda$ becomes incident on the grating at a specific incident angle $\theta$, the light 23a becomes coupled to guided light 23B that propagates through the light transmitting layer 20.

"Hikari-Shuuseki-Kairo (Optical Integrated Circuit)" (Hiroshi Nishihara et al., Ohmsha Ltd., Feb. 25, 1985, p. 94, p. 243) is an example of the related art.

SUMMARY

According to an examination by the present applicant, with the grating coupling technique in the related art, it is difficult for the transparent sheet to capture light in a wide wavelength range at a wide incident angle from a wide area. One non-limiting and exemplary embodiment of the present disclosure provides a light capturing sheet that is capable of capturing light in a wide wavelength range at a wide incident angle from a wide area.

In one general aspect, the techniques disclosed here feature a light capturing sheet including a light transmitting sheet having first and second principal surfaces; and a plurality of optical coupling structures that are disposed within the light transmitting sheet and that are distant from the first and second principal surfaces by first and second distances or more, respectively. The plurality of optical coupling structures each include a first light-transmitting layer, a second light-transmitting layer, and a third light-transmitting layer interposed between the first light-transmitting layer and the second light-transmitting layer. A refractive index of each of the first and second light-transmitting layers is lower than a refractive index of the light transmitting sheet. A refractive index of the third light-transmitting layer is higher than the refractive index of each of the first and second light-transmitting layers. The plurality of optical coupling structures each have a diffraction grating that is parallel to the first and second principal surfaces of the light transmitting sheet. The plurality of optical coupling structures are three-dimensionally arranged within the light transmitting sheet in first and second directions, which are different from each other in a plane parallel to the first and second principal surfaces, and in a third direction that is not parallel to the first and second directions. A plurality of the optical coupling structures arranged in the first and second directions in the plane constitute a first group of optical coupling structures. A plurality of the optical coupling structures arranged in the first and second directions in another plane parallel to the plane constitute a second group of optical coupling structures. The first group of optical coupling structures and the second group of optical coupling structures are adjacent to each other in the third direction. Each optical coupling structure constituting the first group of optical coupling structures and each optical coupling structure constituting the second group of optical coupling structures do not overlap with each other in the third direction. The third light-transmitting layer in a first optical coupling structure included in the first group of optical coupling structures and the third light-transmitting layer in a second optical coupling structure included in the second group of optical coupling structures and adjacent to the first optical coupling structure are connected to each other by a connection portion composed of a material identical to the third light-transmitting layer.

It should be noted that general or specific embodiments may be implemented as a system, a method, an integrated circuit, a computer program, a storage medium, or any selective combination thereof.

The light capturing sheet according to the one general aspect of the present disclosure is capable of capturing light in a wide wavelength range at a wide incident angle from a wide area.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 16A is a schematic cross-sectional view of a light capturing rod according to an embodiment of the present disclosure, taken in directions parallel to a central axis;

FIG. 16B is a schematic cross-sectional view of a light capturing rod according to an embodiment of the present disclosure, taken in directions orthogonal to a central axis;

DETAILED DESCRIPTION (Underlying Knowledge Forming Basis of the Present Disclosure The present applicant has examined the method disclosed in "Hikari-Shuuseki-Kairo (Optical Integrated Circuit)" (Hiroshi Nishihara et al., Ohmsha Ltd., Feb. 25, 1985, p. 94, p. 243) in detail. According to the examination result, the light transmitting layer 20 is only capable of capturing light that satisfies a predetermined condition, but does not capture light that does not satisfy the condition. FIG. 23C is a vector diagram of light incident on the grating provided in the light transmitting layer 20. In FIG. 23C, circles 21 and 22 are centered on a point O. The radius of the circle 21 is equal to a refractive index $n_0$ of an ambient medium 1 surrounding the light transmitting layer 20, and the radius of the circle 22 is equal to an equivalent refractive index $n_{eff}$ of the guided light 23B. The equivalent refractive index $n_{eff}$ is dependent on the thickness of the light transmitting layer 20 and is a specific value ranging from the refractive index $n_0$ of the ambient medium 1 to a refractive index $n_1$ of the light transmitting layer 20 in accordance with the guide mode. FIG. 23D illustrates the relationship between an effective thickness $t_{eff}$ and the equivalent refractive index $n_{eff}$ in a case where light propagates through the light transmitting layer 20 in a TE mode. The effective thickness is the thickness of the light transmitting layer 20 when there is no grating. When there is a grating, the effective thickness is determined by adding an average height of the grating to the thickness of the light transmitting layer 20. The guided light to be excited has, for example, a zero-th order mode, a first-order mode, and a second-order mode, which have different characteristic curves, as shown in FIG. 23D. In FIG. 23C, a point P is where a line drawn along an incident angle θ from the point O intersects with the circle 21, a point P' is where a vertical line from the point P intersects with the x-axis, and points Q and Q' are intersection points between the circle 22 and the x-axis. An optical coupling condition in the x-axis positive direction is expressed by the length between P' and Q being equal to an integral multiple of λ/Λ, and an optical coupling condition in the negative direction is expressed by the length between P' and Q' being equal to an integral multiple of λ/Λ. In this case, λ denotes the wavelength of the light, and Λ denotes the pitch of the grating. Specifically, the optical coupling condition is expressed by expression (1).

[Math. 1]

$$\sin\theta = \pm n_{eff} + q\frac{\lambda}{\Lambda} \quad (1)$$

In this case, q denotes a diffraction order expressed by an integer. At incident angles other than θ determined based on expression (1), light does not undergo coupling within the light transmitting layer 20. Furthermore, light beams of the same incident angle θ are not coupled if they have different wavelengths.

Figure 23A:
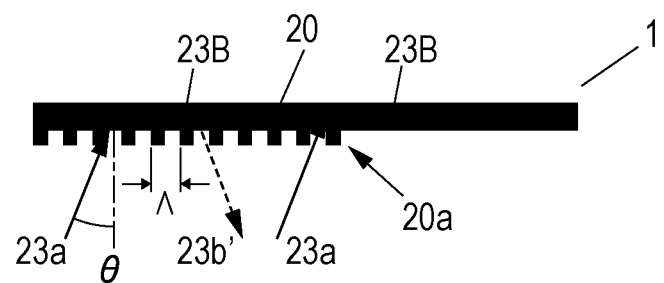
FIG. 23A is a cross-sectional view of a linear grating for capturing light based on a grating coupling technique.
Figure 23B:
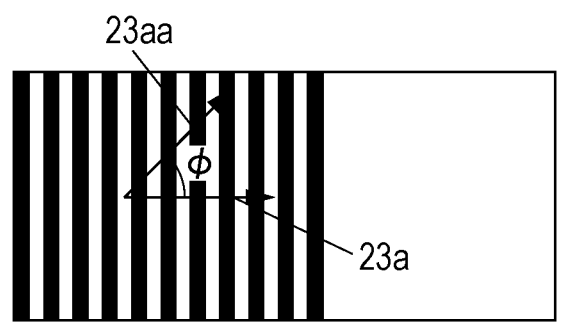
FIG. 23B is a plan view of a linear grating for capturing light based on a grating coupling technique.
Figure 23C:
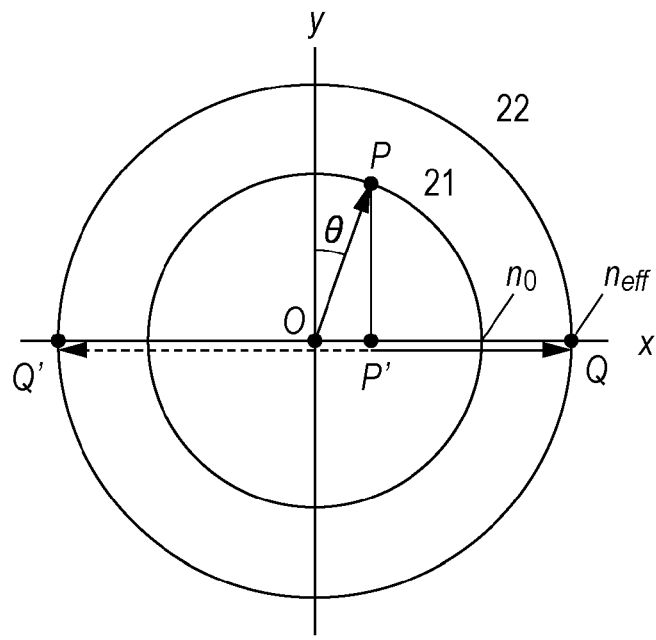
FIG. 23C is a diagram illustrating the principle of the grating coupling technique.
Figure 23D:
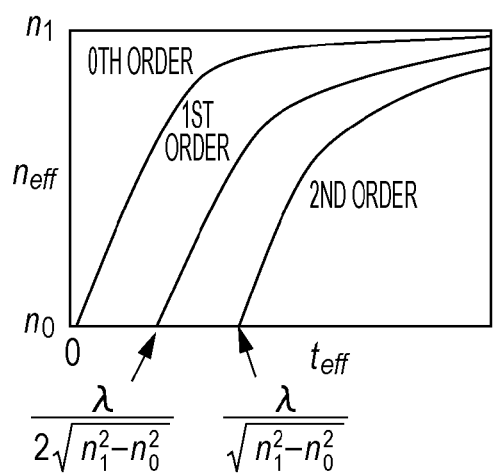
FIG. 23D is a diagram illustrating the principle of the grating coupling technique.

As shown in FIG. 23B, a substantial pitch of the grating in the light transmitting layer 20 relative to light 23aa incident on the light transmitting layer 20 at a direction angle φ, which has been shifted from the incident direction of the light 23a by an angle φ, is Λ/cos φ. Therefore, the light 23a incident from a different direction may satisfy the optical coupling condition even when the incident angle θ and the wavelength are different from the condition defined by expression (1). In other words, in a case where a change in the direction of light incident on the light transmitting layer 20 is to be permitted, the optical coupling condition indicated by expression (1) becomes broad to some extent. However, it is not possible to couple incident light in a wide wavelength range and at all incident angles to the guided light 23B.

Furthermore, while the guided light 23B propagates through the grating region, light 23b' is radiated in the same direction as reflected light of the incident light 23a. Thus, even when light becomes incident on a position far from an end 20a of the grating and propagates through the light transmitting layer 20 as the guided light 23B, the light attenuates by the time it reaches the end 20a of the grating.

Therefore, only the light 23*a* incident on a position near the end 20*a* of the grating can propagate through the light transmitting layer 20 as the guided light 23B without being attenuated due to radiation. In other words, even if the area of the grating is increased for coupling many light beams, it is not possible for all light beams incident on the grating to propagate therethrough as the guided light 23B. In view of such problems, the present applicant has conceived of a new light capturing sheet. A light capturing sheet, a light capturing rod, a light receiving device, a light emitting device, and an optical-fiber amplifier according to aspects of the present application are as follows.

A light capturing sheet according to an aspect of the present disclosure includes a light transmitting sheet having first and second principal surfaces; and a plurality of optical coupling structures that are disposed within the light transmitting sheet and that are distant from the first and second principal surfaces by first and second distances or more, respectively. The plurality of optical coupling structures each include a first light-transmitting layer, a second light-transmitting layer, and a third light-transmitting layer interposed between the first light-transmitting layer and the second light-transmitting layer. A refractive index of each of the first and second light-transmitting layers is lower than a refractive index of the light transmitting sheet. A refractive index of the third light-transmitting layer is higher than the refractive index of each of the first and second light-transmitting layers. The plurality of optical coupling structures each have a diffraction grating that is parallel to the first and second principal surfaces of the light transmitting sheet. The plurality of optical coupling structures are three-dimensionally arranged within the light transmitting sheet in first and second directions, which are different from each other in a plane parallel to the first and second principal surfaces, and in a third direction that is not parallel to the first and second directions. A plurality of the optical coupling structures arranged in the first and second directions in the plane constitute a first group of optical coupling structures. A plurality of the optical coupling structures arranged in the first and second directions in another plane parallel to the plane constitute a second group of optical coupling structures. The first group of optical coupling structures and the second group of optical coupling structures are adjacent to each other in the third direction. Each optical coupling structure constituting the first group of optical coupling structures and each optical coupling structure constituting the second group of optical coupling structures do not overlap with each other in the third direction. The third light-transmitting layer in a first optical coupling structure included in the first group of optical coupling structures and the third light-transmitting layer in a second optical coupling structure included in the second group of optical coupling structures and adjacent to the first optical coupling structure are connected to each other by a connection portion composed of a material identical to the third light-transmitting layer.

In the light capturing sheet according to another aspect of the present disclosure, the first light-transmitting layer and the second light-transmitting layer may each have a plurality of high refractive-index portions and a plurality of low refractive-index portions that are alternately arranged in a direction parallel to the first and second principal surfaces of the light transmitting sheet. Refractive indices of the plurality of high refractive-index portions and the plurality of low refractive-index portions in each of the first and second light-transmitting layers may be lower than the refractive index of the light transmitting sheet. The refractive index of the third light-transmitting layer may be higher than the refractive indices of the plurality of high refractive-index portions and the plurality of low refractive-index portions in each of the first and second light-transmitting layers. The refractive index of the plurality of high refractive-index portions may be higher than the refractive index of the plurality of low refractive-index portions.

In the light capturing sheet according to another aspect of the present disclosure, the first light-transmitting layer in the first optical coupling structure and the first light-transmitting layer in the second optical coupling structure may be connected to each other by a connection portion composed of a material identical to the first light-transmitting layer. The second light-transmitting layer in the first optical coupling structure and the second light-transmitting layer in the second optical coupling structure may be connected to each other by a connection portion composed of a material identical to the second light-transmitting layer.

In the light capturing sheet according to another aspect of the present disclosure, the optical coupling structures in the first group and the optical coupling structures in the second group may each have a rectangular shape in the plane parallel to the first and second principal surfaces. The first group of optical coupling structures and the second group of optical coupling structures may each be arranged in a checkered pattern without overlapping when viewed from a direction orthogonal to the first and second principal surfaces.

In the light capturing sheet according to another aspect of the present disclosure, the optical coupling structures in the first group and the optical coupling structures in the second group may each have a hexagonal shape in the plane parallel to the first and second principal surfaces. In at least two adjacent optical coupling structures in each of the first group of optical coupling structures and the second group of optical coupling structures, the first light-transmitting layers, the second light-transmitting layers, and the third light-transmitting layers may be respectively connected to each other.

With regard to each of the first group of optical coupling structures and the second group of optical coupling structures in the light capturing sheet according to another aspect of the present disclosure, in at least two optical coupling structures located in a direction orthogonal to one side of the hexagonal shape, the first light-transmitting layers, the second light-transmitting layers, and the third light-transmitting layers may be respectively connected to each other.

In the light capturing sheet according to another aspect of the present disclosure, a pitch of each diffraction grating may range between 0.1 μm and 3 μm, surfaces of the first and second light-transmitting layers in each optical coupling structure may each have a size that circumscribes a circle with a diameter smaller than or equal to 100 μm, and a thickness of each of the plurality of optical coupling structures may be smaller than or equal to 3 μm.

In at least two of the plurality of optical coupling structures in the light capturing sheet according to another aspect of the present disclosure, the diffraction gratings may extend in directions different from each other, or the diffraction gratings may have pitches different from each other.

In the light capturing sheet according to another aspect of the present disclosure, surfaces, which are in contact with the light transmitting sheet, of the first and second light-transmitting layers in at least one of the plurality of optical coupling structures, the first principal surface, or the second principal surface may be provided with an irregular-surface structure whose pitch and height are smaller than or equal to ⅓ of a central wavelength of light entering the optical coupling structure.

A light capturing rod according to an aspect of the present disclosure includes a light transmitting rod that has a principal surface and that is circular or elliptical in cross section; and a plurality of optical coupling structures that are disposed within the light transmitting rod and that are distant from the principal surface by a first distance or more. The plurality of optical coupling structures each include a first light-transmitting layer, a second light-transmitting layer, and a third light-transmitting layer interposed between the first light-transmitting layer and the second light-transmitting layer. A refractive index of each of the first and second light-transmitting layers is lower than a refractive index of the light transmitting rod. A refractive index of the third light-transmitting layer is higher than the refractive index of each of the first and second light-transmitting layers. The plurality of optical coupling structures each have a diffraction grating that is parallel to a central axis of the light transmitting rod. The plurality of optical coupling structures are three-dimensionally arranged within the light transmitting rod in first and second directions, which are different from each other in a cylindrical side surface located at a predetermined distance from the central axis of the rod, and in a third direction extending from the cylindrical side surface toward the central axis. A plurality of the optical coupling structures arranged in the first and second directions in the cylindrical side surface constitute a first group of optical coupling structures. A plurality of the optical coupling structures arranged in the first and second directions in another cylindrical side surface whose distance from the central axis of the rod is different from the cylindrical side surface constitute a second group of optical coupling structures. The first group of optical coupling structures and the second group of optical coupling structures are adjacent to each other in the third direction. Each optical coupling structure constituting the first group of optical coupling structures and each optical coupling structure constituting the second group of optical coupling structures do not overlap with each other in the third direction. The third light-transmitting layer in a first optical coupling structure included in the first group of optical coupling structures and the third light-transmitting layer in a second optical coupling structure included in the second group of optical coupling structures and adjacent to the first optical coupling structure are connected to each other by a connection portion composed of a material identical to the third light-transmitting layer.

In the light capturing rod according to another aspect of the present disclosure, the first light-transmitting layer and the second light-transmitting layer may each have a plurality of high refractive-index portions and a plurality of low refractive-index portions that are alternately arranged in a direction parallel to the principal surface of the light transmitting rod. Refractive indices of the plurality of high refractive-index portions and the plurality of low refractive-index portions in each of the first and second light-transmitting layers may be lower than the refractive index of the light transmitting rod. The refractive index of the third light-transmitting layer may be higher than the refractive indices of the plurality of high refractive-index portions and the plurality of low refractive-index portions in each of the first and second light-transmitting layers. The refractive index of the plurality of high refractive-index portions may be higher than the refractive index of the plurality of low refractive-index portions.

In the light capturing rod according to another aspect of the present disclosure, the first light-transmitting layer in the first optical coupling structure and the first light-transmitting layer in the second optical coupling structure may be connected to each other by a connection portion composed of a material identical to the first light-transmitting layer. The second light-transmitting layer in the first optical coupling structure and the second light-transmitting layer in the second optical coupling structure may be connected to each other by a connection portion composed of a material identical to the second light-transmitting layer.

In the light capturing rod according to another aspect of the present disclosure, the optical coupling structures in the first group and the optical coupling structures in the second group may each have a rectangular shape in a plane parallel to the principal surface. The first group of optical coupling structures and the second group of optical coupling structures may each be arranged in a checkered pattern without overlapping when viewed from a direction orthogonal to the principal surface.

In the light capturing rod according to another aspect of the present disclosure, the optical coupling structures in the first group and the optical coupling structures in the second group may each have a hexagonal shape in a plane parallel to the principal surface. In at least two adjacent optical coupling structures in each of the first group of optical coupling structures and the second group of optical coupling structures, the first light-transmitting layers, the second light-transmitting layers, and the third light-transmitting layers may be respectively connected to each other.

With regard to each of the first group of optical coupling structures and the second group of optical coupling structures in the light capturing rod according to another aspect of the present disclosure, in at least two optical coupling structures located in a direction orthogonal to one side of the hexagonal shape, the first light-transmitting layers, the second light-transmitting layers, and the third light-transmitting layers may be respectively connected to each other.

In the light capturing rod according to another aspect of the present disclosure, a pitch of each diffraction grating may range between 0.1 μm and 3 μm, surfaces of the first and second light-transmitting layers in each optical coupling structure may each have a size that circumscribes a circle with a diameter smaller than or equal to 100 μm, and a thickness of each of the plurality of optical coupling structures may be smaller than or equal to 3 μm.

In at least two of the plurality of optical coupling structures in the light capturing rod according to another aspect of the present disclosure, the diffraction gratings may extend in directions different from each other, or the diffraction gratings may have pitches different from each other.

In the light capturing rod according to another aspect of the present disclosure, surfaces, which are in contact with the light transmitting rod, of the first and second light-transmitting layer in at least one of the plurality of optical coupling structures, or the principal surface may be provided with an irregular-surface structure whose pitch and height are smaller than or equal to ⅓ of a central wavelength of light entering the optical coupling structure.

A light receiving device according to an aspect of the present disclosure includes the aforementioned light capturing sheet; and a photoelectric converter provided at any one of the first principal surface and the second principal surface of the light capturing sheet, and an end surface adjacent to the first principal surface and the second principal surface.

The light receiving device according to another aspect of the present disclosure may further include a second one of the aforementioned light capturing sheet. The first principal surface of the light capturing sheet may be provided with the photoelectric converter. An end surface of the second one of the light capturing sheet may be connected to the second principal surface of the light capturing sheet.

A light receiving device according to another aspect of the present disclosure includes the aforementioned light capturing sheet; an irregular-surface structure or a prism sheet provided at the first principal surface or the second principal surface of the light capturing sheet; and a photoelectric converter that receives light output from the irregular-surface structure or the prism sheet.

A light receiving device according to another aspect of the present disclosure includes the aforementioned light capturing sheet; and an irregular-surface structure provided at a part of the first principal surface or the second principal surface of the light capturing sheet.

A light emitting device according to an aspect of the present disclosure includes the aforementioned light capturing sheet; a light source provided near one of the first principal surface and the second principal surface of the light capturing sheet; an irregular-surface structure provided at the other one of the first principal surface and the second principal surface of the light capturing sheet; and a prism sheet disposed so as to receive light output from the irregular-surface structure.

A light emitting device according to another aspect of the present disclosure includes the aforementioned light capturing rod; and at least one light source disposed near a principal surface of the light transmitting rod.

In the light emitting device according to another aspect of the present disclosure, a plurality of the light sources may be provided, and each light source may emit visible light or infrared light.

The light emitting device according to another aspect of the present disclosure may further include a prism sheet or an irregular-surface structure provided at a part of the principal surface of the light transmitting rod.

An optical-fiber amplifier according to an aspect of the present disclosure includes an excitation light source including the aforementioned light capturing rod and at least one infrared light source disposed near the principal surface of the light transmitting rod; an optical multiplexer that combines light from the excitation light source and signal light; and an optical fiber that is optically coupled to the optical multiplexer and whose core has erbium added thereto.

In the light capturing sheet or the light capturing rod according to the present disclosure, light entering the light transmitting sheet or the light transmitting rod enters an optical coupling structure disposed therein, is converted into light, which propagates in a direction parallel to the third light-transmitting layer, by the diffraction grating in the optical coupling structure, and is radiated from an end surface of the optical coupling structure. The optical coupling structure has a positional relationship in which it is parallel to the surface of the light transmitting sheet or the central axis of the rod, and the surface of the optical coupling structure is covered with a low-refractive-index ambient medium, such as air. Therefore, the radiated light repeatedly undergoes total reflection between the surfaces of the light transmitting sheet, at the surface of the light transmitting rod, or between the surfaces of another optical coupling structure, so as to be trapped within the light transmitting sheet or the light transmitting rod. Since the diffraction gratings include various pitches and directions, light in a wide incident angle range, for example, at all incident angles, can be captured over a wide region and a wide wavelength range, such as the entire visible light range.

First Embodiment

Figure 1A:
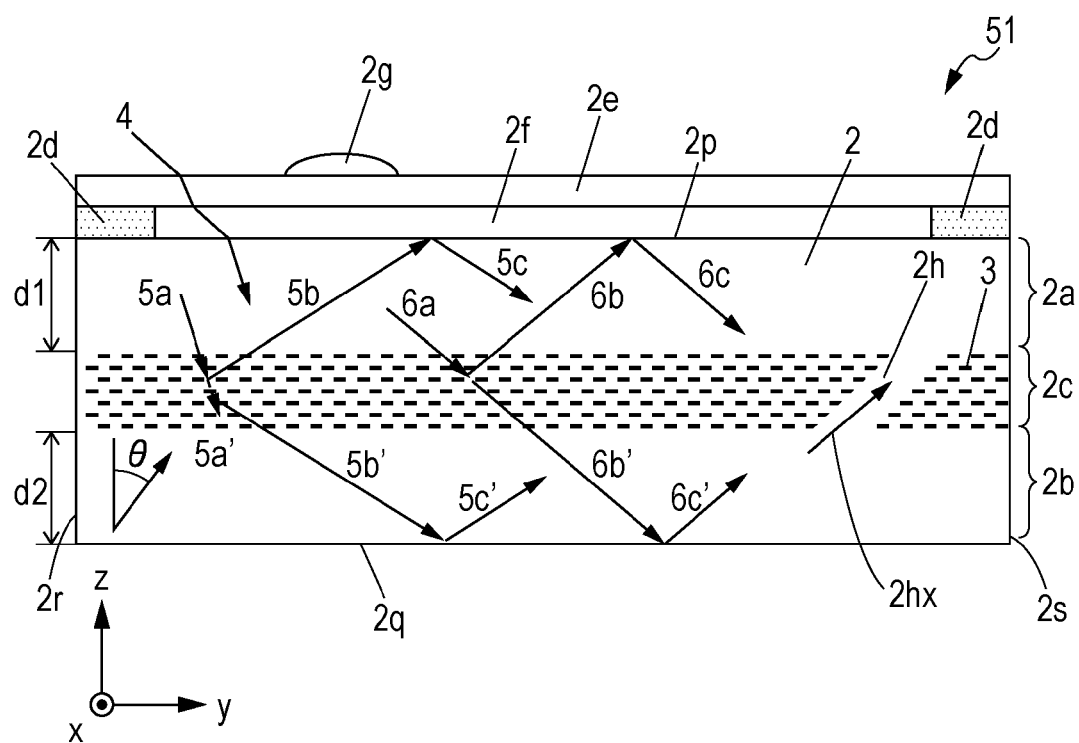
FIG. 1A is a cross-sectional view schematically illustrating a light capturing sheet according to a first embodiment of the present disclosure.

A light capturing sheet according to a first embodiment of the present disclosure will now be described. FIG. 1A is a schematic cross-sectional view of a light capturing sheet 51. The light capturing sheet 51 includes a light transmitting sheet 2, which has a first principal surface 2p and a second principal surface 2q, and at least one optical coupling structure 3 provided within the light transmitting sheet 2.

The light transmitting sheet 2 is composed of a transparent material that transmits light of a desired wavelength or in a desired wavelength band in accordance with the intended purpose. For example, a material that transmits visible light (with a wavelength ranging between 0.4 µm and 0.7 µm) is used. The thickness of the light transmitting sheet 2 is, for example, about 0.03 mm to 1 mm. The first principal surface 2p and the second principal surface 2q each have a size that is not particularly limited, and has an area according to the intended purpose. A cover sheet 2e is attached above the light transmitting sheet 2 with a spacer 2d interposed therebetween. Therefore, most of the first principal surface 2p of the light transmitting sheet 2 is in contact with a buffer layer 2f. The spacer 2d is composed of a material with a low refractive index, such as aerogel. The cover sheet 2e may be formed at the second principal surface 2q of the light transmitting sheet 2 or may be formed at both surfaces.

As shown in FIG. 1A, the optical coupling structures 3 are disposed within the light transmitting sheet 2 so as to be distant from the first principal surface 2p and the second principal surface 2q by a first distance d1 or more and a second distance d2 or more, respectively. Therefore, in the light transmitting sheet 2, the optical coupling structures 3 are not provided in a first region 2a, which is in contact with the first principal surface 2p and has a thickness equivalent to the first distance d1, and in a second region 2b, which is in contact with the second principal surface 2q and has a thickness equivalent to the second distance d2. The optical coupling structures 3 are provided in a third region 2c interposed between the first region 2a and the second region 2b.

The optical coupling structures 3 are three-dimensionally arranged in the third region 2c of the light transmitting sheet 2. Specifically, the optical coupling structures 3 are two-dimensionally arranged in first and second directions in a plane that is parallel to the first principal surface 2p and the second principal surface 2q, and multiple groups of two-dimensionally-arranged optical coupling structures 3 are stacked in a thickness direction, which is a third direction that is not parallel to the first and second directions of the light transmitting sheet 2.

The optical coupling structures 3 are arranged at predetermined densities in x-axis and y-axis directions (the first and second directions) and a z-axis direction (the third direction). For example, with regard to the densities, about 10 to $10^3$ structures are provided per 1 mm in the x-axis direction, about 10 to $10^3$ structures are provided per 1 mm in the y-axis direction, and about 10 to $10^3$ structures are provided per 1 mm in the z-axis direction. In order to efficiently capture light radiated onto the entire first principal surface 2p and the entire second principal surface 2q of the light transmitting sheet 2, the densities of the optical coupling structures 3 in the x-axis direction, the y-axis direction, and the z-axis direction of the light transmitting sheet 2 may be independently uniform. However, depending on the intended purpose or the distribution of light radiated onto the first principal surface 2p and the second principal surface 2q of the light transmitting sheet 2, the optical coupling structures 3 in the light transmitting sheet 2 does not have to be uniformly arranged and may have predetermined distribution.

Figure 1B:
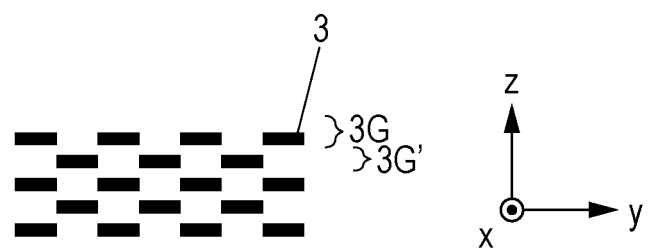
FIG. 1B is an enlarged view of a part of optical coupling structures in a light transmitting sheet.

FIG. 1B is an enlarged view of a part of the optical coupling structures 3 in the light transmitting sheet 2. As shown in FIG. 1B, in a group of optical coupling structures 3G arranged in the x-axis and y-axis directions and in another group of optical coupling structures 3G' adjacent thereto in the z-axis direction, the optical coupling structures 3 do not overlap with each other in the z-axis direction.

Figure 2A:
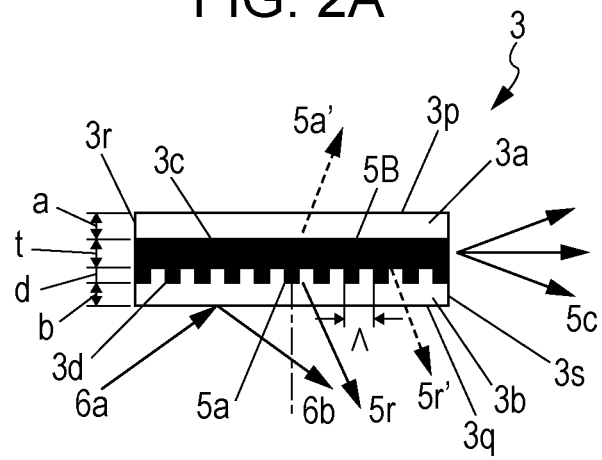
FIG. 2A is a cross-sectional view schematically illustrating each optical coupling structure according to the first embodiment.
Figure 2B:
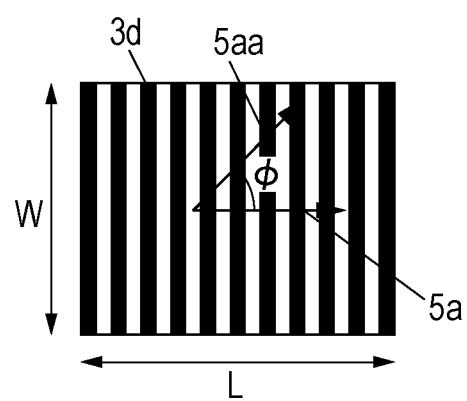
FIG. 2B is a plan view schematically illustrating each optical coupling structure according to the first embodiment.
Figure 2C:
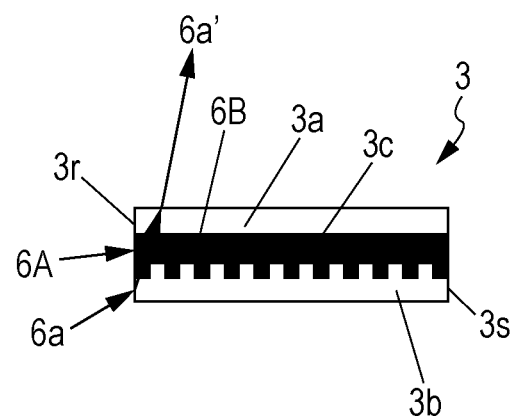
FIG. 2C is a cross-sectional view illustrating a state where light becomes incident on an end surface of the optical coupling structure.

FIGS. 2A and 2B are a cross-sectional view taken in the thickness direction of each optical coupling structure 3 and a plan view that is orthogonal thereto, respectively. The optical coupling structure 3 includes a first light-transmitting layer 3a and a second light-transmitting layer 3b, as well as a third light-transmitting layer 3c interposed therebetween. The third light-transmitting layer 3c includes a diffraction grating 3d having a linear grating with a pitch Λ provided in a reference plane. The linear grating of the diffraction grating 3d may be constituted of recesses and protrusions provided at an interface between the third light-transmitting layer 3c and the first light-transmitting layer 3a or the second light-transmitting layer 3b, or may be provided within the third light-transmitting layer 3c, as shown in FIG. 2E. Furthermore, as an alternative to a grating constituted of recesses and protrusions, a grating based on different refractive indices is also permissible. In this case, the diffraction grating may be provided at the third light-transmitting layer 3c or may be provided at the first light-transmitting layer 3a or the second light-transmitting layer 3b. For example, as shown in FIG. 2F, a first light-transmitting layer 3a' includes a diffraction grating having a plurality of high refractive-index portions $3a_H$ and a plurality of low refractive-index portions $3a_L$ that are alternately arranged in a direction parallel to the first and second principal surfaces 2p and 2q of the light transmitting sheet 2. Likewise, a second light-transmitting layer 3b' includes a diffraction grating having a plurality of high refractive-index portions $3b_H$ and a plurality of low refractive-index portions $3b_L$ that are alternately arranged in the direction parallel to the first and second principal surfaces 2p and 2q of the light transmitting sheet 2. The refractive index of the high refractive-index portions $3a_H$ is higher than the refractive index of the low refractive-index portions $3a_L$, and the refractive index of the high refractive-index portions $3b_H$ is higher than the refractive index of the low refractive-index portions $3b_L$.

Figure 2D:
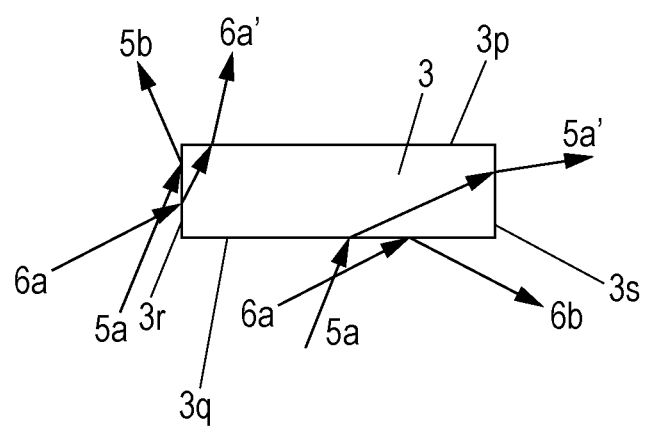
FIG. 2D is a cross-sectional view illustrating a state where light becomes incident on the optical coupling structure when a third light-transmitting layer 3c has been removed therefrom.
Figure 2E:
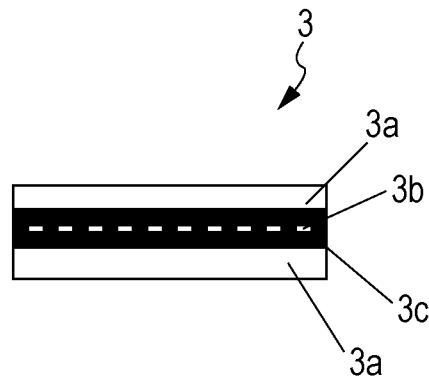
FIG. 2E is a cross-sectional view illustrating other configuration example of the optical coupling structure.
Figure 2F:
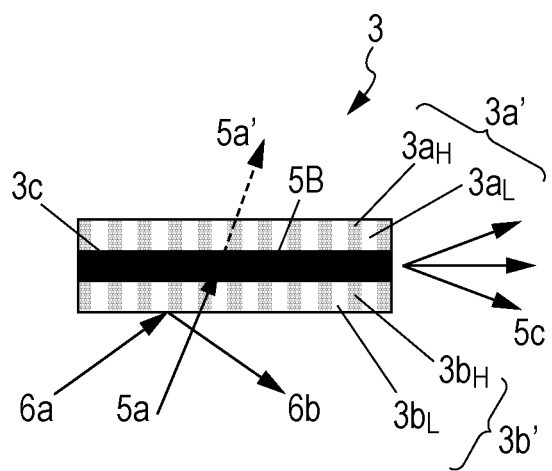
FIG. 2F is a cross-sectional view illustrating other configuration example of the optical coupling structure.
Figure 2G:
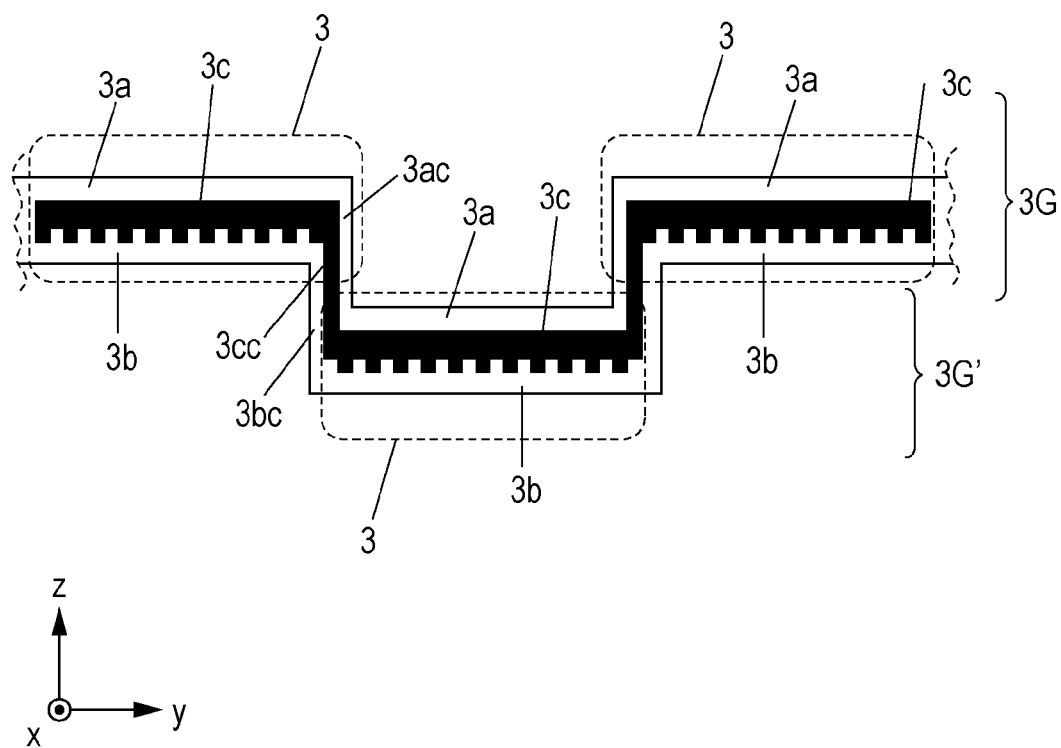
FIG. 2G illustrates the arrangement of a plurality of adjacent optical coupling structures.

FIG. 2G illustrates the optical coupling structures 3 in the z-y plane in the group 3G of optical coupling structures 3 and the other group 3G' of optical coupling structures 3 adjacent thereto in the z-axis direction. As shown in FIG. 2G, the third light-transmitting layer 3c of each optical coupling structure constituting the group 3G of optical coupling structures 3 and the third light-transmitting layer 3c of each optical coupling structure constituting the other group 3G' of optical coupling structures 3 are connected to each other by a connection portion 3cc composed of the same material as the third light-transmitting layer 3c. Likewise, the first light-transmitting layer 3a of each optical coupling structure constituting the group 3G of optical coupling structures 3 and the first light-transmitting layer 3a of each optical coupling structure constituting the other group 3G' of optical coupling structures 3 are connected to each other by a connection portion 3ac composed of the same material as the first light-transmitting layer 3a. Furthermore, the second light-transmitting layer 3b of each optical coupling structure constituting the group 3G of optical coupling structures 3 and the second light-transmitting layer 3b of each optical coupling structure constituting the other group 3G' of optical coupling structures 3 are similarly connected to each other by a connection portion 3bc composed of the same material as the second light-transmitting layer 3b.

Although FIG. 2G is a cross-sectional view taken in the y-axis direction, the first light-transmitting layer 3a, the second light-transmitting layer 3b, and the third light-transmitting layer 3c of each optical coupling structure constituting the group 3G of optical coupling structures 3 are also connected to the first light-transmitting layer 3a, the second light-transmitting layer 3b, and the third light-transmitting layer 3c of each optical coupling structure constituting the other group 3G' of optical coupling structures 3 by the connection portions 3ac, 3bc, and 3cc, respectively, in the x-axis direction.

Figure 8A:
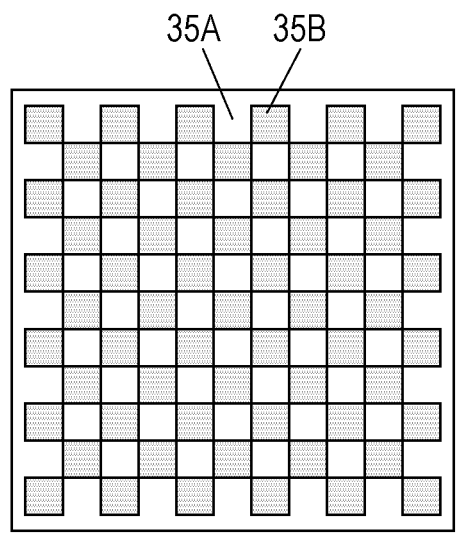
FIG. 8A is a diagram illustrating the shape and the arrangement of optical coupling structures in an x-y plane.

FIG. 8A illustrates the arrangement of the group 3G of optical coupling structures 3 and the other group 3G' of optical coupling structures 3 in the x-y plane. For example, the optical coupling structures constituting the group 3G of optical coupling structures 3 are arranged in regions 35A, whereas the optical coupling structures constituting the other group 3G' of optical coupling structures 3 are arranged in regions 35B. In the x-axis and y-axis directions, the third light-transmitting layer 3c of each optical coupling structure 3 constituting the group 3G of optical coupling structures 3 is connected, via the connection portion 3cc, to the third light-transmitting layers 3c of four neighboring optical coupling structures 3 included in the other group 3G' of optical coupling structures 3 adjacent thereto in the z-axis direction. The same applies to the third light-transmitting layer 3c of each optical coupling structure 3 constituting the other group 3G' of optical coupling structures 3. However, the third light-transmitting layer 3c extends in the y-axis direction, whereas the connection portion 3cc extends in the z-axis direction. When the third light-transmitting layer 3c is regarded as a waveguide, the direction in which light may propagate turns 90 degrees in the connection portion 3cc. Therefore, as will described below, light transmitted through the third light-transmitting layer 3c of each optical coupling structure 3 is not transmitted through another optical coupling structure 3 via the connection portion 3cc, such that each optical coupling structure 3 can be treated as an independent optical element. Therefore, in the description below, each optical coupling structure 3 is described as being an independent optical component.

Each optical coupling structure 3 is disposed within the light transmitting sheet 2 such that the diffraction grating 3d of the third light-transmitting layer 3c is parallel to the first principal surface 2p and the second principal surface 2q of the light capturing sheet 51. The fact that the diffraction grating is parallel to the first principal surface 2p and the second principal surface 2q implies that the reference plane in which the grating is provided is parallel to the first principal surface 2p and the second principal surface 2q.

The first light-transmitting layer 3a, the second light-transmitting layer 3b, and the third light-transmitting layer 3c have thicknesses a, b, and t, respectively, and the linear diffraction grating of the third light-transmitting layer 3c has a step (depth) d. The surface of the third light-transmitting layer 3c is parallel to the first principal surface 2p and the second principal surface 2q of the light transmitting sheet 2, and surfaces 3p and 3q of the first light-transmitting layer 3a and the second light-transmitting layer 3b, which are located opposite the third light-transmitting layer 3c, are also parallel to the first principal surface 2p and the second principal surface 2q of the light transmitting sheet 2.

As will be described below, the light capturing sheet 51 includes a plurality of optical coupling structures 3 so that light beams of different wavelengths entering the light capturing sheet can be captured. In at least two of the plurality of optical coupling structures, the diffraction gratings 3d may extend in directions different from each other. Alternatively, in at least two of the plurality of optical coupling structures 3, the pitches Λ of the diffraction gratings 3d may be different from each other. As a further alternative, a combination of the above is also permissible.

The refractive indices of the first light-transmitting layer 3a and the second light-transmitting layer 3b are lower than the refractive index of the light transmitting sheet 2, and the refractive index of the third light-transmitting layer 3c is higher than the refractive indices of the first light-transmitting layer 3a and the second light-transmitting layer 3b. In the following description, it is assumed that the first light-transmitting layer 3a and the second light-transmitting layer 3b are air and each have a refractive index of 1. Furthermore, it is assumed that the third light-transmitting layer 3c and the light transmitting sheet 2 are constituted of the same medium and have the same refractive index.

In the case where each optical coupling structure 3 has the structure shown in FIG. 2F, the refractive indices of the high refractive-index portions $3a_H$ and the low refractive-index portions $3a_1$, are lower than the refractive index of the light transmitting sheet 2 and the refractive index of the third light-transmitting layer 3c. Likewise, the refractive indices of the high refractive-index portions $3b_H$ and the low refractive-index portions $3b_L$ are lower than the refractive index of the light transmitting sheet 2 and the refractive index of the third light-transmitting layer 3c.

The surfaces 3p and 3q of the first light-transmitting layer 3a and the second light-transmitting layer 3b of each optical coupling structure 3 each have, for example, a rectangular shape whose two sides have lengths W and L, and W and L each range between 3 μm and 100 μm. In other words, the surfaces of the first light-transmitting layer 3a and the second light-transmitting layer 3b of the optical coupling structure 3 each have a size that circumscribes a circle with a diameter ranging between 3 μm and 100 μm. Furthermore, the thickness (a+t+d+b) of the optical coupling structure 3 is smaller than or equal to 3 μm. Although the optical coupling structure 3 in this embodiment has a rectangular shape in the x-y plane, as shown in FIG. 2B, other shapes, such as a polygonal shape, a circular shape, or an elliptical shape, are also permissible.

The light capturing sheet 51 is used while being surrounded by an ambient medium. For example, the light capturing sheet 51 is used in air. In this case, the refractive index of the ambient medium is 1. In the following description, the refractive index of the light transmitting sheet 2 is defined as $n_s$. Light 4 from the ambient medium is transmitted through the cover sheet 2e and the buffer layer 2f and enters the light transmitting sheet 2 through the first principal surface 2p or the second principal surface 2q of the light transmitting sheet 2. The buffer layer 2f is composed of the same medium as the ambient medium and has a refractive index of 1. The refractive index of the spacer 2d is also substantially equal to 1. In order to enhance transmittance of the incident light 4, the opposite surfaces of the cover sheet 2e, the first principal surface 2p, and the second principal surface 2q may each be provided with an AR coating or a non-reflective nano-structure. A non-reflective nano-structure includes a fine recess-protrusion structure, such as a moth-eye structure, in which the pitch and the height are ⅓ or smaller of a design wavelength. A design wavelength is the wavelength of light to be used when designing the components such that the light capturing sheet 51 exhibits a predetermined function. Although Fresnel reflection is reduced in the non-reflective nano-structure, total reflection exists therein.

Of light beams existing within the light transmitting sheet 2, a light beam whose angle θ (referred to as "propagation angle" hereinafter) formed between the propagating direction thereof and the normal line (i.e., a line orthogonal to the first principal surface 2p and the second principal surface 2q) of the light transmitting sheet 2 satisfies sin θ<1/$n_s$ will be referred to as "inside-critical-angle light beam", and a light beam whose angle θ satisfies sin θ≥1/$n_s$ will be referred to as "outside-critical-angle light beam". If an inside-critical-angle light beam 5a exists within the light transmitting sheet 2 in FIG. 1A, a portion thereof is converted into an outside-critical-angle light beam 5b by an optical coupling structure 3. This light beam is totally reflected at the first principal surface 2p and becomes an outside-critical-angle light beam 5c that remains within the sheet. A portion of a remaining inside-critical-angle light beam 5a' of the inside-critical-angle light beam 5a is converted into an outside-critical-angle light beam 5b' by another optical coupling structure 3. This light beam is totally reflected at the second principal surface 2q and becomes an outside-critical-angle light beam 5c' that remains within the sheet. Accordingly, the inside-critical-angle light beam 5a is entirely converted into the outside-critical-angle light beam 5b or 5b' within the third region 2c in which the optical coupling structures 3 are arranged.

If an outside-critical-angle light beam 6a exists in the light transmitting sheet 2, a portion thereof is totally reflected at the surface of an optical coupling structure 3 so as to become an outside-critical-angle light beam 6b. This light beam is totally reflected at the first principal surface 2p and becomes an outside-critical-angle light beam 6c that remains within the sheet. A portion of remaining light of the light beam 6a becomes an outside-critical-angle light beam 6b' that is transmitted through the third region 2c in which the optical coupling structures 3 are provided. This light beam is totally reflected at the second principal surface 2q and becomes an outside-critical-angle light beam 6c' that remains within the light transmitting sheet 2. Although not shown, an outside-critical-angle light beam that remains within the sheet while being totally reflected between different optical coupling structures 3 and between the first principal surface 2p and the second principal surface 2q, that is, a light beam that propagates while staying in the first region 2a, the second region 2b, or the third region 2c, also exists. In this case, there is a possibility that the distribution of light propagating through the first region 2a and the second region 2b may become unbalanced. In a case where unbalanced distribution of light in the light transmitting sheet 2 becomes a problem, at least one fourth region 2h where optical coupling structures 3 are not provided may be provided in the third region 2c within the light transmitting sheet 2, as shown in FIG. 1A. In other words, the optical coupling structures 3 are arranged only within the third region 2c excluding the fourth region 2h. In the light transmitting sheet 2, the fourth region 2h connects the first region 2a and the second region 2b to each other. The fourth region 2h extends from the first region 2a toward the second region 2b or vice versa. The direction of an arbitrary line extending through the fourth region 2h extends at an angle that is larger than a critical angle defined by the refractive index of the light transmitting sheet and the refractive index of the ambient medium surrounding the light transmitting sheet. Specifically, assuming that the refractive index of the ambient medium is 1 and the refractive index of the light transmitting sheet 2 is $n_e$, an angle θ' formed between a direction 2hx in which the arbitrary line extends through the fourth region 2h and the normal line of the light transmitting sheet 2 satisfies sin θ'≥1/$n_s$. The expression "line extends through the fourth region 2h" refers to a line that extends through a plane of the fourth region 2h that is in contact with the first region 2a and through the second region 2b of the fourth region 2h.

A similar function is achieved when each optical coupling structure 3 has the structure shown in FIG. 2F. The inside-critical-angle light beam 5a can enter the first light-transmitting layer 3a' or the second light-transmitting layer 3b', and guided light 5B can be excited by a diffraction grating constituted of low refractive-index portions and high refractive-index portions provided in the first light-transmitting layer 3a' or the second light-transmitting layer 3b'. Since the outside-critical-angle light beam 6a is substantially totally reflected at the surface of the first light-transmitting layer 3a' or the second light-transmitting layer 3b', and the depth by which the outside-critical-angle light beam 6a can enter the first light-transmitting layer 3a' or the second light-transmitting layer 3b' is extremely small, the outside-critical-angle light beam 6a is not affected by the diffraction grating formed within the first light-transmitting layer 3a' or the second light-transmitting layer 3b'.

Figure 1C:
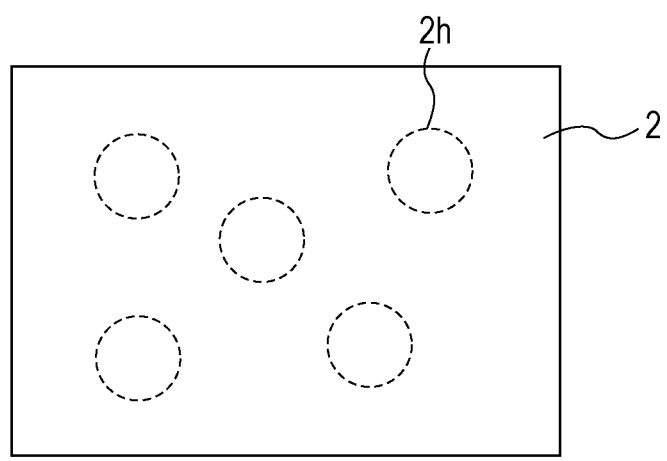
FIG. 1C is a plan view illustrating the positions of fourth regions in the first embodiment.

FIG. 1C is a plan view of the light capturing sheet 51 and illustrates the arrangement of fourth regions 2h. As shown in FIG. 1C, for example, a plurality of fourth regions 2h are provided within the light transmitting sheet 2. Each fourth region 2h extends from the first region 2a toward the second region 2b or vice versa at an angle larger than the critical angle. Therefore, of light beams propagating through the first region 2a and the second region 2b of the light transmitting sheet 2, only an outside-critical-angle light beam can be transmitted through each fourth region 2h from the first region 2a toward the second region 2b or vice versa. Thus, unbalanced light distribution can be prevented within the light capturing sheet 51.

As shown in FIG. 2A, the inside-critical-angle light beam 5a is transmitted through the surface 3q of the second light-transmitting layer 3b, and a portion thereof is converted into guided light 5B that propagates through the third light-transmitting layer 3c as a result of the effect of the diffraction grating 3d. The remaining portion mainly becomes an inside-critical-angle light beam 5a' as transmitted light or diffracted light and is transmitted through the optical coupling structure 3, or becomes an inside-critical-angle light beam 5r as reflected light and is transmitted through the optical coupling structure 3. When light enters the second light-transmitting layer 3b, there is also an outside-critical-angle light beam 6b reflected at the surface 3q. However, by providing the surfaces 3p and 3q with non-reflective nano-structures, most of the light can be transmitted.

A coupling technique with respect to the guided light 5B is the same as the principle of the grating coupling technique in the related art. With regard to the guided light 5B, a portion thereof is radiated in the same direction as the inside-critical-angle light beam 5r before reaching an end surface 3S of the third light-transmitting layer 3c and becomes an inside-critical-angle light beam 5r'. The remaining portion is guided and radiated from the end surface 3S of the third light-transmitting layer 3c and becomes an outside-critical-angle light beam 5c. The outside-critical-angle light beam 6a is totally reflected at the surface 3q of the second light-transmitting layer 3b and entirely becomes an outside-critical-angle light beam 6b. Accordingly, an outside-critical-angle light beam incident on the surfaces of the optical coupling structure 3 (i.e., the surface 3p of the first light-transmitting layer 3a and the surface 3q of the second light-transmitting layer 3b) is reflected as-is as an outside-critical-angle light beam, whereas a portion of an inside-critical-angle light beam is converted into an outside-critical-angle light beam.

If the diffraction grating 3d of the third light-transmitting layer 3c is too long, the guided light 5B is entirely radiated before it reaches the end surface 3S. If the diffraction grating 3d is too short, the coupling efficiency with respect to the guided light 5B is not sufficient. The ease of radiation of the guided light 5B is expressed by a radiation loss coefficient α, and the intensity of the guided light 5B at a propagation distance L multiplies by exp (−2αL). Assuming that the value of α is 10 (1/mm), the light intensity multiplies by 0.8 at a propagation distance of 10 μm. The radiation loss coefficient α is related to the depth d of the diffraction grating 3d and increases monotonically in a range of d≤$d_c$ and becomes saturated in a range of d>$d_c$. When the wavelength of light is defined as λ, the equivalent refractive index of the guided light 5B is defined as $n_{eff}$, the refractive index of the third light-transmitting layer 3c is defined as $n_1$, and the duty of the diffraction grating 3d (i.e., a ratio of the width of each protrusion to the pitch) is defined as 0.5, $d_c$ is obtained based on expression (2) below.

[Math. 2]

$$d_c \approx \frac{\lambda}{2\pi} \sqrt{n_{eff}^2 - \left(\frac{n_1 - 1}{2}\right)^2} \qquad (2)$$

For example, when λ=0.55 μm, $n_{eff}$=1.25, and $n_1$=1.5, $d_c$=0.107 μm. In the monotonously increasing range, the radiation loss coefficient α is proportional to the square of d. Therefore, the lengths of the diffraction grating 3d, that is, the lengths (dimensions W and L) of the third light-transmitting layer 3c, are determined based on the radiation loss coefficient α and are dependent on the depth d of the diffraction grating 3d. Assuming that the value of α is set within a range between 2 and 100 (1/mm) by adjusting the depth d and that the attenuation ratio is set to 0.5, W and L become about 3 μm to 170 μm. Therefore, if W and L range between 3 μm and 100 μm, as described above, a radiation loss can be suppressed by adjusting the depth d, so that high coupling efficiency can be achieved.

Table 1 shows which light beams of visible-light wavelengths (λ=0.4 μm to 0.7 μm) are coupled relative to the pitch Λ and the incident angle θ based on expression (1) in a case where the equivalent refractive index $n_{eff}$ of the guided light 5B is set to 1.25. A dotted line indicates a coupling range. For example, when the pitch is equal to 0.4 μm, light with a wavelength of 0.4 μm is coupled when the angle θ is equal to −14 degrees, and light with a wavelength of 0.7 μm is coupled when the angle θ is equal to 30 degrees. In this case, the visible-light coupling range is between the angle θ of −14 degrees and the angle θ of 30 degrees.

TABLE 1

| | INCIDENT ANGLE θ (DEGREES) | | | | | | | | |
|---|---|---|---|---|---|---|---|---|---|
| | −90 | −54 | −33 | −14 | 0 | 5 | 30 | 49 | 90 |
| PITCH Λ (μm) 0.18 | | | | | | | | | 0.4 |
| 0.20 | | | | | | | | 0.4----- | 0.5 |
| 0.30 | | | | | | 0.4-------------------------- | | | 0.7 |
| 0.40 | | | | 0.4---------------------------- | | | 0.7 | | |
| 0.56 | | | 0.4----------------- | 0.7 | | | | | |
| 1.60 | 0.4-------0.7 | | | | | | | | |
| 2.80 | 0.7 | | | | | | | | |

The polarity of the incident angle θ is related to the optical coupling direction. Therefore, when focusing only on the presence or absence of coupling while neglecting the optical coupling direction, coupling is achieved for all incident angles so long as the incident-angle range can cover 0 degrees to 90 degrees or −90 degrees to 0 degrees. Therefore, in order to allow light to be coupled with respect to all visible-light wavelengths and all incident angles, for example, it is clear from Table 1 that a combination of optical coupling structures 3 each having a diffraction grating 3d with a pitch Λ ranging from 0.18 μm to 0.56 μm (0 degrees to 90 degrees) or from 0.30 μm to 2.80 μm (−90 degrees to 0 degrees) may be used. In view of a change in equivalent refractive index or a manufacturing error that may occur when forming a guide layer or a diffraction grating, the pitch of the diffraction grating 3d may substantially range between 0.1 μm and 3 μm.

Furthermore, as shown in FIG. 2B, for example, although the pitch of the diffraction grating 3d relative to the inside-critical-angle light beam 5a incident in a direction orthogonal to the direction in which the diffraction grating 3d extends is Λ, an effective pitch of the diffraction grating 3d relative to a light beam 5aa incident at a direction angle φ is Λ/cos φ. For example, in a case where the incident direction angle φ of the light beam 5aa is between 0 degrees and 87 degrees, the effective pitch is between Λ and 19Λ. Therefore, when Λ is set equal to 0.18 μm, an effective pitch Λ ranging from 0.18 μm to 2.80 μm can be realized even in the same diffraction grating 3d depending on the direction of the incident light. When Λ is set equal to 0.30 μm, a pitch Λ ranging from 0.30 μm to 2.80 μm can be realized. Consequently, as an alternative to combining optical coupling structures 3 having diffraction gratings 3d with different pitches, light beams of all visible-light wavelengths can be captured at all incident angles by rotatably arranging optical coupling structures 3 with the same pitch within the light transmitting sheet 2 such that the direction in which the diffraction gratings extend (i.e., the direction of the diffraction gratings) is changeable from 0 degrees to 180 degrees. Furthermore, the pitch of the diffraction gratings 3d and the direction in which the diffraction gratings 3d extend may both be varied among the plurality of optical coupling structures 3.

Next, light beams at end surfaces 3r and 3s (i.e., surfaces extending in the normal direction of the second light-transmitting layer 3b) that are orthogonal to the surfaces 3p and 3q of each optical coupling structure 3 will be examined. As shown in FIG. 2C, a light beam incident on the end surface 3r of the optical coupling structure 3 may conceivably be reflected at the end surface 3r, diffracted at the end surface 3r, refracted after being transmitted through the end surface 3r, or guided through the third light-transmitting layer 3c via the end surface 3r. For example, the outside-critical-angle light beam 6a incident on and transmitted through the end surfaces of the first light-transmitting layer 3a and the second light-transmitting layer 3b is refracted and becomes an inside-critical-angle light beam 6a'. A portion of light 6A incident on and transmitted through the end surface of the third light-transmitting layer 3c is converted into guided light 6B that propagates through the third light-transmitting layer 3c.

As a reference, FIG. 2D illustrates an optical path in a case where the third light-transmitting layer 3c is removed from the optical coupling structure 3 and a space obtained after the removal is filled with air, like the first light-transmitting layer 3a and the second light-transmitting layer 3b. When the inside-critical-angle light beam 5a becomes incident on the surface 3q of the optical coupling structure 3, if the incident position thereof is near the end surface 3s, the inside-critical-angle light beam 5a is output from the end surface 3s as an outside-critical-angle light beam 5a' as a result of refraction. When the inside-critical-angle light beam 5a becomes incident on the end surface 3r of the optical coupling structure 3, the inside-critical-angle light beam 5a is totally reflected at the end surface 3r. When the outside-critical-angle light beam 6a becomes incident on the end surface 3r of the optical coupling structure 3, the outside-critical-angle light beam 6a is output from the surface 3p as an inside-critical-angle light beam 6a' as a result of refraction, regardless of the incident position thereof. When the outside-critical-angle light beam 6a becomes incident on the surface 3q of the optical coupling structure 3, the outside-critical-angle light beam 6a is totally reflected at the surface 3q.

Accordingly, the behavior of light beams when becoming incident on the end surfaces 3r and 3s of the optical coupling structure 3 is complicated. Even when an outside-critical-angle light beam becomes incident on an end surface, it does not necessarily mean that the outside-critical-angle light beam will be output as an outside-critical-angle light beam. However, by making the sizes of the surfaces sufficiently larger than the sizes of the end surfaces, the effect at the end surfaces can be sufficiently reduced, so that transmission or reflection of light beams at the surfaces 3p and 3q can be regarded as transmission or reflection behavior of the light beams in the entire optical coupling structure 3. Specifically, if the width W or the length L of each of the surface 3p of the first light-transmitting layer 3a and the surface 3q of the second light-transmitting layer 3b is larger than or equal to four times the thickness of the optical coupling structure 3, the effect of the light beams at the end surfaces 3r and 3s of the optical coupling structure 3 can be sufficiently neglected. Therefore, the optical coupling structure 3 exhibits a function for maintaining an outside-critical-angle light beam as an outside-critical-angle light beam while non-reversibly converting an inside-critical-angle light beam into an outside-critical-angle light beam. By sufficiently setting the density of the optical coupling structures 3, all light beams entering the light capturing sheet 51 can be converted into outside-critical-angle light beams, that is, light beams trapped within the sheet.

Figure 3:
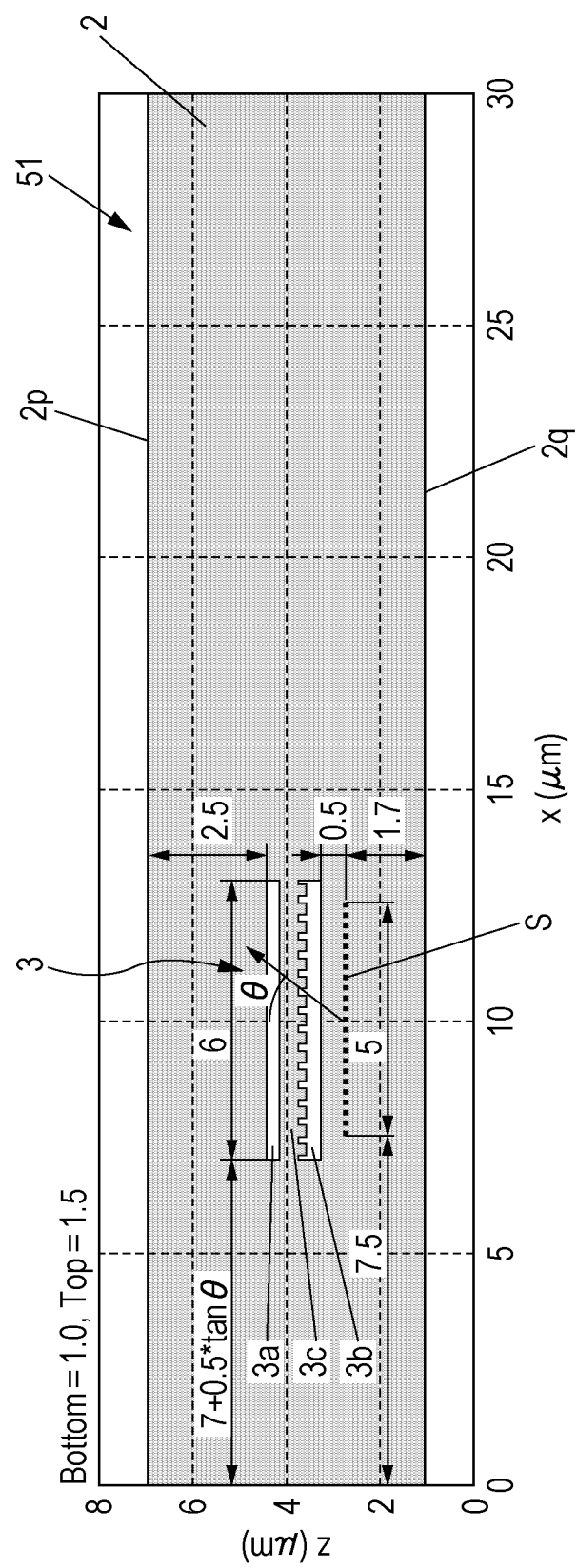
FIG. 3 is a cross-sectional view illustrating the structure used for analyzing the light capturing sheet according to the first embodiment.

FIG. 3 illustrates a cross-sectional structure of a light capturing sheet used for an analysis for checking a light trapping effect in the light capturing sheet 51. For the analysis, a light capturing sheet including one optical coupling structure is used. As shown in FIG. 3, a light source S (indicated by a dashed line) with a width of 5 μm is installed parallel to the second principal surface 2$q$ of the light transmitting sheet 2 at a position distant therefrom by 1.7 μm, the second light-transmitting layer 3$b$ with a width of 6 μm is disposed above and parallel to the light source S at a position distant therefrom by 0.5 μm, and the third light-transmitting layer 3$c$ and the first light-transmitting layer 3$a$ both having the same width are disposed above the second light-transmitting layer 3$b$. The first principal surface 2$p$ of the light transmitting sheet 2 is located distant from the surface of the first light-transmitting layer 3$a$ by 2.5 μm. A polarized plane wave that forms a 45-degree angle relative to the plane of the drawing is emitted from the light source S in a direction that forms an angle θ relative to the normal line of the second principal surface 2$q$. The first light-transmitting layer 3$a$, the second light-transmitting layer 3$b$, and the third light-transmitting layer 3$c$ are positionally shifted sideways in accordance with the angle θ so that the center of the incident light is transmitted through the center of the surface of the second light-transmitting layer 3$b$. The thickness a of the first light-transmitting layer 3$a$ is set to 0.3 μm, the thickness c of the second light-transmitting layer 3$b$ is set to 0.3 μm, the thickness t of the third light-transmitting layer 3$c$ is set to 0.4 μm, the depth d of the diffraction grating is set to 0.18 μm, and the pitch Λ of the diffracting grating is set to 0.36 μm. The refractive indices of the light transmitting sheet 2 and the third light-transmitting layer 3$c$ are set to 1.5, and the refractive indices of the ambient medium, the first light-transmitting layer 3$a$, and the second light-transmitting layer 3$b$ are set to 1.0.

Figure 4A:
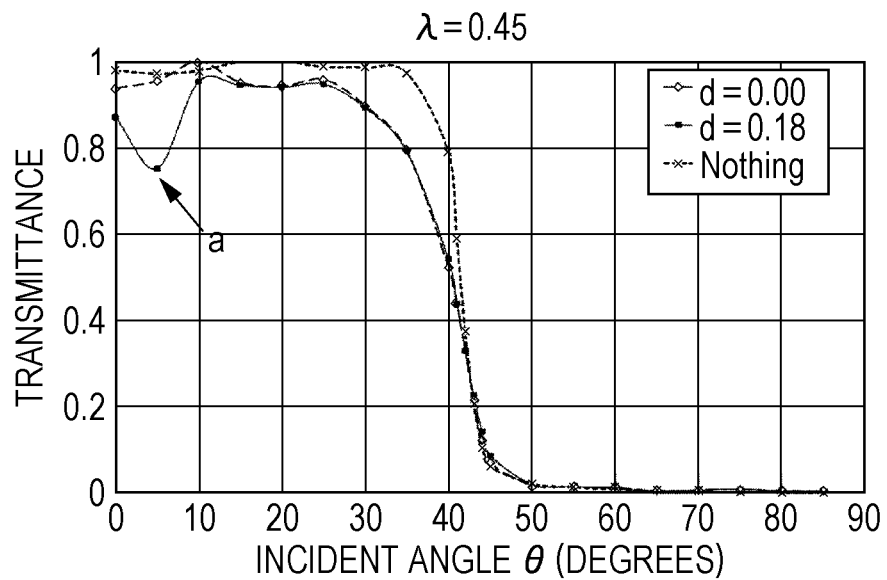
FIG. 4A is a graph showing results of the analysis performed using the structure shown in FIG. 3, and illustrating the relationship between an incident angle of light and transmittance toward the outside of the sheet.
Figure 4B:
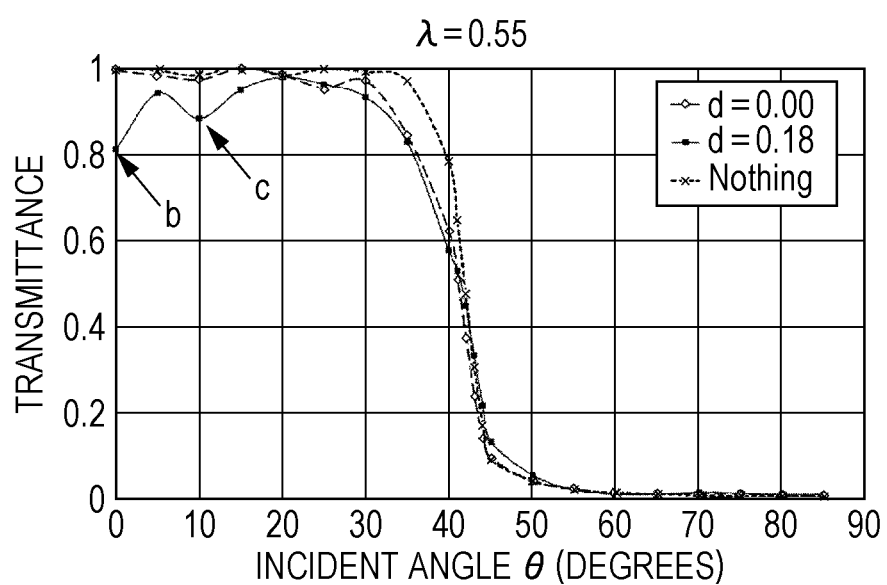
FIG. 4B is a graph showing results of the analysis performed using the structure shown in FIG. 3, and illustrating the relationship between an incident angle of light and transmittance toward the outside of the sheet.
Figure 4C:
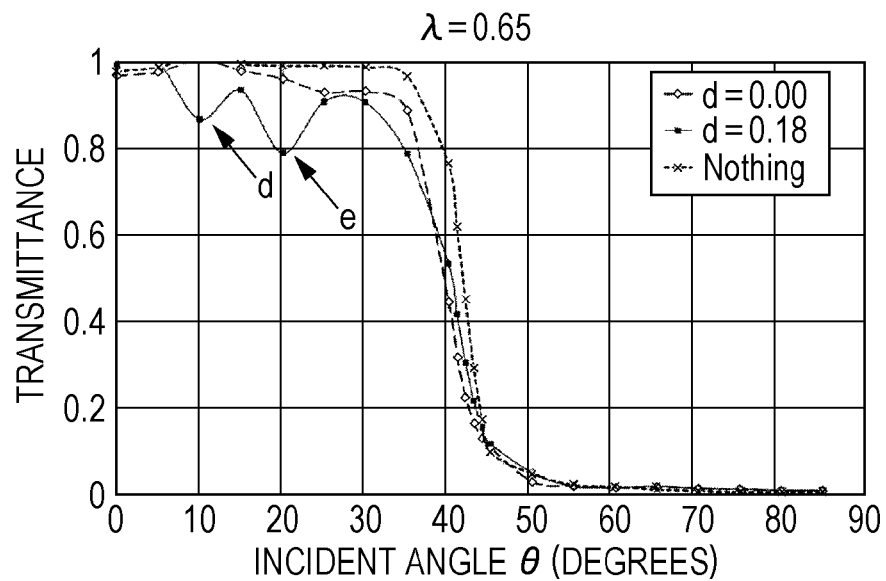
FIG. 4C is a graph showing results of the analysis performed using the structure shown in FIG. 3, and illustrating the relationship between an incident angle of light and transmittance toward the outside of the sheet.

FIGS. 4A to 4C are analysis results with respect to the light capturing sheet having the structure shown in FIG. 3. Each analysis result indicates the relationship between the incident angle θ of light entering the optical coupling structure 3 from the light source S and the transmittance of light output outside the light capturing sheet. The structure used for the analysis has already been described above. For the analysis, a two-dimensional finite-difference time-domain method (FDTD) is used. Therefore, each analysis result is obtained in accordance with a structure in which the cross section shown in FIG. 3 continues infinitely in the vertical direction in the plane of the drawing. The transmittance is measured in a stable state and is defined by a ratio of an integrated value of Poynting vectors passing through the lowermost surface (z=0 μm) and the uppermost surface (z≈8 μm) of an analysis region to an integrated value of Poynting vectors passing through a closed curve surrounding the light source. Although some calculation results exceed 100%, this is because there is a slight error in the measurement of Poynting vectors of the light source. FIG. 4A illustrates a calculation result in a case where the wavelength λ of the light source is 0.45 μm, FIG. 4B illustrates a calculation result in a case where the wavelength λ is 0.55 μm, and FIG. 4C illustrates a calculation result in a case where the wavelength λ is 0.65 μm. In each calculation result, the depth d of the diffraction grating is used as a parameter, and a result under a condition where there is no optical coupling structure 3 (i.e., a configuration with only the light transmitting sheet 2 and the light source S) is also plotted.

When a result corresponding to a case where an optical coupling structure 3 exists but the depth d of the diffraction grating is equal to 0 is compared with a result corresponding to a case where there is no optical coupling structure 3 (nothing), the transmittance within the range of the critical angle (41.8 degrees) is lower in the former case than in the latter case. In both cases, the transmittance becomes substantially zero when the angle is larger than the critical angle. The transmittance is low within the critical angle in the former case because light incident on the surface 3$q$ of the second light-transmitting layer 3$b$ is refracted, and a portion thereof is output from the end surface 3$s$ as an outside-critical-angle light beam, as described with reference to FIG. 2D. However, in the former case, an outside-critical-angle light beam entering through the end surface 3$r$ of the optical coupling structure 3 is refracted at this surface, is subsequently refracted at the surface 3$p$ of the first light-transmitting layer 3$a$, and becomes an inside-critical-angle light beam within the light transmitting sheet 2, as similarly described with reference to FIGS. 2C and 2D. Therefore, in the structure in which d=0, there is conversion to an outside-critical-angle light beam as well as conversion to an inside-critical-angle light beam, which implies that the light trapping effect is low as a whole.

Figure 4D:
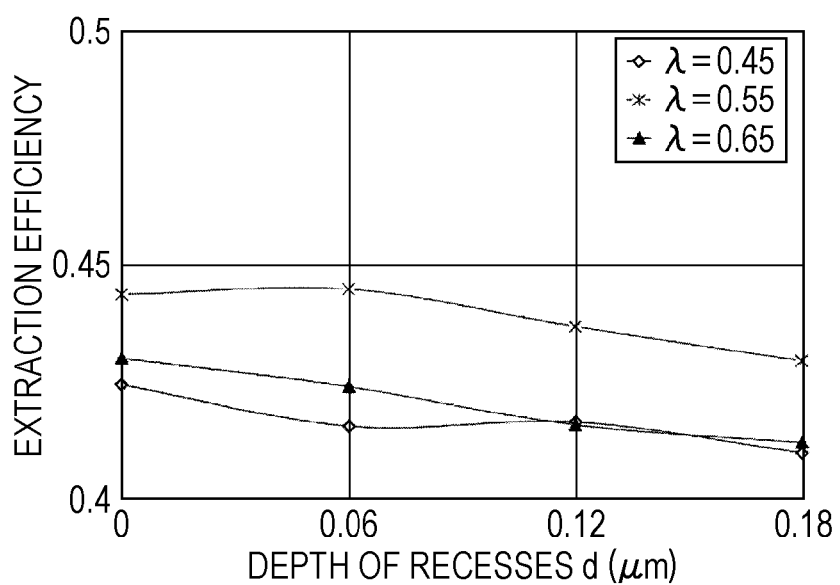
FIG. 4D is a graph illustrating the relationship between the depth of recesses in a diffraction grating and the efficiency for extracting light outside the sheet.

When a result corresponding to a case where the depth d of the grating is equal to 0.18 μm is compared with a result corresponding to a case where d=0, the transmittance in the former case is substantially close to that in the latter case, but drops at positions indicated by arrows a, b, c, d, and e. FIG. 4D illustrates specification values (i.e., values divided by 90) of values obtained by integrating the curves in FIGS. 4A, 4B, and 4C with respect to incident angles θ, relative to the depth d of the diffraction grating as a parameter. Since the analysis model is two-dimensional, each of the integrated values is equivalent to the efficiency at which the light within the light capturing sheet is extracted outside the sheet. At any of the wavelengths, the extraction efficiency decreases with increasing d (at least in the comparison between d=0 and d=0.18). This expresses a light trapping effect by a single optical coupling structure. This effect can be accumulated, and ultimately, all light beams can be trapped by increasing the number of optical coupling structures. Although this analysis corresponds to a two-dimensional model, incident light that satisfies expression (1), which is the coupling condition with respect to an arbitrary direction angle ϕ shown in the plan view in FIG. 2A, definitely exists in the actual model (i.e., a three-dimensional model). Therefore, the transmittance curves shown in FIGS. 4A to 4C drop with respect to all incident-angle-θ ranges instead of local ranges indicated by, for example, the arrows a, b, c, d, and e, so that the light trapping effect by the optical coupling structure becomes greater.

Figure 5A:
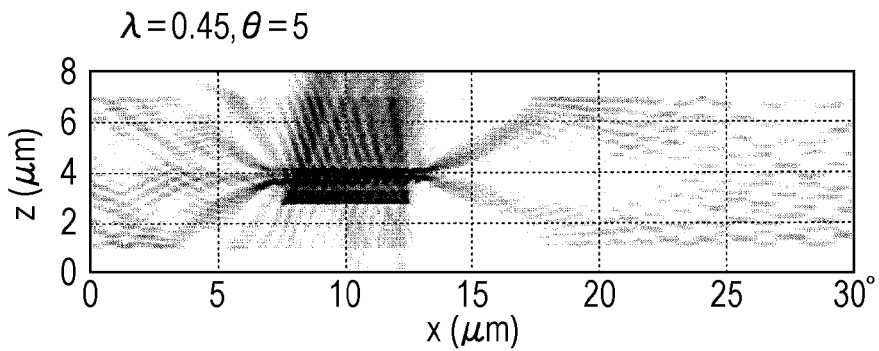
FIG. 5A is a diagram illustrating light-intensity distribution in a cross section of the sheet under a condition of a position indicated by arrow (a) in FIG. 4A.
Figure 5B:
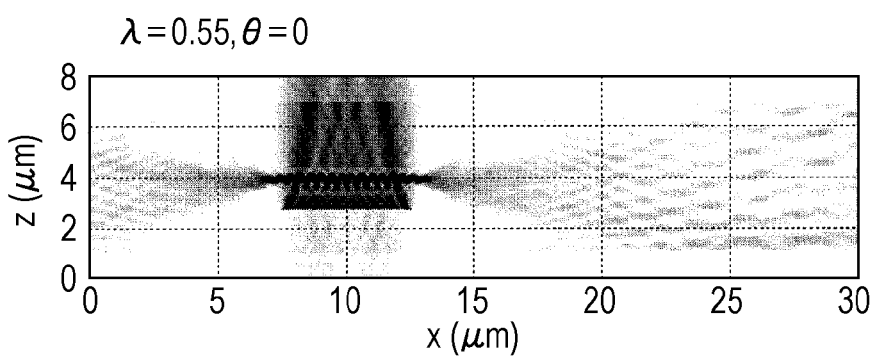
FIG. 5B is a diagram illustrating light-intensity distribution in a cross section of the sheet under a condition of a position indicated by arrow (b) in FIG. 4B.
Figure 5C:
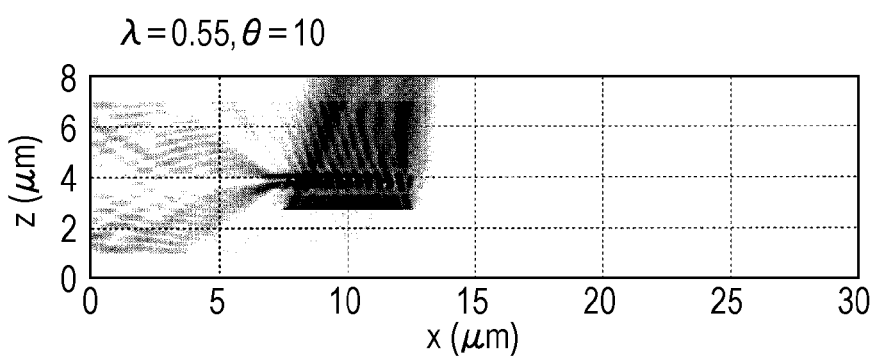
FIG. 5C is a diagram illustrating light-intensity distribution in a cross section of the sheet under a condition of a position indicated by arrow (c) in FIG. 4B.
Figure 5D:
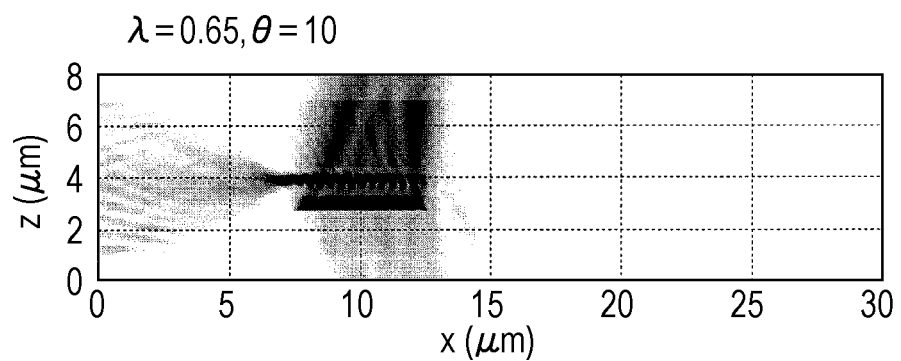
FIG. 5D is a diagram illustrating light-intensity distribution in a cross section of the sheet under a condition of a position indicated by arrow (d) in FIG. 4C.
Figure 5E:
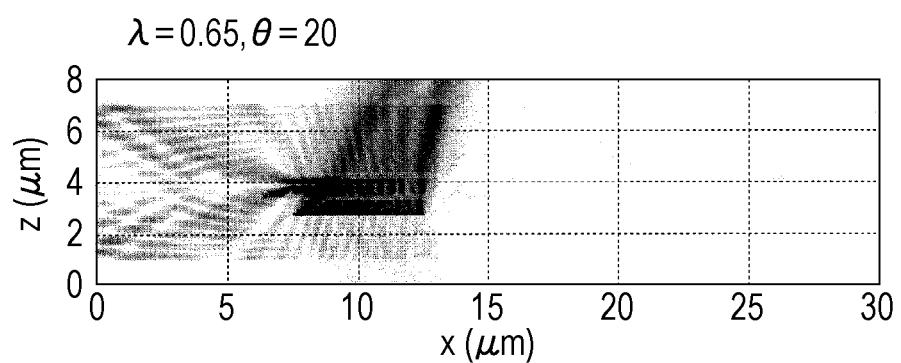
FIG. 5E is a diagram illustrating light-intensity distribution in a cross section of the sheet under a condition of a position indicated by arrow (e) in FIG. 4C.

FIGS. 5A to 5E illustrate light-intensity distribution diagrams within the light capturing sheet under conditions indicated by the arrows a, b, c, d, and e in FIGS. 4A to 4C. Specifically, FIG. 5A illustrates a result obtained when the wavelength λ is equal to 0.45 μm and the angle θ is equal to 5 degrees, FIG. 5B illustrates a result obtained when the wavelength λ is equal to 0.55 μm and the angle θ is equal to 0 degrees, FIG. 5C illustrates a result obtained when the wavelength λ is equal to 0.55 μm and the angle θ is equal to 10 degrees, FIG. 5D illustrates a result obtained when the wavelength λ is equal to 0.65 μm and the angle θ is equal to 10 degrees, and FIG. 5E illustrates a result obtained when the wavelength λ is equal to 0.65 μm and the angle θ is equal to 20 degrees.

In the case where the conditions and the incident angles are as shown in FIGS. 5A and 5B, since the refractive index of the third light-transmitting layer 3c is higher than the refractive indices of the first light-transmitting layer 3a and the second light-transmitting layer 3b surrounding the third light-transmitting layer 3c, the third light-transmitting layer 3c functions as a guide layer. The incident light becomes coupled to the guided light propagating through the third light-transmitting layer 3c as a result of the effect of the diffraction grating, and this light is radiated into the light transmitting sheet 2 through the end surfaces 3r and 3s of the third light-transmitting layer 3c. This radiated light is an outside-critical-angle light beam and is totally reflected at the first principal surface 2p and the second principal surface 2q of the light transmitting sheet 2 so as to be trapped within the light transmitting sheet 2. In the case where the conditions and the incident angles are as shown in FIGS. 5C, 5D, and 5E, the incident light becomes coupled to the guided light propagating through the third light-transmitting layer 3c as a result of the effect of the diffraction grating, and this light is radiated into the sheet through the end surface 3r of the third light-transmitting layer 3c. This radiated light is an outside-critical-angle light beam and is totally reflected at the first principal surface 2p and the second principal surface 2q of the light transmitting sheet 2 so as to be trapped within the light transmitting sheet 2. In FIGS. 5A, 5C, and 5E, the radiated light is split into two paths, and the coupled light is first-order-mode guided light whose phase is vertically inverted in the cross section of the guide layer. In FIGS. 5B and 5D, the radiated light is in a bundled state, and the coupled light is zero-th-order-mode guided light.

Figure 6A:
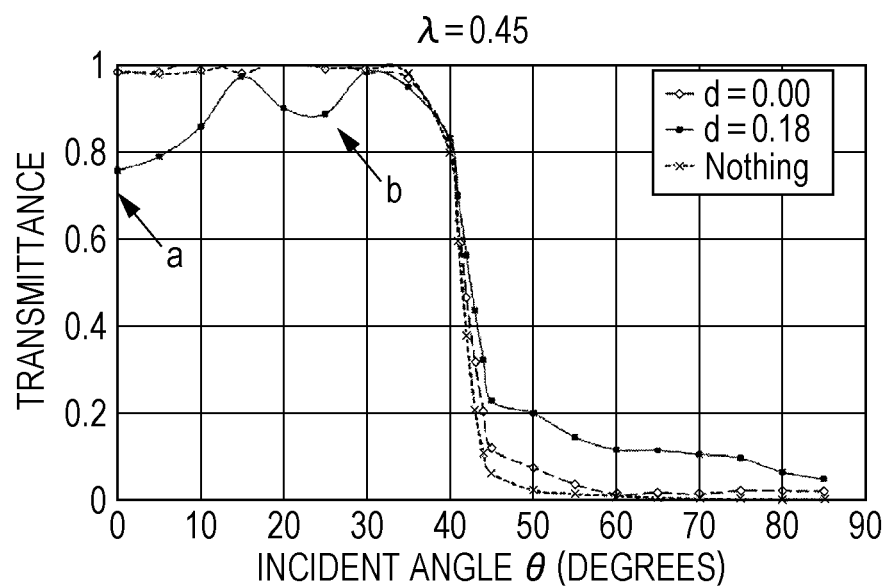
FIG. 6A is a graph illustrating analysis results in a case where the refractive indices of a first light-transmitting layer 3a and a second light-transmitting layer 3b are set equal to the refractive index of the light transmitting sheet in the structure shown in FIG. 3, and the refractive index of the third light-transmitting layer 3c is changed to 2.0, and illustrating the relationship between an incident angle and transmittance toward the outside of the sheet.
Figure 6B:
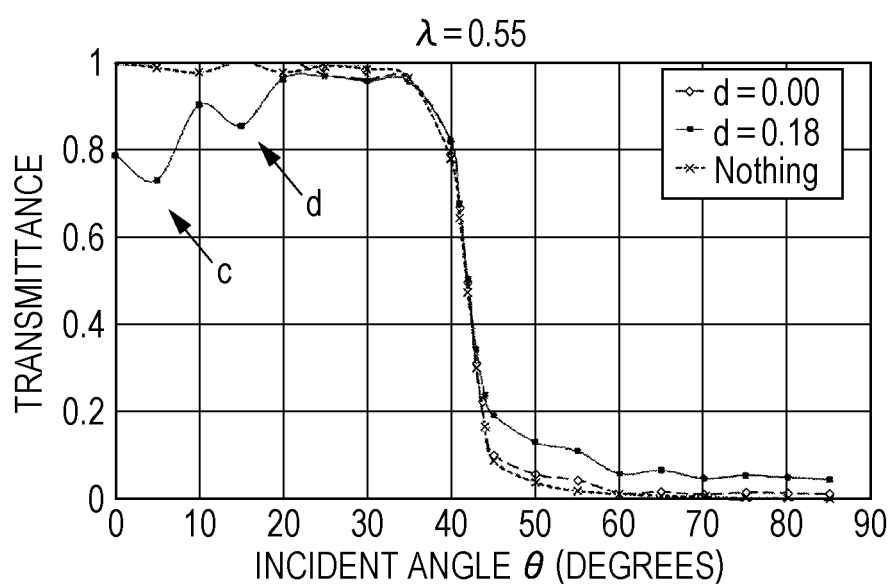
FIG. 6B is a graph illustrating analysis results in a case where the refractive indices of a first light-transmitting layer 3a and a second light-transmitting layer 3b are set equal to the refractive index of the light transmitting sheet in the structure shown in FIG. 3, and the refractive index of the third light-transmitting layer 3c is changed to 2.0, and illustrating the relationship between an incident angle and transmittance toward the outside of the sheet.
Figure 6C:
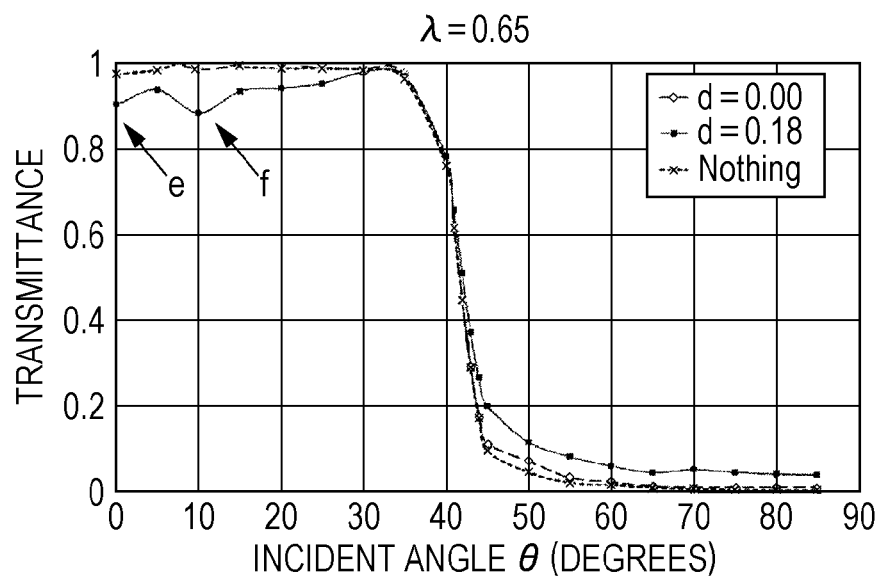
FIG. 6C is a graph illustrating analysis results in a case where the refractive indices of a first light-transmitting layer 3a and a second light-transmitting layer 3b are set equal to the refractive index of the light transmitting sheet in the structure shown in FIG. 3, and the refractive index of the third light-transmitting layer 3c is changed to 2.0, and illustrating the relationship between an incident angle and transmittance toward the outside of the sheet.
Figure 6D:
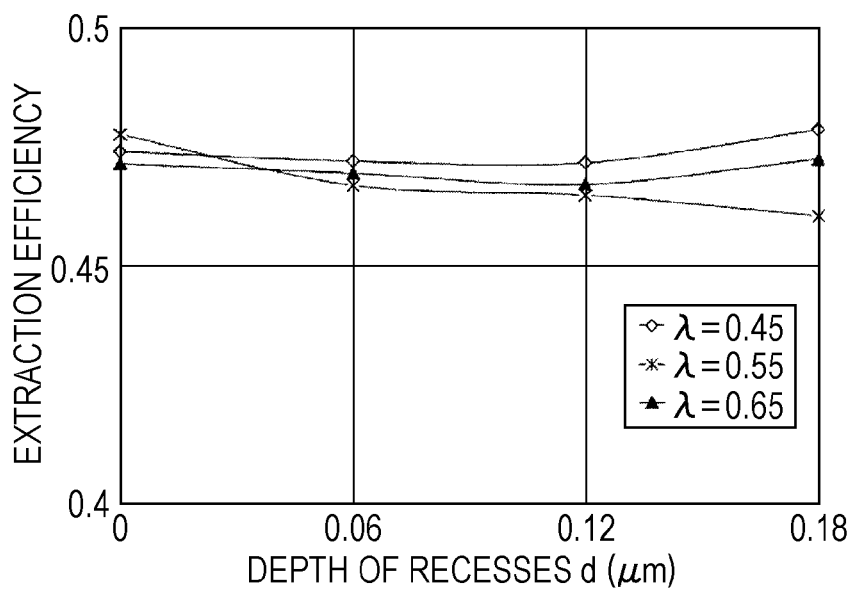
FIG. 6D is a graph illustrating analysis results in a case where the refractive indices of a first light-transmitting layer 3a and a second light-transmitting layer 3b are set equal to the refractive index of the light transmitting sheet in the structure shown in FIG. 3, and the refractive index of the third light-transmitting layer 3c is changed to 2.0, and illustrating the relationship between the depth of recesses in the diffraction grating and the efficiency for extracting light outside the sheet.

FIGS. 6A to 6D illustrate analysis results in a case where the refractive indices of the first light-transmitting layer 3a and the second light-transmitting layer 3b are set equal to the refractive index of the light transmitting sheet 2 in the structure shown in FIG. 3, and the refractive index of the third light-transmitting layer 3c is changed to 2.0. Other conditions are the same as the conditions used when the analysis results shown in FIG. 4 are obtained. FIG. 6A illustrates a result obtained when the wavelength λ of the light source is equal to 0.45 μm, FIG. 6B illustrates a result obtained when the wavelength λ is equal to 0.55 μm, and FIG. 6C illustrates a result obtained when the wavelength λ is equal to 0.65 μm. When a result corresponding to a case where the depth d of the grating is equal to 0.18 μm is compared with a result corresponding to a case where d=0, the transmittance in the former case drops at positions indicated by arrows a, b, c, d, e, and f, as compared with the latter case. This is due to the same reason as that described with reference to FIGS. 4A to 4C. However, in a region larger than or equal to the critical angle, the transmittance in the former case rises significantly, as compared with the latter case in which the transmittance becomes close to zero. This is because light with an incident angle larger than or equal to the critical angle is diffracted by the diffraction grating of the optical coupling structure 3, and a portion thereof is converted into an inside-critical-angle light beam within the sheet. FIG. 6D illustrates specification values (i.e., values divided by 90) of values obtained by integrating the curves in FIGS. 6A, 6B, and 6C with respect to incident angles θ, relative to the depth d of the recesses as a parameter. Under some conditions, the extraction efficiency increases with increasing d, and the light trapping effect cannot be achieved. This indicates that the characteristics in the region larger than or equal to the critical angle counteract the effect at the positions indicated by the arrows a, b, c, d, e, and f.

When the analysis results shown in FIGS. 4A to 4C and 6A to 6C are compared, the transmittance can be made zero at angles larger than or equal to the critical angle in FIGS. 4A to 4C. When the result corresponding to the case where the depth d of the grating is equal to 0.18 μm is compared with the result corresponding to the case where d=0, there is no difference in the region larger than or equal to the critical angle, and both results indicate substantially zero. The reason for this is as follows. Because the refractive indices of the first light-transmitting layer 3a and the second light-transmitting layer 3b are set to be lower than the refractive index of the light transmitting sheet 2, total reflection occurs at the surface 3q, which is the interface between the second light-transmitting layer 3b and the light transmitting sheet 2. Thus, diffracted light is not generated by the diffraction grating since light with a large incident angle cannot enter the diffraction grating within the optical coupling structure 3. Accordingly, in order for the third light-transmitting layer 3c to function as a guide layer in the optical coupling structure 3, the refractive index thereof is preferably higher than the refractive indices of the first light-transmitting layer 3a and the second light-transmitting layer 3b. Moreover, in order to prevent an outside-critical-angle light beam from entering the third light-transmitting layer 3c, the refractive indices of the first light-transmitting layer 3a and the second light-transmitting layer 3b are preferably lower than the refractive index of the light transmitting sheet 2. Furthermore, in order to reduce the critical angle relative to total reflection between the light transmitting sheet 2 and the optical coupling structure, it is preferable that the difference between the refractive indices of the first light-transmitting layer 3a and the second light-transmitting layer 3b and the refractive index of the light transmitting sheet be large. For example, it is preferable that the refractive indices of the first light-transmitting layer 3a and the second light-transmitting layer 3b be 1.

Accordingly, in the light capturing sheet according to this embodiment, light incident at various angles on the first principal surface and the second principal surface of the light transmitting sheet becomes an inside-critical-angle light beam and enters an optical coupling structure disposed within the light transmitting sheet. A portion of the light beam is converted into guided light, which propagates through the third light-transmitting layer, by the diffraction grating within the optical coupling structure and is radiated from the end surface of the optical coupling structure so as to become an outside-critical-angle light beam. Since the pitches of diffraction gratings or the directions of the diffraction gratings vary from optical coupling structure to optical coupling structure, this conversion is performed with respect to all directions and a wide wavelength range, such as the entire visible-light range. Furthermore, since the diffraction grating is short, a radiation loss of guided light can be reduced. Therefore, all inside-critical-angle light beams existing within the light transmitting sheet are converted into outside-critical-angle light beams by the plurality of optical coupling structures. Because the refractive indices of the first and second light-transmitting layers of each optical coupling structure are lower than the refractive index of the light transmitting sheet, an outside-critical-angle light beam is totally reflected at the surface of the optical coupling structure, and this light beam repeatedly undergoes total reflection between the surfaces of another optical coupling structure or the surfaces of the light transmitting sheet, so as to be trapped within the light transmitting sheet. Accordingly, the optical coupling structures non-reversibly convert an inside-critical-angle light beam into an outside-critical-angle light beam and maintain the outside-critical-angle light beam in the outside-critical-angle state. Therefore, by sufficiently setting the density of the optical coupling structures, all light beams entering the light capturing sheet can be converted into outside-critical-angle light beams, that is, light beams trapped within the sheet.

In FIG. 1A, the first principal surface $2p$ of the light transmitting sheet 2 is covered by the cover sheet $2e$ via the buffer layer $2f$. Therefore, foreign matter $2g$, such as water droplets, adheres to the surface of the cover sheet $2e$ and is thus prevented from coming into contact with the first principal surface $2p$. If the foreign matter $2g$ comes into contact with the first principal surface $2p$, the relationship of total reflection at that contact surface becomes lost, causing an outside-critical-angle light beam trapped within the light transmitting sheet 2 to leak outside via the foreign matter $2g$. Although the spacer $2d$ is also in contact with the first principal surface $2p$, since the refractive index thereof is substantially no different from the refractive index of the ambient medium, the relationship of total reflection at that contact surface is maintained. Thus, an outside-critical-angle light beam does not leak outside via the spacer $2d$. If the surface area of the light transmitting sheet is small, a configuration in which the buffer layer $2f$ is formed between the cover sheet $2e$ and the first principal surface $2p$ without interposing the spacer $2d$ therebetween is also conceivable.

The light capturing sheet 51 can be manufactured based on, for example, the following method. FIGS. 7A to 7I are cross-sectional views schematically illustrating a procedure for manufacturing the light capturing sheet 51.

Figure 7A:
FIG. 7A is a cross-sectional view schematically illustrating a procedure for manufacturing the light capturing sheet according to the first embodiment.
Figure 7B:
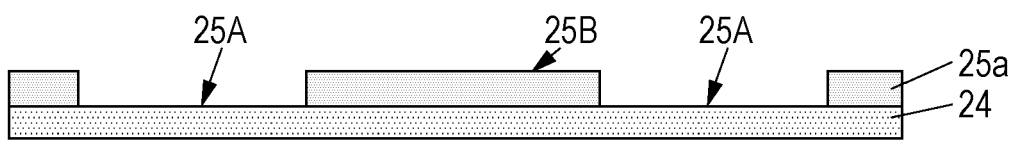
FIG. 7B is a cross-sectional view schematically illustrating another procedure for manufacturing the light capturing sheet according to the first embodiment.

As shown in FIG. 7A, a low refractive-index film $25a$ composed of, for example, $SiO_2$ is formed over the surface of a high refractive-index film 24 composed of, for example, SiN. A resist is applied onto the low refractive-index film $25a$. After performing exposure using a mask pattern shown in FIG. 8A and removing the resist in photosensitive portions, the low refractive-index film is etched by using the high refractive-index film 24 as a stopper, and the remaining resist is removed, whereby a cross-sectional structure shown in FIG. 7B is obtained. The low refractive-index film $25a$ has a pattern that includes regions 25A where the low refractive-index film $25a$ has been etched such that the high refractive-index film 24 is exposed, and regions 25B where the low refractive-index film $25a$ remains without being etched. A step formed between these two kinds of regions ranges from, for example, 1 μm to 3 μm.

Figure 7C:
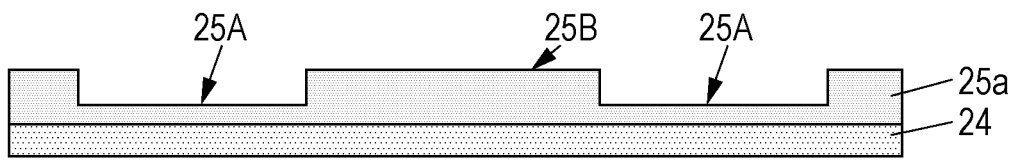
FIG. 7C is a cross-sectional view schematically illustrating another procedure for manufacturing the light capturing sheet according to the first embodiment.

Next, a low refractive-index film $25a$ composed of, for example, $SiO_2$ is deposited again so as to cover the regions 25A and the regions 25B, so that the low refractive-index film $25a$ is provided at the bottom of each region 25A, as shown in FIG. 7C. The thickness of the low refractive-index film $25a$ in the regions 25A is, for example, 0.4 μm or larger.

Alternatively, when etching the low refractive-index film $25a$, the amount by which the low refractive-index film $25a$ is etched may be adjusted so that the low refractive-index film $25a$ with a thickness larger than or equal to 0.4 μm remains in the regions 25A. In this case, the structure shown in FIG. 7C can be obtained by a single etching process.

Figure 7D:
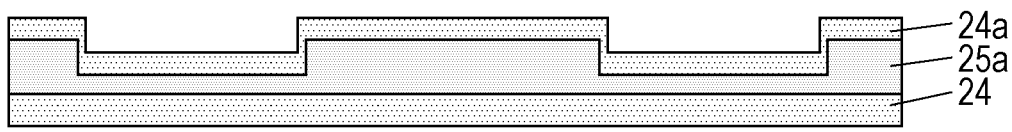
FIG. 7D is a cross-sectional view schematically illustrating another procedure for manufacturing the light capturing sheet according to the first embodiment.

Next, a high refractive-index film $24a$ having a thickness larger than or equal to 0.4 μm is formed over the entire surface of the low refractive-index film $25a$, as shown in FIG. 7D. Furthermore, a resist is applied onto the surface of the high refractive-index film $24a$, and the resist is exposed to light based on a two-beam interference exposure method.

In a two-beam interference exposure method, two laser beams are made to intersect and interfere with each other so that a striped exposure area can be formed without using a mask. Furthermore, by adjusting the incident directions and the incident angles of the laser beams, the orientation or the pitch of the stripes can be changed, whereby an exposure area with stripes extending in one direction can be formed in each of the plurality of regions 25A and 25B.

Figure 7E:
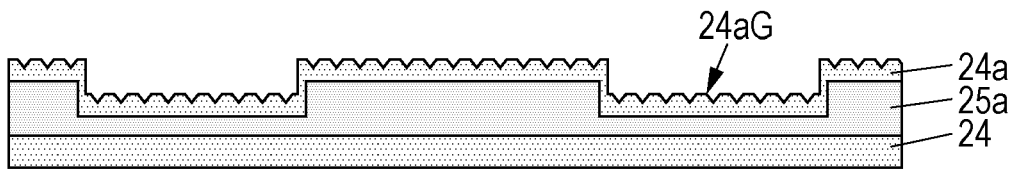
FIG. 7E is a cross-sectional view schematically illustrating another procedure for manufacturing the light capturing sheet according to the first embodiment.
Figure 7F:
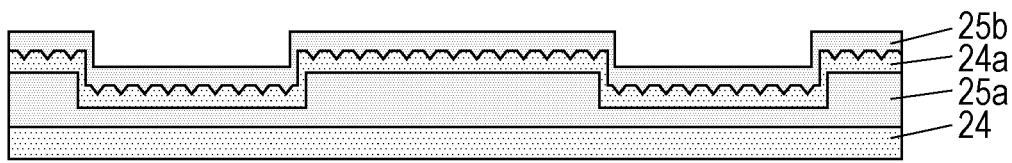
FIG. 7F is a cross-sectional view schematically illustrating another procedure for manufacturing the light capturing sheet according to the first embodiment.
Figure 7G:
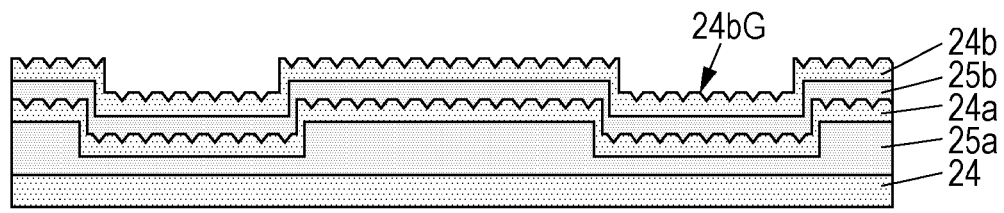
FIG. 7G is a cross-sectional view schematically illustrating another procedure for manufacturing the light capturing sheet according to the first embodiment.

After the exposure process, a resist exposure area (or a non-exposure area) is removed, and the high refractive-index film $24a$ is etched by using the remaining resist pattern. Then, the resist pattern is removed so that a grating $24a$G with a depth of 0.1 μm or larger is formed over the surface of the high refractive-index film $24a$, as shown in FIG. 7E.

Figure 7H:
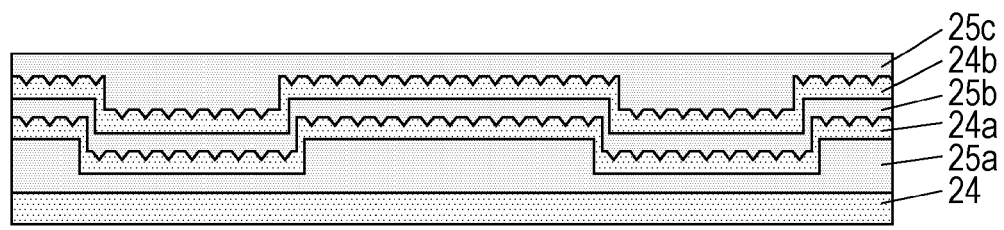
FIG. 7H is a cross-sectional view schematically illustrating another procedure for manufacturing the light capturing sheet according to the first embodiment.

Subsequently, a process for forming a low refractive-index film $25b$ (FIG. 7F) and a process for forming a high refractive-index film $24b$ and a grating $24b$G (FIG. 7G) are repeated. In this case, the directions and the pitches of, for example, the gratings $24a$G and $24b$G can be changed. The thickness of each of the low refractive-index film $25b$ and the high refractive-index film $24b$ is larger than or equal to 0.4 μm, and the depth of each of the gratings $24a$G and $24b$G is larger than or equal to 0.1 μm. After forming a final low refractive-index film $25c$, a smoothing process is performed on the uppermost surface, as shown in FIG. 7H.

Figure 7I:
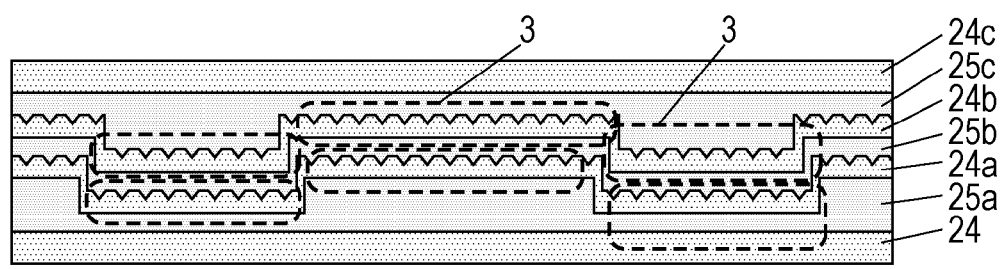
FIG. 7I is a cross-sectional view schematically illustrating another procedure for manufacturing the light capturing sheet according to the first embodiment.

A high refractive-index film $24c$ is formed over the low refractive-index film $25c$ having the flattened surface, whereby a light capturing sheet 51 shown in FIG. 7I is completed. The high refractive-index film 24 may be preliminarily formed on a transparent planar substrate. In that case, the finished product may be used together with the planar substrate or may be used after peeling the finished product from the planar substrate.

As described above, although each high refractive-index film extends continuously with no seams, since the high refractive-index film is bent at the borders between the regions 25A and the regions 25B, the optical coupling structures 3 are split along these bent portions. Furthermore, since the high refractive-index films 24, $24a$, $24b$, and $24c$ respectively sandwich the low refractive-index films $25a$, $25b$, and $25c$ in all of the regions, the high refractive-index films 24, $24a$, $24b$, and $24c$ are completely separated from the peripheral high refractive-index films 24, $24a$, $24b$, and $24c$. Therefore, each optical coupling structure 3 functions as an independent optical element. Light incident on each high refractive-index film (i.e., the third light-transmitting layer $3c$) is converted into guided light, and this guided light is radiated into the sheet as an outside-critical-angle light beam at a bent portion. In the manufacturing method according to this embodiment, only the patterning process for the first low refractive-index film $25a$ requires exposure based on a mask pattern. Because the subsequent process only involves steps for forming films over the entire surfaces and for performing interference exposure on the entire surfaces, the processes are extremely simple.

Figure 7J:
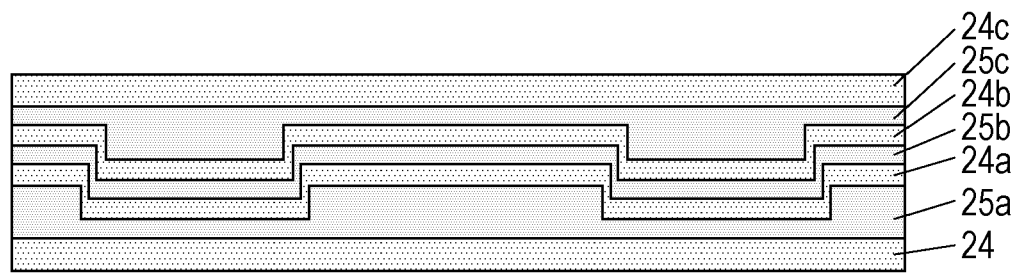
FIG. 7J is a cross-sectional view schematically illustrating another procedure for manufacturing the light capturing sheet according to the first embodiment.
Figure 7K:
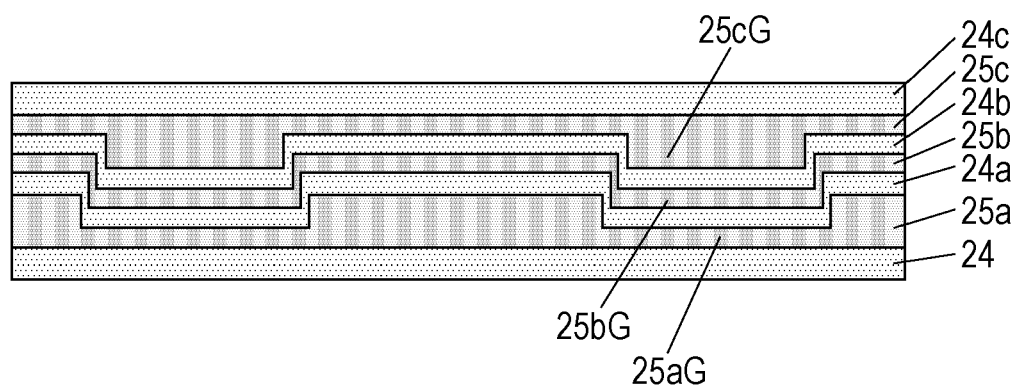
FIG. 7K is a cross-sectional view schematically illustrating another procedure for manufacturing the light capturing sheet according to the first embodiment.

Next, a method for manufacturing the light capturing sheet equipped with the optical coupling structures 3 shown in FIG. 2F will be described. Similar to the method described with reference to FIGS. 7A to 7I, $SiO_2$ with $GeO_2$ added thereto is used as the material for the low refractive-index films $25a$, $25b$, and $25c$, and the diffraction-grating forming process based on the two-beam interference exposure method is eliminated so that a light capturing sheet not provided with diffraction gratings is formed, as shown in FIG. 7J. Subsequently, based on a two-beam interference exposure method using an ultraviolet laser beam, a photoinduced refractive-index change is made to occur in the low refractive-index films 25a, 25b, and 25c so that high refractive-index portions (25aG, 25bG, 25cG, and so on) having higher refractive indices than the surroundings are periodically formed in accordance with light-intensity distribution of an interference pattern, as shown in FIG. 7K. Thus, in FIG. 7K, a light capturing sheet equipped with the optical coupling structures 3 shown in FIG. 2F is completed. In the manufacturing method according to this embodiment, the high refractive-index portions of diffraction gratings can be collectively formed so that diffraction gratings do not have to be formed in the course of the manufacturing process. Thus, the number of manufacturing steps is smaller than that in the above-described manufacturing method, whereby the light capturing sheet can be manufactured more efficiently.

In this embodiment, the optical coupling structures 3 each have a rectangular shape in the x-y plane. In this case, as shown in FIG. 8A, the optical coupling structures 3 in the group 3G that are located at the same height in the z-axis direction are arranged at, for example, positions indicated by the regions 35A. In other words, the optical coupling structures 3 in the group 3G are arranged in a checkered pattern, and the optical coupling structures 3 in the other group 3G' adjacent thereto are arranged in a checkered pattern indicated by the regions 35B.

Figure 8B:
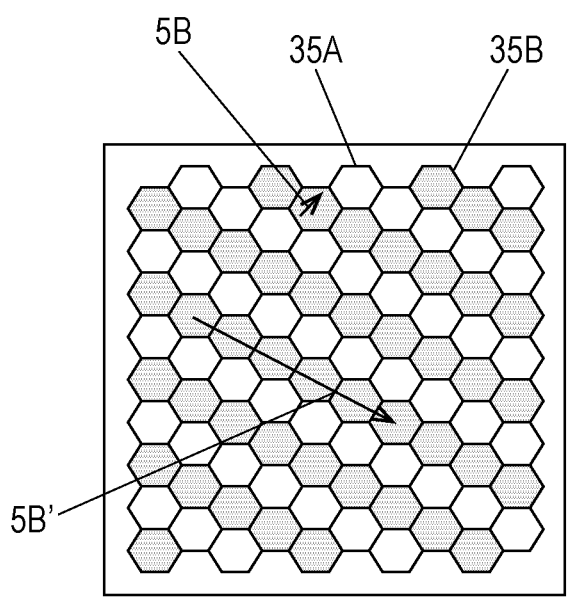
FIG. 8B is another diagram illustrating the shape and the arrangement of optical coupling structures in an x-y plane.
Figure 8C:
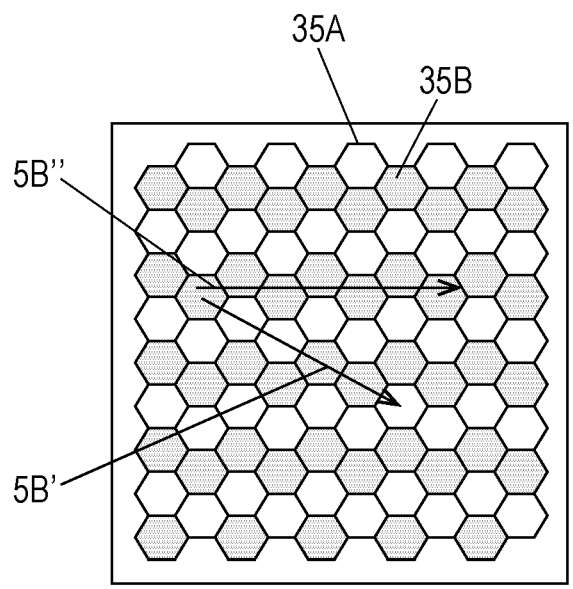
FIG. 8C is another diagram illustrating the shape and the arrangement of optical coupling structures in an x-y plane.
Figure 8D:
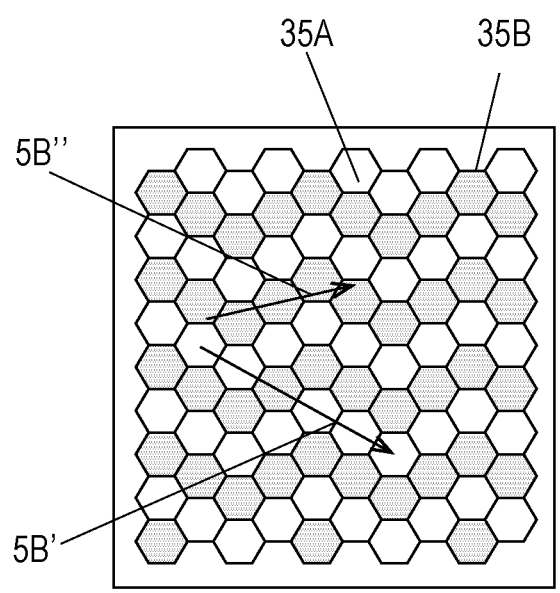
FIG. 8D is another diagram illustrating the shape and the arrangement of optical coupling structures in an x-y plane.

In contrast, if the optical coupling structures 3 each have a hexagonal shape in the x-y plane, the optical coupling structures 3 in the group 3G and the optical coupling structures 3 in the other group 3G' can be arranged as shown in FIGS. 8B to 8D.

Specifically, as shown in FIG. 8B, the optical coupling structures 3 in the group 3G that are located at the same height in the z-axis direction may be, for example, successively formed in a 5B' direction that is orthogonal to one side of each hexagon indicated by the corresponding region 35A. In this case, of the optical coupling structures 3 in the group 3G, in the 5B' direction, the optical coupling structures 3 are not separated from each other, and the third light-transmitting layer 3c extends continuously. Therefore, of light beams entering the light capturing sheet from various directions, a light beam captured by the optical coupling structures 3 and traveling in the 5B' direction propagates by a long distance through the third light-transmitting layer 3c. Thus, as the light beam propagates in the 5B' direction, the light beam temporarily captured by the third light-transmitting layer 3c may sometimes be radiated outside the optical coupling structures 3 as an inside-critical-angle light beam by the diffraction gratings 3d. However, since only the light beam traveling in the 5B' direction propagates by a long distance through the third light-transmitting layer 3c, light beams traveling in other directions in the third light-transmitting layer 3c are radiated as outside-critical-angle light beams, as described above, and are trapped within the light capturing sheet. Therefore, a decrease in light capturing efficiency in the entire light capturing sheet is not very large.

In order to suppress such a decrease in light capturing efficiency, the optical coupling structures 3 in the group 3G may be formed such that the optical coupling structures 3 are not successive in one direction. For example, FIG. 8C illustrates a case where the number of optical coupling structures 3 successively arranged in the 5B' direction orthogonal to one side of each hexagon is two. In this case, the optical coupling structures 3 are successive in a 5B'' direction that is parallel to one side of each hexagon that forms a 30-degree angle with the 5B' direction. However, the probability of occurrence of light that can propagate in the 5B'' direction becomes lower than that in the arrangement shown in FIG. 8B. Thus, a decrease in light capturing efficiency in the entire capturing sheet is suppressed.

Furthermore, FIG. 8D illustrates a case where the number of optical coupling structures 3 successively arranged in the 5B' direction orthogonal to one side of each hexagon is three. In this case, although there are five successive optical coupling structures 3 in the 5B'' direction, there are no directions in which the optical coupling structures 3 are successive by five or more. Therefore, a decrease in light capturing efficiency in the entire capturing sheet is further suppressed.

Although second to eighth embodiments will be described below, since a description related to the cover sheet 2e is the same as that in the first embodiment, a redundant description thereof will therefore be omitted.

Second Embodiment

Figure 9:
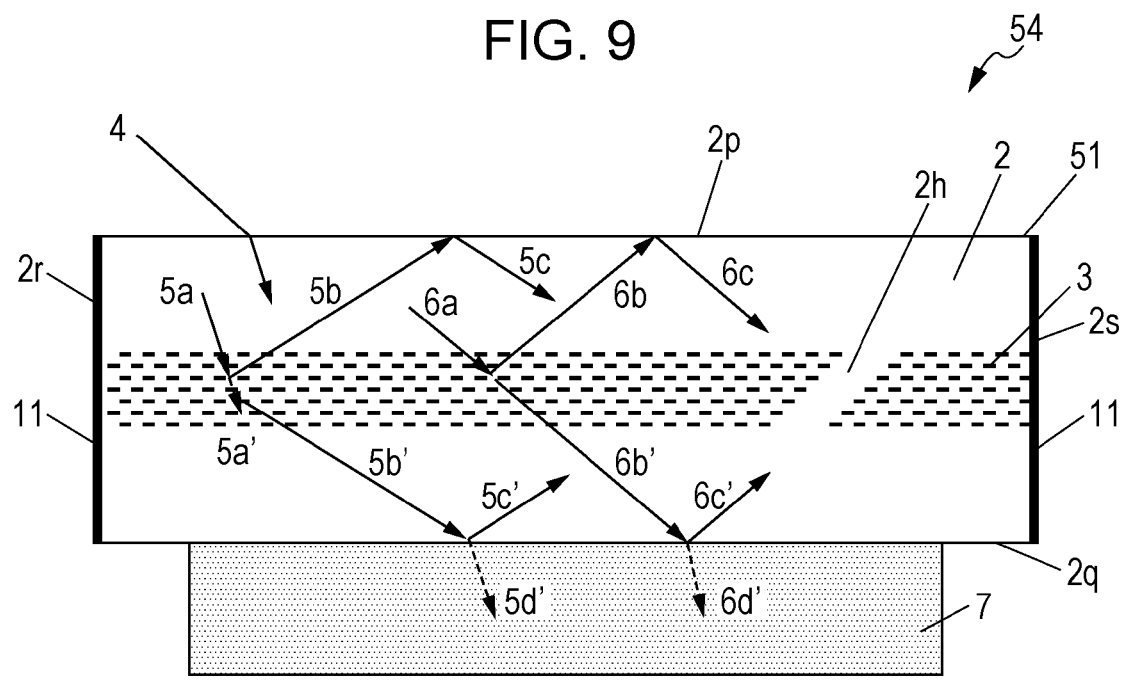
FIG. 9 is a cross-sectional view schematically illustrating a light receiving device according to an embodiment of the present disclosure.

A light receiving device according to an embodiment of the present disclosure will now be described. FIG. 9 schematically illustrates a cross-sectional structure of a light receiving device 54 according to this embodiment. The light receiving device 54 includes the light capturing sheet 51 according to the first embodiment and a photoelectric converter 7.

End surfaces 2s and 2r of the light capturing sheet 51 are provided with, for example, reflective films 11. The photoelectric converter 7 is provided adjacent to the second principal surface 2q of the light capturing sheet 51. In a case where the light transmitting sheet 2 has a plurality of end surfaces, the reflective films 11 may be provided at all of the end surfaces. In this embodiment, a part of the second principal surface 2q and a light receiver of the photoelectric converter 7 are in contact with each other. The photoelectric converter 7 may be provided on a part of the first principal surface 2p of the light capturing sheet 51.

By covering the end surfaces 2r and 2s of the light capturing sheet 51 with the reflective films 11, light captured and sealed within the light capturing sheet 51 is made to circulate within the light capturing sheet 51.

The photoelectric converter 7 is a solar battery constituted of silicon. A plurality of photoelectric converters 7 may be attached to a single light capturing sheet 51. The refractive index of silicon is about 5. Therefore, even when light becomes orthogonally incident on a light receiving surface of the solar battery, about 40% of the incident light becomes lost due to reflection without being captured by the photoelectric converter 7. If light becomes diagonally incident on the light receiving surface, the reflection loss further increases. Although the surface of a commercially-available solar battery is provided with an AR coating or a non-reflective nano-structure for reducing this reflection amount, sufficient performance is not achieved. Furthermore, a solar battery has a metallic layer therein, and a large portion of light reflected by this metallic layer is released outside. With an AR coating or a non-reflective nano-structure, the reflected light is released outside with high efficiency.

In contrast, the light capturing sheet according to the present disclosure captures and seals light of all visible-light wavelengths at all incident angles into the light capturing sheet. Therefore, in the light receiving device 54, light entering through the first principal surface 2p of the light capturing sheet 51 is captured by the light capturing sheet 51 and circulates within the light capturing sheet 51. Since the refractive index of silicon is higher than the refractive index of the light transmitting sheet 2, the outside-critical-angle light beams 5b' and 6b' incident on the second principal surface 2q are not totally reflected, and portions thereof are transmitted to the photoelectric converter 7 as refracted light beams 5d' and 6d' and are converted into electric current at the photoelectric converter. The reflected outside-critical-angle light beams 5c' and 6c' propagate through the sheet and then re-enter the photoelectric converter 7 so as to be utilized for photoelectric conversion until there is no sealed light remaining. Assuming that the refractive index of the light transmitting sheet 2 is 1.5, the reflectance of light orthogonally incident on the first principal surface 2p is about 4%. If this surface is provided with an AR coating or a non-reflective nano-structure, the reflectance can be reduced to 1% to 2% or lower, including wavelength dependency and angle dependency. The remaining light enters the light capturing sheet 51 and is trapped therein so as to be utilized for photoelectric conversion.

In the light receiving device according to this embodiment, most of incident light is trapped within the sheet, and most of the trapped light can be utilized for photoelectric conversion. Therefore, the energy conversion efficiency of the photoelectric converter can be significantly improved. Furthermore, the light receiving area is determined based on the area of the first principal surface 2p, and light received by this surface entirely enters the photoelectric converter 7. Thus, the area of the photoelectric converter 7 can be reduced, or the number of photoelectric converters 7 can be reduced, thereby significantly reducing the cost of the light receiving device.

Third Embodiment

Figure 10:
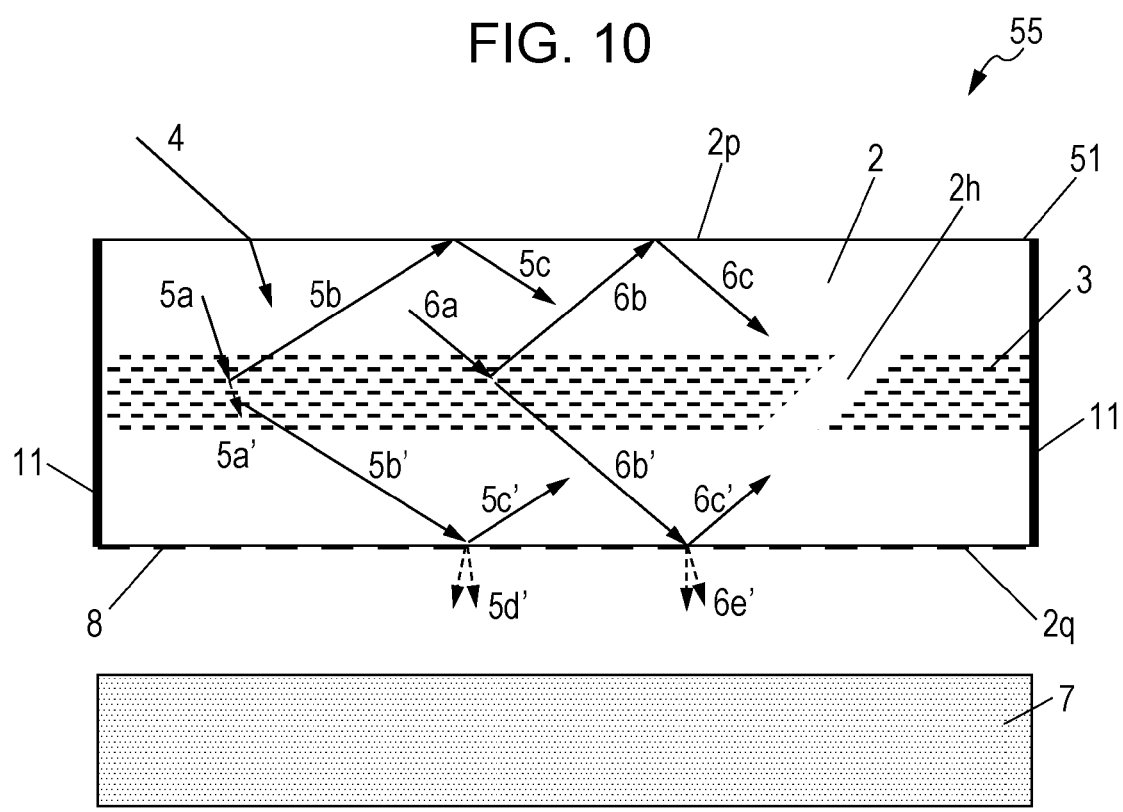
FIG. 10 is a cross-sectional view schematically illustrating a light receiving device according to another embodiment of the present disclosure.

A light receiving device according to another embodiment of the present disclosure will now be described. FIG. 10 schematically illustrates a cross-sectional structure of a light receiving device 55 according to this embodiment. The light receiving device 55 includes the light capturing sheet 51 according to the first embodiment and the photoelectric converter 7.

The light receiving device 55 is different from the light receiving device 54 according to the second embodiment in that the second principal surface 2q is provided with an irregular-surface structure 8 and in that a gap is provided between the second principal surface 2q and the photoelectric converter 7. The irregular-surface structure 8 provided at the second principal surface 2q has recesses and protrusions each having a width of 0.1 μm or larger, and may have a periodical pattern or a random pattern. With this irregular-surface structure 8, the outside-critical-angle light beams 5b' and 6b' incident on the second principal surface 2q are not totally reflected, and portions thereof travel as output light beams 5d' and 6d' toward the photoelectric converter 7 where they undergo photoelectric conversion. Light beams reflected at the photoelectric converter 7 are captured into the light capturing sheet 51 through the second principal surface 2q thereof and propagate through the light capturing sheet 51. Subsequently, the light beams travel again as output light beams 5d' and 6d' toward the photoelectric converter 7. Therefore, in the light receiving device according to this embodiment, most of incident light is trapped within the sheet, and most of the trapped light can be utilized for photoelectric conversion. Furthermore, similar to the second embodiment, the area of the photoelectric converter 7 can be reduced, or the number of photoelectric converters 7 can be reduced. Consequently, a low-cost light receiving device with significantly-improved energy conversion efficiency can be achieved.

Fourth Embodiment

Figure 11:
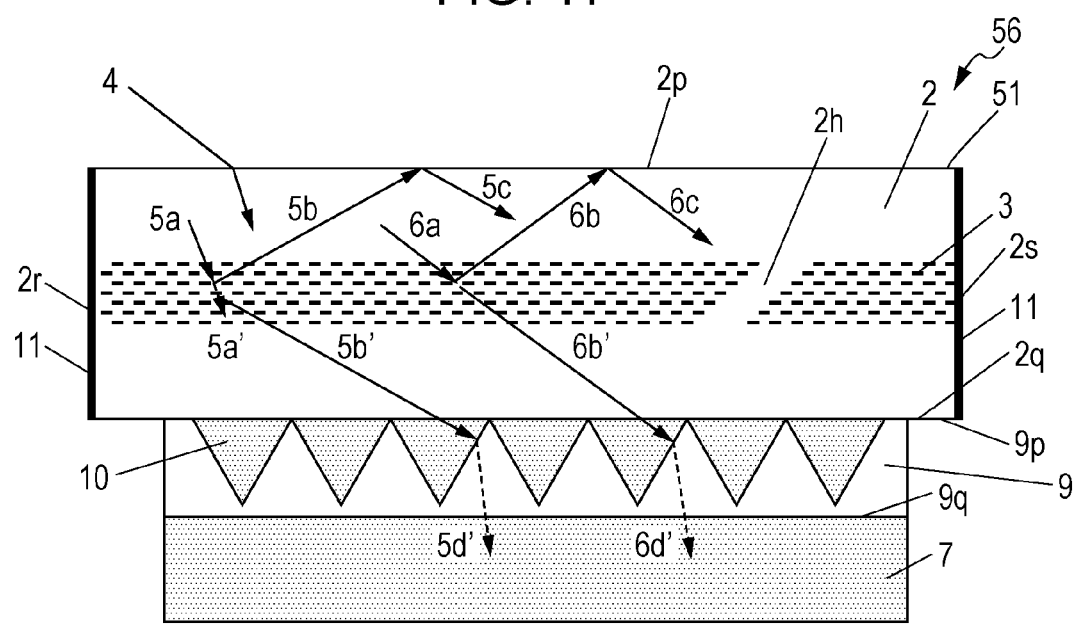
FIG. 11 is a cross-sectional view schematically illustrating a light receiving device according to another embodiment of the present disclosure.

A light receiving device according to another embodiment of the present disclosure will now be described. FIG. 11 schematically illustrates a cross-sectional structure of a light receiving device 56 according to this embodiment. The light receiving device 56 includes the light capturing sheet 51 according to the first embodiment, the photoelectric converter 7, and a prism sheet 9.

The light receiving device 56 is different from the light receiving device 54 according to the second embodiment in that the prism sheet 9 is provided between the second principal surface 2q and the photoelectric converter 7. In the prism sheet 9, tetrahedral prisms 10 are arranged adjacent to each other. Alternatively, the prism sheet 9 may be formed by laminating two sheets of triangular prism rows orthogonally to each other. Because the refractive index of the prisms 10 is set to be higher than the refractive index of the prism sheet 9, the outside-critical-angle light beams 5b' and 6b' incident on the surface of the prism sheet 9 are refracted at a prism surface so as to become 5d' and 6d', respectively, which then travel toward the photoelectric converter 7. Since the light beams enter the photoelectric converter 7 at a substantially orthogonal incident angle, reflection at the light receiving surface of the photoelectric converter 7 can be reduced, so that the number of circulations of light within the light capturing sheet 51 can be reduced, as compared with the second embodiment.

In the light receiving device according to this embodiment, most of incident light is trapped within the light capturing sheet, and most of the trapped light can be utilized for photoelectric conversion. Furthermore, similar to the second embodiment, the area of the photoelectric converter 7 can be reduced, or the number of photoelectric converters 7 can be reduced. Consequently, a low-cost light receiving device with significantly-improved energy conversion efficiency can be achieved. Furthermore, since the number of circulations of light within the sheet is smaller than that in the second embodiment, the effect of the light sealing performance of the light capturing sheet is less received.

Fifth Embodiment

Figure 12:
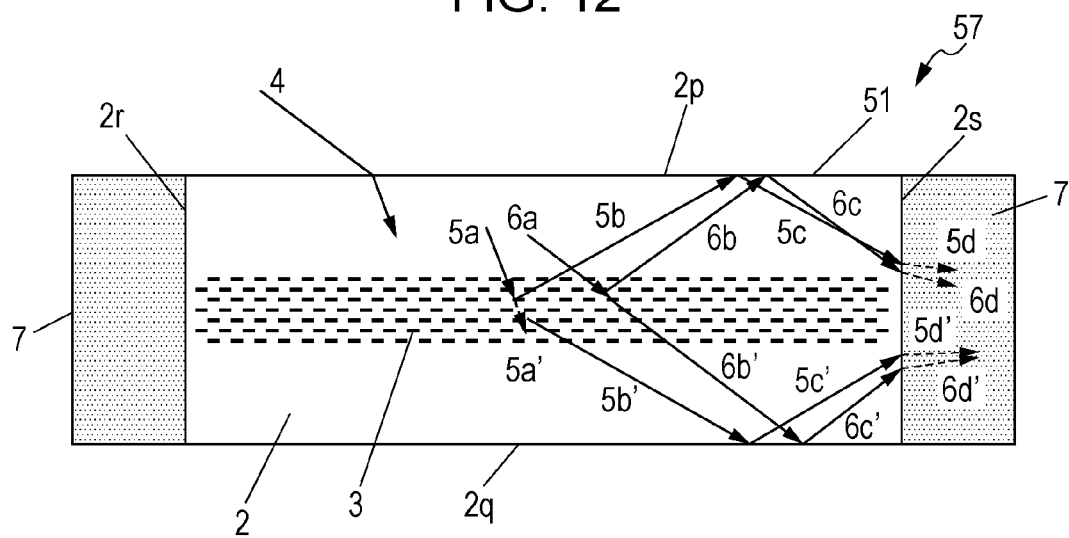
FIG. 12 is a cross-sectional view schematically illustrating a light receiving device according to another embodiment of the present disclosure.

A light receiving device according to another embodiment of the present disclosure will now be described. FIG. 12 schematically illustrates a cross-sectional structure of a light receiving device 57 according to this embodiment. The light receiving device 57 includes the light capturing sheet 51 according to the first embodiment and photoelectric converters 7.

The light receiving device 57 is different from the light receiving device 54 according to the second embodiment in that the end surfaces 2s and 2r are covered with the photoelectric converters 7 in place of the reflective films 11. In a case where the light transmitting sheet 2 has a plurality of end surfaces, the photoelectric converters 7 may be provided at all of the end surfaces. In this embodiment, the light capturing sheet 51 does not have to be provided with the fourth regions 2h.

In the case where the photoelectric converters 7 are provided at the end surfaces 2s and 2r, the outside-critical-angle light beams 5c', 6c, 5c', and 6c' become incident on each photoelectric converter 7 along the normal line of the light receiving surface of the photoelectric converter 7, unlike the second embodiment. Therefore, reflection at the surface of the photoelectric converter 7 can be reduced, so that the number of circulations of light within the light capturing sheet 51 can be reduced.

In the light receiving device according to this embodiment, most of incident light is trapped within the light capturing sheet, and most of the trapped light can be utilized for photoelectric conversion. Consequently, a light receiving device with significantly-improved energy conversion efficiency can be achieved. Furthermore, since the area of each photoelectric converter 7 can be reduced, as compared with the second embodiment, significant cost reduction can be achieved. Moreover, since the number of circulations of light within the sheet is smaller than that in the second embodiment, the effect of the light sealing performance of the light capturing sheet is less received.

Sixth Embodiment

Figure 13:
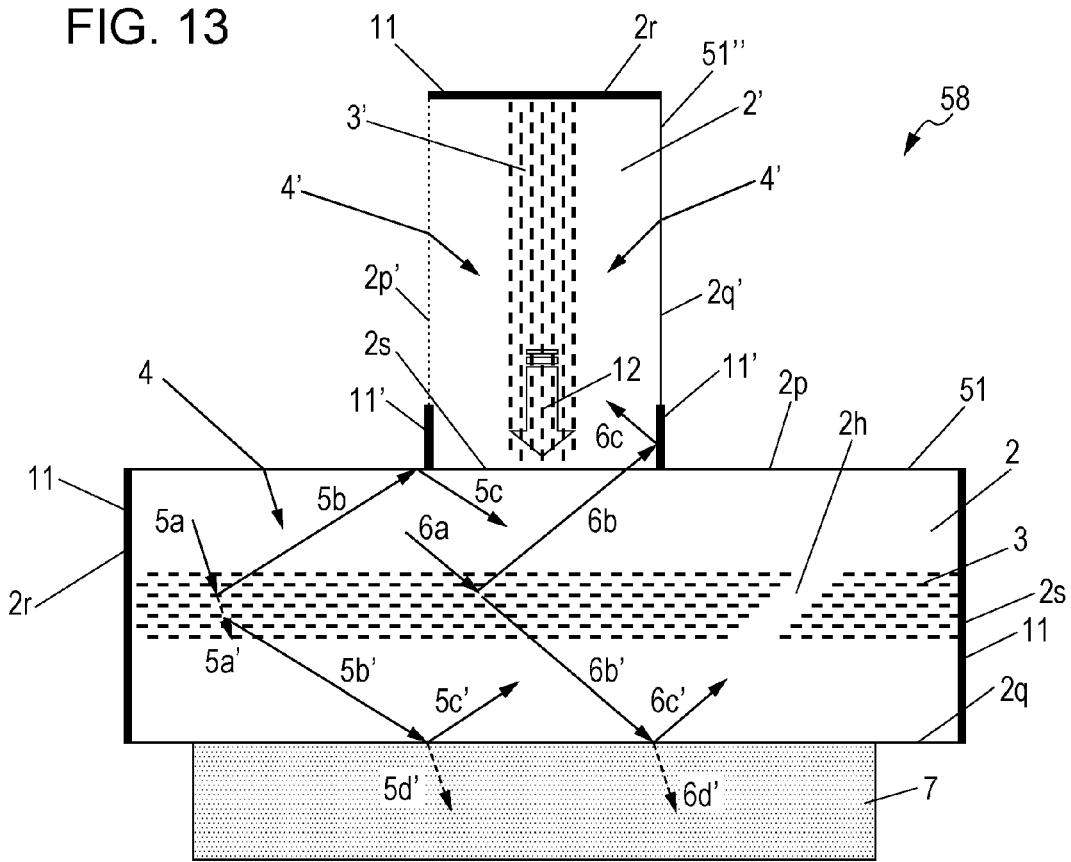
FIG. 13 is a cross-sectional view schematically illustrating a light receiving device according to another embodiment of the present disclosure.

A light receiving device according to another embodiment of the present disclosure will now be described. FIG. 13 schematically illustrates a cross-sectional structure of a light receiving device 58 according to this embodiment. The light receiving device 58 includes light capturing sheets 51 and 51" and the photoelectric converter 7. In this embodiment, the light capturing sheet 51" does not have to be provided with the fourth regions 2h.

The light receiving device 58 is different from that in the second embodiment in that the end surface 2s of the light capturing sheet 51" is joined in contact with the first principal surface 2p of the light receiving device 54 according to the second embodiment. The light capturing sheet 51" may be joined orthogonally to the light capturing sheet 51. In the light capturing sheet 51", the end surface 2r may be provided with a reflective film 11, and a first principal surface 2p' and a second principal surface 2q' near the end surface 2s joined to the light capturing sheet 51 may be provided with reflective films 11'. The reflective films 11' have a function for reflecting the outside-critical-angle light beam 6b from the light capturing sheet 51 so as to prevent the light beam 6b from leaking outside the light capturing sheet 51".

Light 4 incident on the first principal surface 2p of the light capturing sheet 51 is captured into the light capturing sheet 51. On the other hand, light 4' incident on the first principal surface 2p' and the second principal surface 2q' of the light capturing sheet 51" is captured into the light capturing sheet 51". The light captured within the light capturing sheet 51" becomes guided light 12, which propagates toward the end surface 2s, since the end surface 2r is covered with the reflective film 11, and merges with the light within the light capturing sheet 51. Since a part of the second principal surface 2q of the light capturing sheet 51 is in contact with the surface of the photoelectric converter 7 and the refractive index of silicon is higher than the refractive index of the light transmitting sheet 2, the outside-critical-angle light beams 5b' and 6b' incident on the second principal surface 2q are not totally reflected, and portions thereof enter the photoelectric converter 7 as refracted light beams 5d' and 6d' and are converted into electric current at the photoelectric converter 7. The reflected outside-critical-angle light beams 5c' and 6c' propagate through the light capturing sheet 51 and then become incident on the light receiving surface of the photoelectric converter 7 again so as to be continuously utilized for photoelectric conversion until there is no sealed light remaining.

Because the light receiving device according to this embodiment includes the light capturing sheet 51" that is orthogonal to the light receiving surface of the photoelectric converter 7, even when light becomes diagonally incident on the first principal surface 2p of the light capturing sheet 51, the light becomes incident on the first principal surface 2p' and the second principal surface 2q' of the light capturing sheet 51" at a substantially orthogonal incident angle. Therefore, the ease of capturing light from all directions is improved.

In the light receiving device according to this embodiment, most of incident light is trapped within the light capturing sheet, and most of the trapped light can be utilized for photoelectric conversion. Furthermore, similar to the second embodiment, the area of the photoelectric converter 7 can be reduced, or the number of photoelectric converters 7 can be reduced. Consequently, a low-cost light receiving device with significantly-improved energy conversion efficiency can be achieved.

Seventh Embodiment

Figure 14:
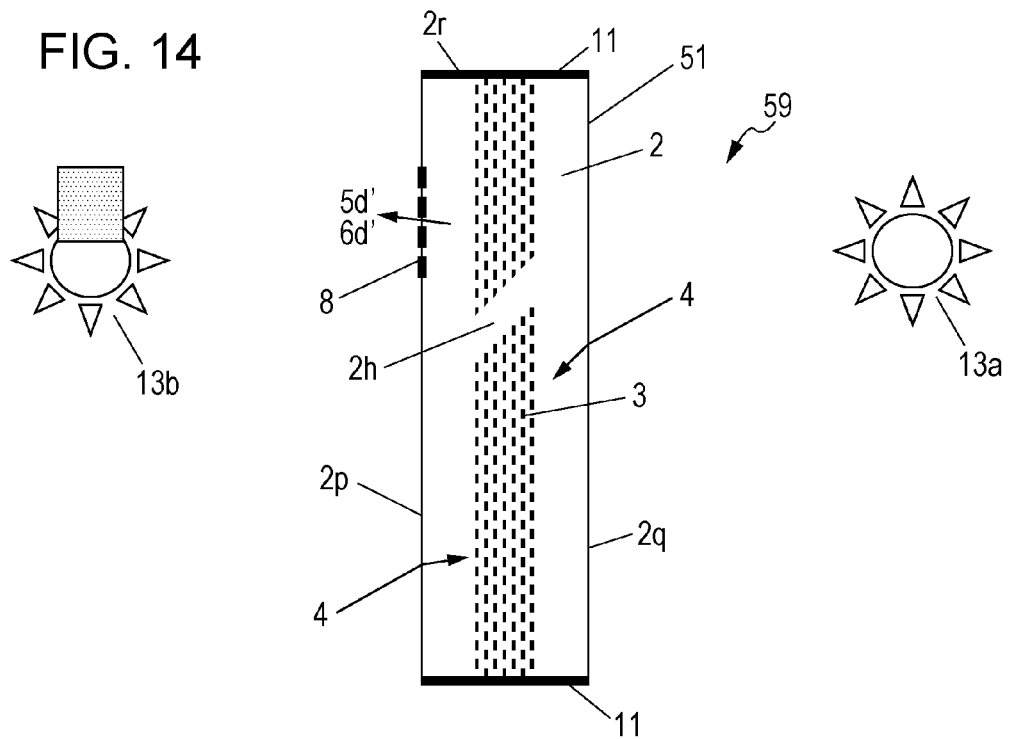
FIG. 14 is a cross-sectional view schematically illustrating a lighting plate according to an embodiment of the present disclosure.

A lighting plate according to an embodiment of the present disclosure will now be described. FIG. 14 schematically illustrates a cross-sectional structure of a lighting plate 59 according to this embodiment. The lighting plate 59 includes the light capturing sheet 51 according to the first embodiment and the irregular-surface structure 8 provided at a part of the first principal surface 2p and the second principal surface 2q of the light capturing sheet 51. In the light capturing sheet 51, the end surfaces 2r and 2s are provided with the reflective films 11.

The irregular-surface structure 8 is formed at a part of the first principal surface 2p and has a random pattern with recesses and protrusions each having a width of 0.1 μm or larger. Light captured by the light capturing sheet 51 propagates through the light capturing sheet 51, and a portion of the propagating light is radiated outside as output light beams 5d and 6d by this irregular-surface structure 8.

The lighting plate 59 is provided in a lighting window of a building, such as a house, such that the first principal surface 2p provided with the irregular-surface structure 8 is located at the indoor side. In the daytime, the lighting plate 59 captures sunlight 13a through the second principal surface 2q and radiates this light indoors from the irregular-surface structure 8. Thus, the lighting plate 59 can be used as an indoor illuminator that radiates light from the irregular-surface structure 8. In the nighttime, the lighting plate 59 captures light from an indoor illuminator 13b through the first principal surface 2p and radiates this light from the irregular-surface structure 8. Thus, the lighting plate 59 can be used as an auxiliary unit of the indoor illuminator. Accordingly, in the lighting plate according to this embodiment, most of incident light is trapped within the sheet and can be reutilized as illuminating light, thereby achieving efficient use of energy.

Eighth Embodiment

Figure 15:
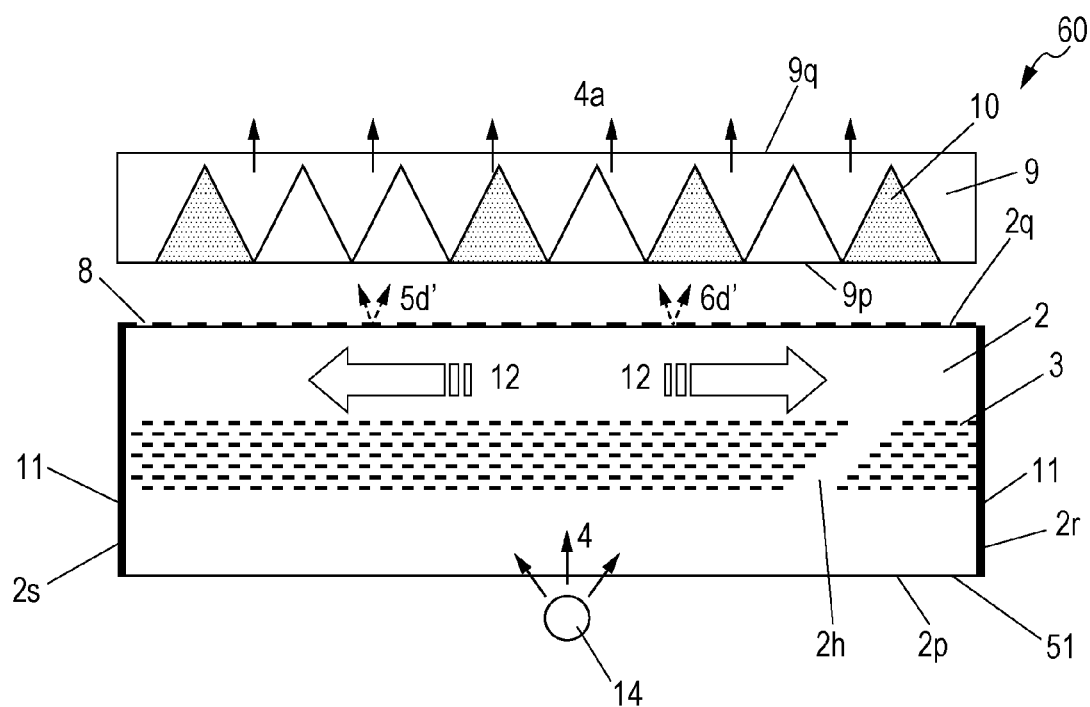
FIG. 15 is a cross-sectional view schematically illustrating a light emitting device according to an embodiment of the present disclosure.

A light emitting device according to an embodiment of the present disclosure will now be described. FIG. 15 schematically illustrates a cross-sectional structure of a light emitting device 60 according to this embodiment. The light emitting device 60 includes the light capturing sheet 51, a light source 14, and the prism sheet 9.

The light source 14, such as an LED, is provided adjacent to one of the first principal surface 2p and the second principal surface 2q of the light capturing sheet 51, and the irregular-surface structure 8 is provided at the other one of the principal surfaces. In this embodiment, the light source 14 is disposed adjacent to the first principal surface 2p, and the irregular-surface structure 8 is provided at the second principal surface 2q. Furthermore, the end surfaces 2s and 2r of the light capturing sheet 51 are provided with the reflective films 11. The irregular-surface structure 8 has recesses and protrusions each having a width of 0.1 μm or larger, and may have a periodical pattern or a random pattern.

The prism sheet 9 is disposed facing the irregular-surface structure 8 with a gap from the second principal surface 2q. In the prism sheet 9, the tetrahedral prisms 10 are arranged adjacent to each other. Alternatively, the prism sheet 9 may be formed by laminating two sheets of triangular prism rows orthogonally to each other.

Light 4 emitted from the light source 14 is captured through the first principal surface 2p of the light capturing sheet 51 and becomes light 12 that propagates through the light capturing sheet 51. A portion of this light is radiated outside as output light beams 5d' and 6d' by the irregular-surface structure 8. The radiated light beams are collected by the prisms 10 within the prism sheet 9 and becomes light 4a with substantially parallel wave fronts.

In the light receiving device according to this embodiment, with a simple and thin configuration, light emitted from a point light source can be trapped within the light capturing sheet and can be extracted as a surface light source.

Ninth Embodiment

A light capturing rod according to an embodiment of the present disclosure will now be described. FIGS. 16A and 16B schematically illustrate a cross-sectional structure of a light capturing rod 61 according to this embodiment, taken in a direction parallel to a central axis thereof, and a cross-sectional structure taken in a direction orthogonal to the central axis, respectively. The light capturing rod 61 includes a light transmitting rod 2' and at least one optical coupling structure 3 disposed within the light transmitting rod 2'.

The light transmitting rod 2' has a circular or elliptical cross-sectional shape in a plane orthogonal to a central axis C. Similar to the first embodiment, the light transmitting rod 2' is composed of a transparent material that transmits light of a desired wavelength or in a desired wavelength band in accordance with the intended purpose.

The cover sheet 2e is attached to the outer side of the light transmitting rod 2' with the spacer 2d interposed therebetween. Therefore, most of a principal surface 2u, which is the surface of the light transmitting rod 2', is in contact with the buffer layer 2f. The spacer 2d is composed of a material with a low refractive index, such as aerogel.

In a case where the light transmitting rod 2' has a circular cross-sectional shape, a diameter D in the cross section orthogonal to the central axis C of the light transmitting rod 2' is, for example, about 0.05 mm to 2 mm. At least one optical coupling structure 3 is provided distant from the principal surface 2u of the light transmitting rod 2' by a distance d3 or larger in a direction toward the central axis C. The light capturing rod 61 may be provided with a plurality of optical coupling structures 3. The light transmitting rod 2' has a circular or elliptical cross-sectional shape. In a plane orthogonal to the central axis C of the light transmitting rod 2', the optical coupling structures 3 have a circular shape with a diameter d equal to (D−2×d3) and centered on the central axis C, and are arranged within a core region 2A extending in the direction of the central axis C.

In the core region 2A, the optical coupling structures 3 are arranged at predetermined densities in the axial direction, the radial direction, and the circumferential direction. For example, with regard to the densities of the optical coupling structures 3, about 10 to $10^3$ structures are arranged per 1 mm in the axial direction, about 10 to $10^3$ structures are arranged per 1 mm in the radial direction, and about 10 to $10^3$ structures are arranged per 1 mm in the circumferential direction. The core region has a circular or elliptical cross-sectional shape and may have two or more orbicular shapes.

The optical coupling structures 3 have the same structure as the optical coupling structures 3 in the first embodiment.

In each optical coupling structure 3, the diffraction grating in the third light-transmitting layer 3c is disposed within the core region 2A so as to be parallel to the central axis C of the light transmitting rod 2'. The length L of the optical coupling structure 3 in the direction of the central axis C is between 3 μm and 100 μm, and the length W in a direction orthogonal thereto is about ⅓ to 1/10 of L.

In FIGS. 16A and 16B, the refractive index of the ambient medium surrounding the light capturing rod 61 is 1.0, and the refractive index of the light transmitting rod 2' is defined as $n_s$. Light 4 from the ambient medium is transmitted through the cover sheet 2e and the buffer layer 2f and enters the light transmitting rod 2' through the principal surface 2u of the light transmitting rod 2'. The buffer layer 2f is constituted of the same medium as the ambient medium and has a refractive index of 1. The refractive index of the spacer 2d is also substantially equal to 1. In order to enhance transmittance of the incident light 4, the opposite surfaces of the cover sheet 2e or the principal surface 2u may each be provided with an AR coating or a non-reflective nano-structure (such as a moth-eye structure). Of light beams within the light transmitting rod 2', a light beam whose angle θ (propagation angle) formed between the propagating direction thereof and the normal line of the rod surface satisfies $\sin \theta < 1/n_s$ will be referred to as "inside-critical-angle light beam", and a light beam whose angle θ satisfies $\sin \theta \geq 1/n_s$ will be referred to as "outside-critical-angle light beam".

First, light vectors in the cross section parallel to the central axis C of the light transmitting rod 2' will be discussed. In this cross section, a portion of an inside-critical-angle light beam 5a within the light transmitting rod 2' is converted into an outside-critical-angle light beam 5b by an optical coupling structure 3. This light beam is totally reflected at the principal surface 2u and becomes an outside-critical-angle light beam 5c that remains within the light transmitting rod 2'. A portion of a remaining inside-critical-angle light beam 5a' of the inside-critical-angle light beam 5a is converted into an outside-critical-angle light beam 5b' by another optical coupling structure 3. This light beam is totally reflected at the principal surface 2u and becomes an outside-critical-angle light beam 5c' that remains within the rod. Accordingly, the inside-critical-angle light beam 5a is entirely converted into the outside-critical-angle light beam 5b or 5b' within the core region 2A in which the optical coupling structures 3 are provided. On the other hand, a portion of an outside-critical-angle light beam 6a within the light transmitting rod 2' is totally reflected at the surface of an optical coupling structure 3 so as to become an outside-critical-angle light beam 6b. This light beam is totally reflected at the principal surface 2u and becomes an outside-critical-angle light beam 6c that remains within the rod. A portion of a remaining light beam of the outside-critical-angle light beam 6a is transmitted through the core region 2A where the optical coupling structures 3 are provided.

This outside-critical-angle light beam 6b' is totally reflected at the principal surface 2u and becomes an outside-critical-angle light beam 6c' that remains within the light transmitting rod 2'. Although not shown, an outside-critical-angle light beam that remains within the rod while being totally reflected between different optical coupling structures 3 and by the principal surface 2u also exists.

As described with reference to FIG. 2A, the inside-critical-angle light beam 5a is transmitted through the surface 3q of the second light-transmitting layer 3b, and a portion thereof is converted into guided light 5B that propagates through the third light-transmitting layer 3c as a result of the effect of the diffraction grating. The remaining portion mainly becomes an inside-critical-angle light beam 5a' as transmitted light or diffracted light and is transmitted through the optical coupling structure 3, or becomes an inside-critical-angle light beam 5r as reflected light and is transmitted through the optical coupling structure 3. With regard to the guided light 5B, a portion thereof is radiated in the same direction as the inside-critical-angle light beam 5r before reaching the end surface 3S of the third light-transmitting layer 3c and becomes an inside-critical-angle light beam 5r'. The remaining portion is guided and radiated from the end surface 3S of the third light-transmitting layer 3c and becomes an outside-critical-angle light beam 5c. The outside-critical-angle light beam 6a is totally reflected at the surface 3q of the second light-transmitting layer 3b and entirely becomes an outside-critical-angle light beam 6b. Accordingly, an outside-critical-angle light incident on the surfaces of the optical coupling structure 3 (i.e., the surface 3p of the first light-transmitting layer 3a and the surface 3q of the second light-transmitting layer 3b) is reflected as-is as an outside-critical-angle light beam, whereas a portion of an inside-critical-angle light beam is converted into an outside-critical-angle light beam.

Next, light vectors in the cross section orthogonal to the central axis of the rod will be discussed. In this cross section, light entering the rod is classified into three types, which are a light beam 15a traveling through the core region 2A, a light beam 15b traveling along an outer edge of the core region 2A, and a light beam 15c traveling outside the core region 2A. As described above, in the cross section extending along the central axis of the rod, the light beam 15a is converted into an inside-critical-angle light beam that remains within the rod. On the other hand, the light beam 15b is a light beam incident on the principal surface 2u of the rod at an angle ψ, and ψ satisfies expression (3).

[Math. 3]

$$\sin\psi = \frac{d}{D} \quad (3)$$

Naturally, an incident angle of the light beam 15c on the principal surface 2u is larger than ψ. Therefore, when expression (4) is satisfied, the light beam 15b is totally reflected at the principal surface 2u of the rod, and the light beams 15b and 15c each become an outside-critical-angle light beam that remains within the light transmitting rod 2' in the cross section orthogonal to the central axis.

[Math. 4]

$$\frac{d}{D} \geq \frac{1}{n_0} \quad (4)$$

Consequently, as a condition for all light beams within the light transmitting rod 2' to remain within the light transmitting rod 2', expression (4) needs to be satisfied for both the cross section parallel to the central axis C of the light transmitting rod 2' and the cross section orthogonal to the central axis C of the light transmitting rod 2'.

In FIG. 16A, the principal surface 2u of the light transmitting rod 2' is covered with the cover sheet 2e via the buffer layer 2f. Therefore, foreign matter 2g, such as water droplets, adheres to the surface of the cover sheet 2e and is thus prevented from coming into contact with the principal surface 2u. If the foreign matter 2g comes into contact with the principal surface 2u, the relationship of total reflection at that contact surface becomes lost, causing an outside-critical-angle light beam trapped within the light transmitting rod 2' to leak outside via the foreign matter 2g. Although the spacer 2d is also in contact with the principal surface 2u, since the refractive index thereof is substantially no different from the refractive index of the ambient medium, the relationship of total reflection at that contact surface is maintained. Thus, an outside-critical-angle light beam does not leak outside via the spacer 2d. If the surface area of the light transmitting rod is small, a configuration in which the buffer layer 2f is formed between the cover sheet 2e and the principal surface 2u without interposing the spacer 2d therebetween is also conceivable.

Figure 17:
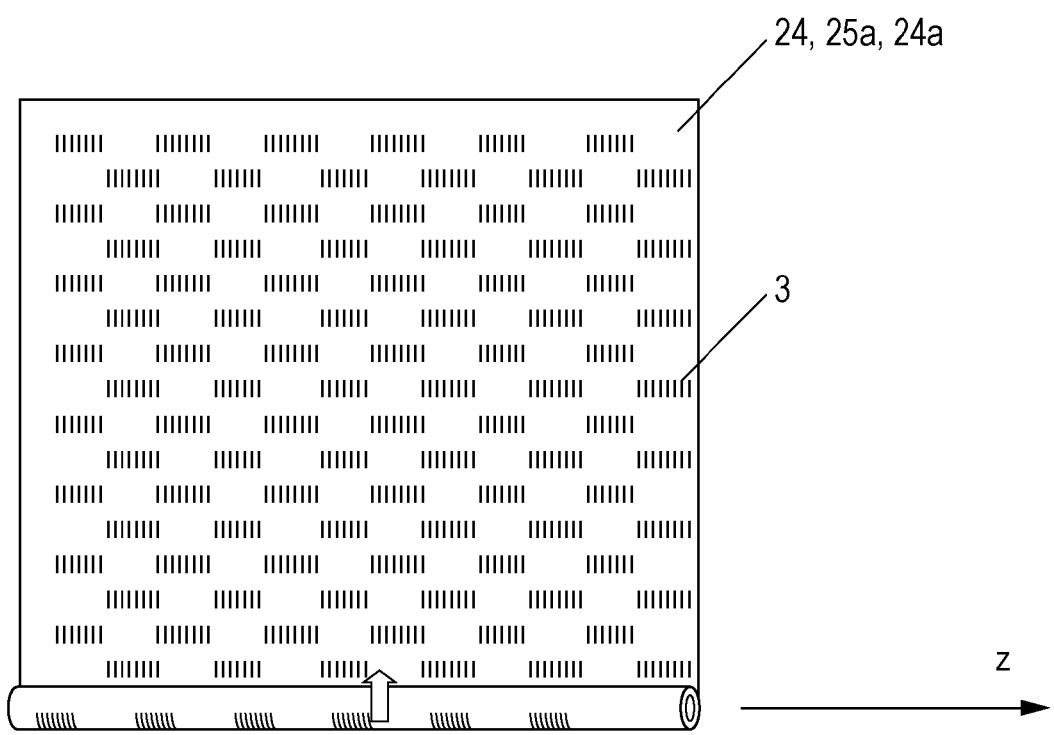
FIG. 17 schematically illustrates a procedure for manufacturing the light capturing rod shown in FIG. 16.

FIG. 17 is a cross-sectional view schematically illustrating a procedure for fabricating the light capturing rod 61. As shown in FIG. 17, the high refractive-index films 24 and 24a and the low refractive-index film 25a fabricated to the structure shown in FIG. 7E are prepared based on the same method as in the first embodiment. With regard to grating vectors of the diffraction gratings that form the optical coupling structures 3 on these laminated films, diffraction gratings having various pitches may be combined such that a pitch measured along the z-axis ranges between 0.30 μm and 2.80 μm. The size of each optical coupling structure 3 is set such that the length L in the z-axis direction is between 3 μm and 100 μm and the length W in the direction orthogonal thereto is about ½ to ¹⁄₁₀ of L, so that coupled guided light can be radiated along the central axis of the rod as much as possible. By applying an adhesive to the surface of each laminated film and winding the laminated film by rotating it about the z-axis, the core region 2A of the light capturing rod 61 can be formed. By further wrapping therearound a transparent protective layer provided with a non-reflective nano-structure, the light capturing rod 61 is completed.

FIGS. 18A to 18D include cross-sectional views schematically illustrating another procedure for fabricating the light capturing rod 61. FIG. 18E is a plan view schematically illustrating a mask pattern used for forming the rod.

Figure 18A:
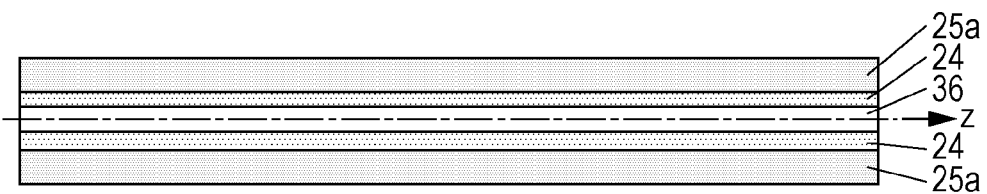
FIG. 18A is a diagram schematically illustrating another procedure for manufacturing the light capturing rod shown in FIG. 16.
Figure 18B:
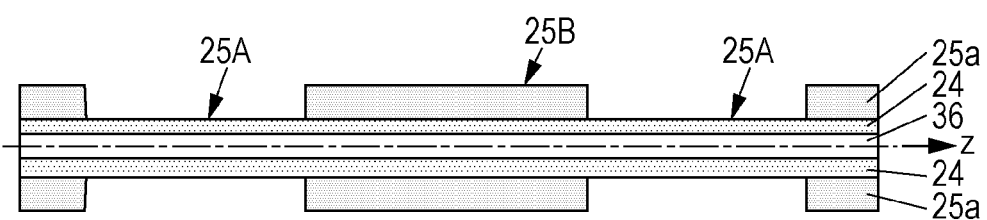
FIG. 18B is a diagram schematically illustrating another procedure for manufacturing the light capturing rod shown in FIG. 16.

As shown in FIG. 18A, a high refractive-index film 24 composed of, for example, SiN is formed over the surface of a transparent rod-shaped shaft 36, and a low refractive-index film 25a composed of, for example, $SiO_2$ is formed over the surface of the high refractive-index film 24. A resist is applied onto the low refractive-index film 25a. After performing exposure in a z-axis-aligned state using a mask pattern shown in FIG. 18E and removing the resist in photosensitive portions, the low refractive-index film is etched by using the high refractive-index film 24 as a stopper, and the remaining resist is removed, whereby a structure shown in FIG. 18B is obtained. In FIG. 18E, the mask surface is divided into two regions, that is, a transmission region 35A and a light shield region 35B, and regions 25A and 25B formed in FIG. 18B correspond to the regions 35A and 35B, respectively, of the mask pattern. The film formation step, the exposure step, and the etching step are performed while rotating the shaft 36 about the central axis, where appropriate. The low refractive-index film 25a has a pattern that includes the regions 25A where the low refractive-index film 25a has been etched such that the high refractive-index film 24 is exposed, and the regions 25B where the low refractive-index film 25a remains without being etched. A step formed between these two kinds of regions ranges from, for example, 1 μm to 3 μm.

Figure 18C:
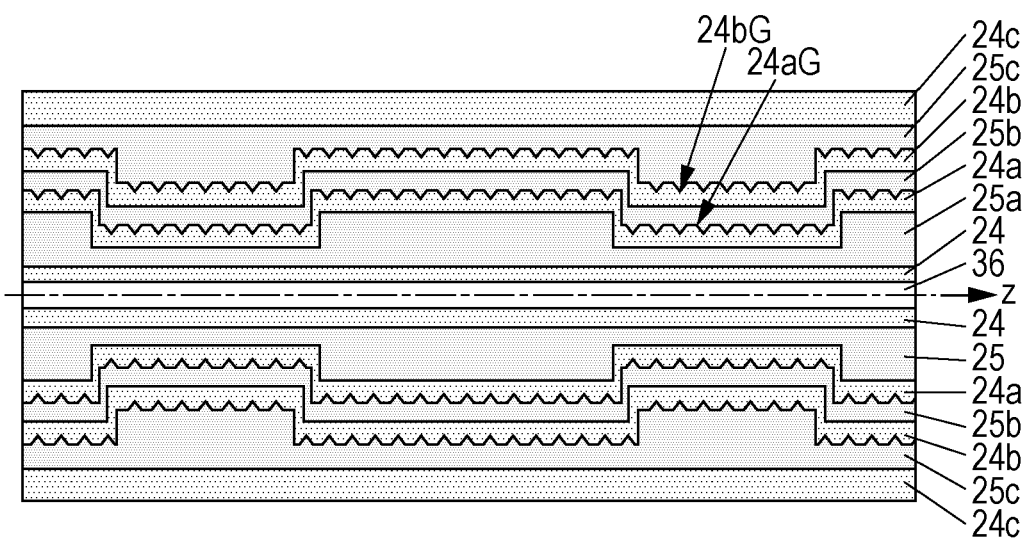
FIG. 18C is a diagram schematically illustrating another procedure for manufacturing the light capturing rod shown in FIG. 16.
Figure 18D:
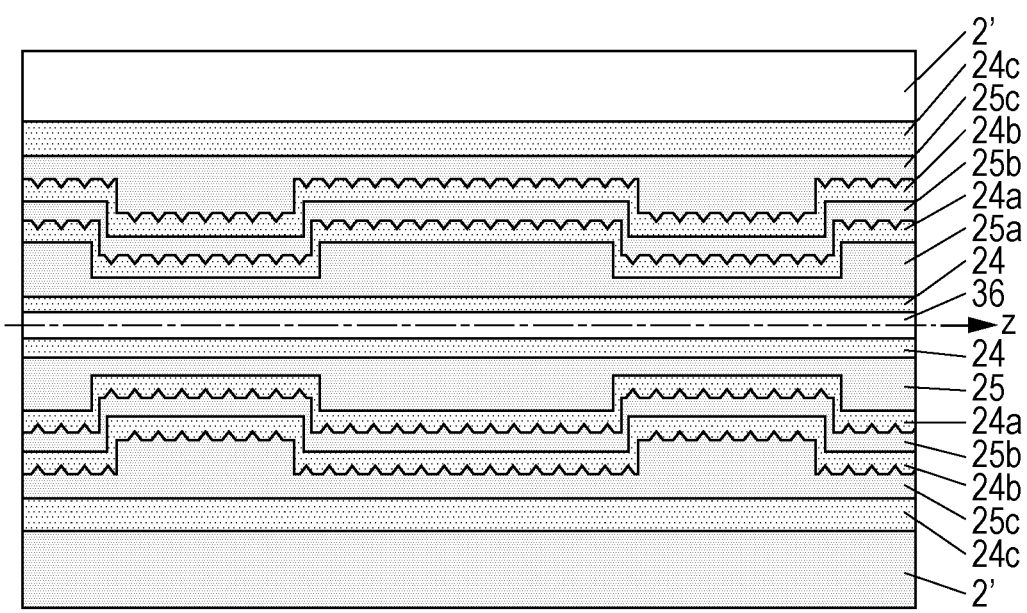
FIG. 18D is a diagram schematically illustrating another procedure for manufacturing the light capturing rod shown in FIG. 16.
Figure 18E:
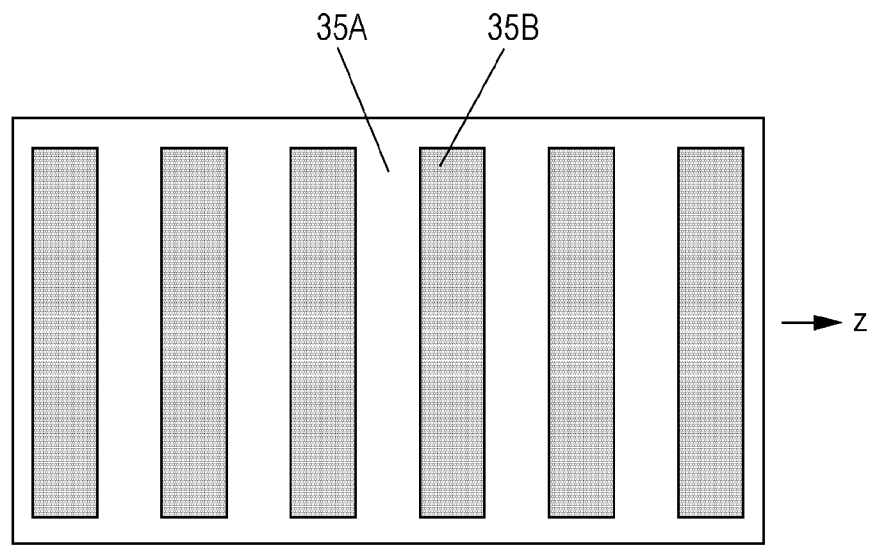
FIG. 18E is a plan view schematically illustrating a mask pattern used for manufacturing the light capturing rod shown in FIG. 16.

Subsequently, steps similar to those in the manufacturing method according to the first embodiment described with reference to FIG. 7I are performed so that the high refractive-index film 24c is formed over the low refractive-index film 25c having the flattened surface, whereby the core region of the light capturing rod shown in FIG. 18C is completed. Furthermore, the high refractive-index film 24c is shielded with a low refractive-index transparent film so that the light capturing rod shown in FIG. 18D is completed. As described in the first embodiment, each high refractive-index film extends continuously with no seams, unlike the description with reference to FIGS. 16A and 16B. However, since the high refractive-index film is bent at the borders between the regions 25A and the regions 25B, the guide layer is split along these bent portions. Furthermore, since the high refractive-index films respectively sandwich the low refractive-index films in all of the regions, the high refractive-index films are completely separated from the peripheral high refractive-index films. Therefore, similar to the description with reference to FIGS. 16A and 16B, light incident on each high refractive-index film (i.e., the third light-transmitting layer 3c) is converted into guided light, and this guided light is radiated into the rod as an outside-critical-angle light beam at a bent portion.

As described in the first embodiment, the two-beam interference exposure method can be used for forming the diffraction gratings. Furthermore, in a case where each optical coupling structure 3 of the light capturing rod has the structure shown in FIG. 2F, the manufacturing process can be similarly performed based on the manufacturing method described with reference to FIG. 7B.

Tenth Embodiment

Although tenth to eleventh embodiments will be discussed below, since a description related to the cover sheet 2e is the same as that in the ninth embodiment, a redundant description thereof will therefore be omitted.

Figure 19:
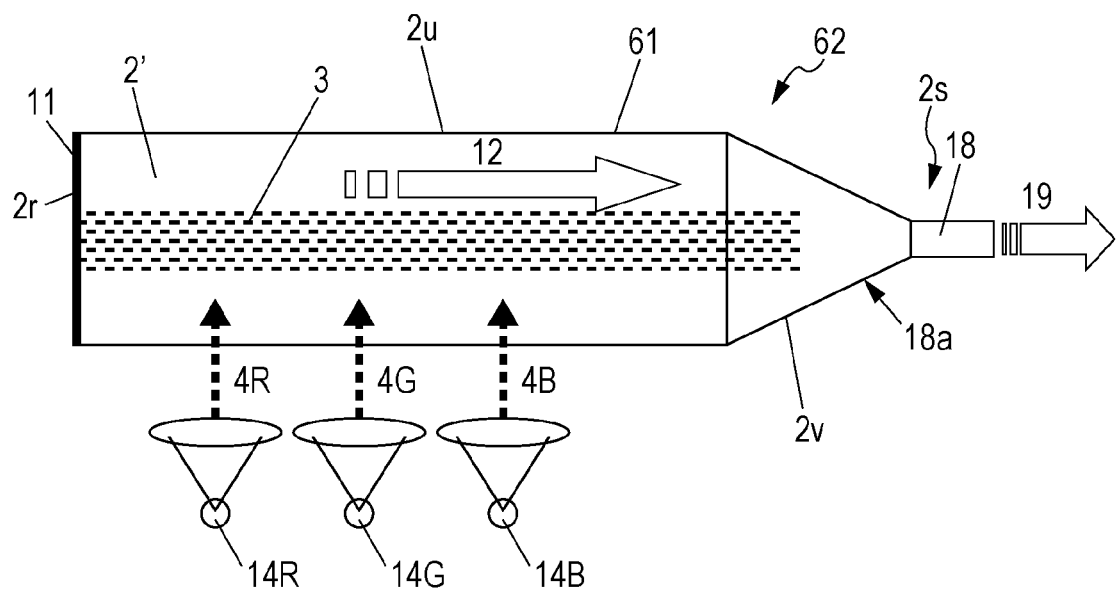
FIG. 19 is a cross-sectional view schematically illustrating a light emitting device according to an embodiment of the present disclosure.

A light emitting device according to an embodiment of the present disclosure will now be described. FIG. 19 schematically illustrates a cross-sectional structure of a light emitting device 62 according to this embodiment. The light emitting device 62 includes the light capturing rod 61 and light sources 14R, 14G, and 14B. The light capturing rod 61 has the structure described in the ninth embodiment.

The end surface 2r of the light capturing rod 61 is provided with a reflective film 11. The principal surface 2u at the end surface 2s of the light capturing rod 61 is provided with a taper 2v and may be connected to a waveguide 18 having a diameter smaller than that of the light transmitting rod 2'.

The light sources 14R, 14G, and 14B are constituted of, for example, lasers or LEDs and emit, for example, red, green, and blue light beams, respectively. The light beams emitted from these light sources are collected by lenses, from which light beams 4R, 4G, and 4B are radiated toward the principal surface 2u of the light transmitting rod 2'.

These light beams are trapped within the light transmitting rod 2' by the optical coupling structures 3 within the core region 2A. Since the end surface 2r is covered with the reflective film 11, the light beams entirely become guided light 12 that propagates through the rod in one direction. This guided light 12 is narrowed down without loss by the taper 2v in which the diameter of the light transmitting rod 2' gradually decreases, so as to become guided light that propagates through the waveguide 18 having the smaller diameter. Thus, light 19 similar to a point light source is output from an end surface of the waveguide 18. In a case where the light sources are lasers, although the light beams 4R, 4G, and 4B are coherent light beams, since radiation of the light beams from the individual optical coupling structures 3 is performed with different phases, the guided light 12 obtained as a result of combining these light beams becomes incoherent light. Therefore, the output light 19 is also incoherent light. By adjusting the quantities of the light beams 4R, 4G, and 4B, the output light 19 can be made into white light. Currently, red and blue semiconductor lasers are available, and a green laser can also be used by employing SHG. In a case where white light is to be generated from these light sources, a complicated optical configuration is normally required, and glary light is generated due to coherence specific to laser light. However, with the light emitting device 62 according to this embodiment, a point light source of more-natural, glare-free white light can be provided with an extremely simple configuration.

Figure 20:
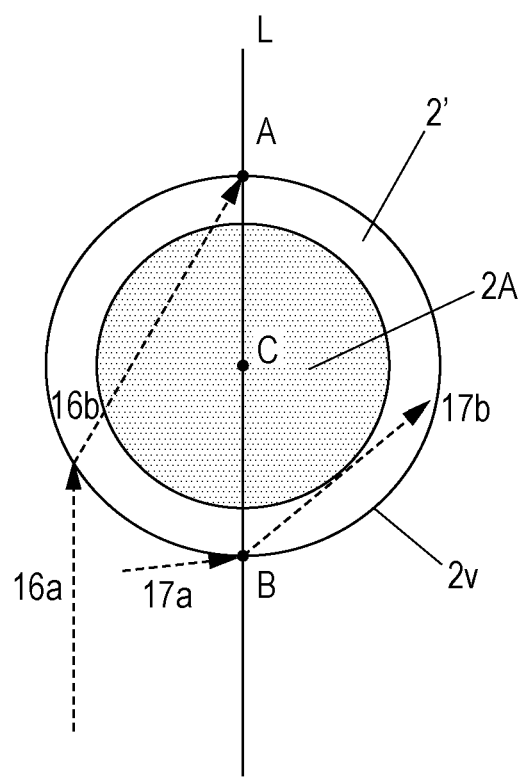
FIG. 20 is a cross-sectional view illustrating a state where light enters a light capturing rod of the light emitting device shown in FIG. 19.

In the case of this embodiment, convergent light obtained from the incident light beams 4R, 4G, and 4B requires adjustment, and the light transmitting rod 2' requires positional adjustment. FIG. 20 is a cross-sectional view illustrating a state where light enters the light capturing rod 61. A point C denotes the center of the rod. Assuming that the refractive index of the light transmitting rod 2' is 1.5, a light beam 16a that is parallel to a line ACB is refracted and becomes a light beam 16b that approximately converges on a point A. Assuming that the diameter of the core region 2A is larger than 1/1.5 of the diameter of the light transmitting rod 2', the light beam 16b reliably travels through the core region 2A based on expression (4) and becomes trapped within the light transmitting rod 2'. In contrast, it is difficult to draw a light beam that does not travel through the core region 2A. For example, with regard to a light beam 17b that becomes incident on a point B but does not travel through the core region, an incident light beam 17a therefor is a light beam with an incident angle close to 90 degrees. In this case, the incident light beam 17a corresponds to an outermost light beam collected based on a high numerical aperture. In other words, light beams with general incident angles, namely, light beams collected based on general numerical apertures, all travel through the core region 2A and become trapped within the light transmitting rod 2'. This indicates the ease of adjustability in that the positional adjustment between the incident light beams 4R, 4G, and 4B and the light transmitting rod 2' may be extremely rough.

In this embodiment, the light sources 14R, 14G, and 14B may each have an infrared wavelength used for optical communication, such as 0.98 μm or 1.48 μm. In this case, this embodiment can be realized as an optical-fiber amplifier.

Figure 21A:
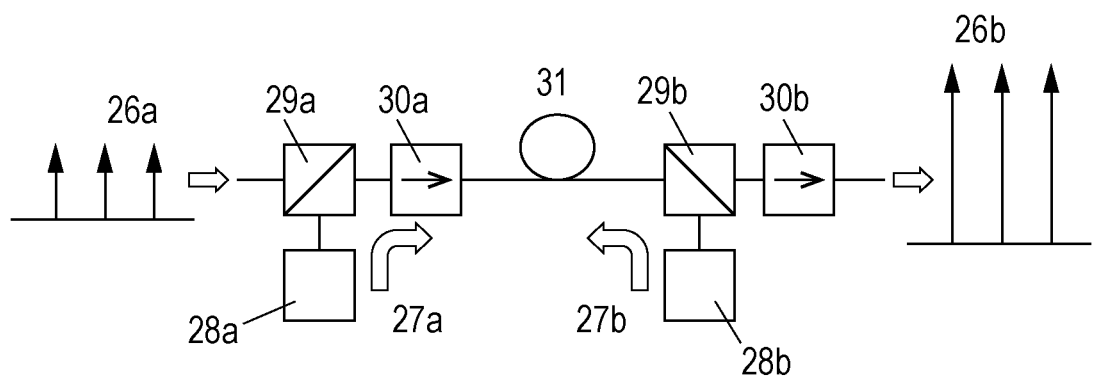
FIG. 21A is a configuration diagram schematically illustrating an optical-fiber amplifier according to an embodiment.

FIG. 21A illustrates the configuration of an amplifier in optical communication according to this embodiment. An optical-fiber amplifier includes excitation light sources 28a and 28b, optical multiplexers 29a and 29b, isolators 30a and 30b, and an optical fiber 31. The light emitting device 62 described above is used as each of the excitation light sources 28a and 28b. As each of the light sources 14R, 14G, and 14B of the light emitting device 62, an 0.98-μm or 1.48-μm infrared light source is used.

Signal light 26a and excitation light 27a from the 0.98-μm excitation light source 28a are combined at the optical multiplexer 29a, rectified at the isolator 30a, and propagate through the fiber 31. Excitation light 27b from the 0.98-μm or 1.48-μm excitation light source 28b is combined at the optical multiplexer 29b and propagates through the fiber 31 in the opposite direction.

Figure 21B:
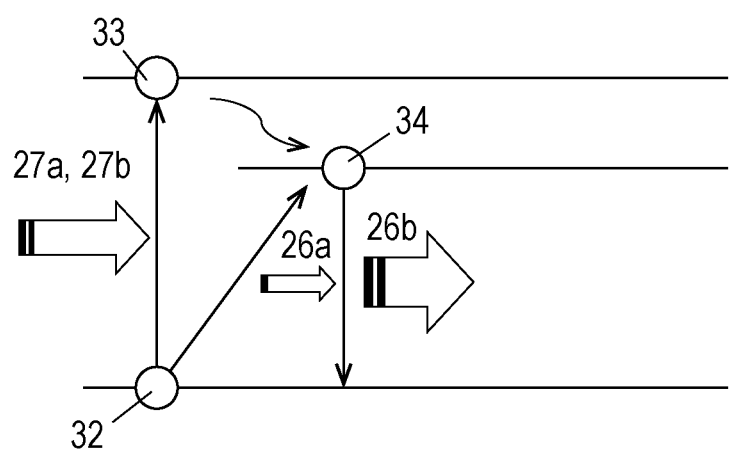
FIG. 21B is a configuration diagram schematically illustrating an optical-fiber amplifier according to an embodiment.

Erbium is added to the core of the optical fiber 31. FIG. 21B illustrates the principle for amplifying signal light in optical communication. As shown in FIG. 21B, an $Er^{3+}$ ion absorbs excitation light having a wavelength of 0.98 μm such that its energy level transitions from a ground level 32 to an excitation level 33, returns to an excitation level 34 by undergoing non-radiative relaxation, and then undergoes stimulated emission so as to amplify the signal light 26a (amplified signal 26b). Likewise, the $Er^{3+}$ ion absorbs excitation light having a wavelength of 1.48 such that its energy level transitions from the ground level 32 to the excitation level 34 and undergoes stimulated emission so as to amplify the signal light 26a (amplified signal 26b).

Therefore, the signal light is amplified within the fiber 31, rectified at the isolator 30b, and is extracted as amplified signal 26b. Although the excitation light does not have to be coherent, it is necessary to input 0.98-μm or 1.48-μm infrared light into the optical fiber. The amplification factor for the signal light is increased with increasing light intensity within the fiber. According to this embodiment, high-density high-intensity excitation light can be readily input to the optical fiber. Thus, an amplifier with a high amplification factor can be readily provided.

Eleventh Embodiment

Figure 22:
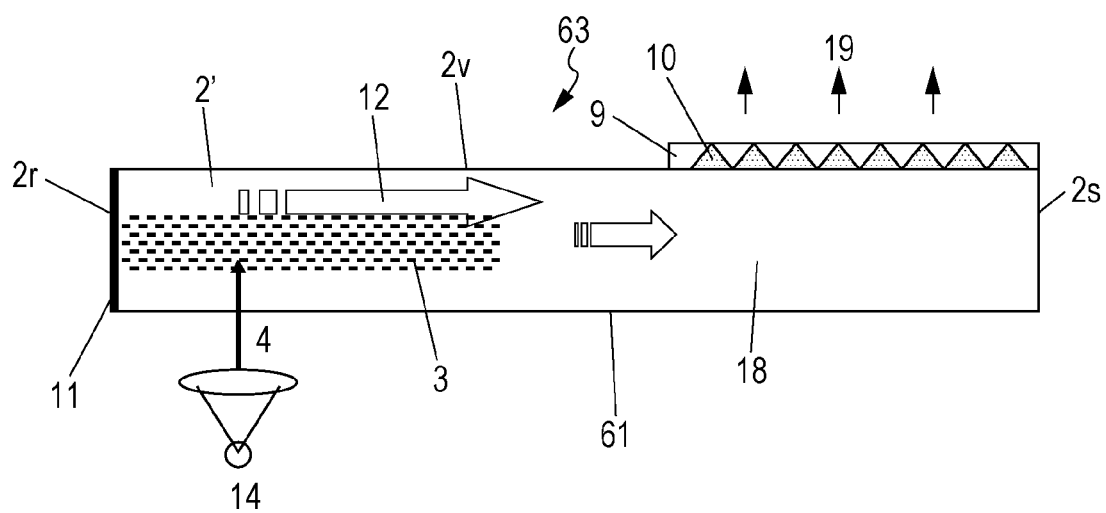
FIG. 22 is a cross-sectional view schematically illustrating a light emitting device according to another embodiment of the present disclosure.

A light emitting device according to another embodiment of the present disclosure will now be described. FIG. 22 schematically illustrates a cross-sectional structure of a light emitting device 63 according to this embodiment. The light emitting device 63 includes the light capturing rod 61, the light source 14, and the prism sheet 9. The light capturing rod 61 has the structure described in the ninth embodiment.

The end surface 2r of the light capturing rod 61 is provided with a reflective film 11. In the light capturing rod 61, a portion thereof that is not provided with the optical coupling structures 3 functions as the waveguide 18. The principal surface 2u of the waveguide 18 is provided with the prism sheet 9.

The light source 14 is constituted of, for example, a laser or an LED and emits visible light. The light emitted from this light source is collected by a lens and becomes light 4 that is transmitted through the light transmitting rod 2'. The light is trapped within the light transmitting rod 2' by the optical coupling structures 3 within the core region 2A. Since one of the end surfaces is covered with the reflective film 11, the light entirely becomes light 12 that propagates through the light transmitting rod 2' in one direction, thereby becoming guided light that propagates through the waveguide 18. The prism sheet 9 is disposed in contact with the waveguide 18. In the prism sheet 9, the tetrahedral prisms 10 are arranged adjacent to each other. Alternatively, sheets of triangular prism rows may be bonded orthogonally to each other. Since the refractive index of the prisms 10 is higher than the refractive index of the prism sheet 9, light leaking from the waveguide 18 and entering the prism sheet 9 is refracted and output from the prism sheet 9 and becomes collimated output light 19. The prism sheet 9 may alternatively be disposed away from the waveguide 18. In this case, the surface of the waveguide 18 facing the prism sheet 9 is provided with an irregular-surface structure so as to output light.

In a case where the light source is a laser, although the light 4 is coherent light, since radiation of the light beams from the individual optical coupling structures 3 is performed with different phases, the guided light 12 obtained as a result of combining the light beams becomes incoherent light. Therefore, the output light 19 is also incoherent light. Currently, red and blue semiconductor lasers are available, and a green laser can also be used by employing SHG. When these types of light sources are used, red, green, and blue line light sources are obtained. For example, by binding these line light sources together, a color backlight for a liquid crystal display can be provided with an extremely simple configuration.

The light capturing sheet and the light capturing rod according to the present disclosure are capable of capturing light at all incident angles over a wide region and a wide wavelength range (e.g., the entire visible light range) without being affected by water droplets, dust, contamination, and so on, and the light receiving device using the light capturing sheet or the light capturing rod is applicable to, for example, a solar battery with high conversion efficiency. On the other hand, the light receiving and light emitting devices using the light capturing sheet or the light capturing rod according to the present disclosure provide new forms of illuminators or light sources and are applicable as recycling illuminators that utilize sunlight or illumination light, high-efficiency backlights, incoherent white light sources, or signal amplifiers in optical communication.

What is claimed is:

1. A light capturing sheet comprising:
    a light transmitting sheet having first and second principal surfaces; and
    a plurality of optical coupling structures that are disposed within the light transmitting sheet and that are distant from the first and second principal surfaces by first and second distances or more, respectively,
    wherein the plurality of optical coupling structures each include a first light-transmitting layer, a second light-transmitting layer, and a third light-transmitting layer interposed between the first light-transmitting layer and the second light-transmitting layer,
    wherein a refractive index of each of the first and second light-transmitting layers is lower than a refractive index of the light transmitting sheet,
    wherein a refractive index of the third light-transmitting layer is higher than the refractive index of each of the first and second light-transmitting layers,
    wherein the plurality of optical coupling structures each have a diffraction grating that is parallel to the first and second principal surfaces of the light transmitting sheet,
    wherein the plurality of optical coupling structures are three-dimensionally arranged within the light transmitting sheet in first and second directions, which are different from each other in a plane parallel to the first and second principal surfaces, and in a third direction that is not parallel to the first and second directions,
    wherein a plurality of the optical coupling structures arranged in the first and second directions in the plane constitute a first group of optical coupling structures,
    wherein a plurality of the optical coupling structures arranged in the first and second directions in another plane parallel to the plane constitute a second group of optical coupling structures, wherein the first group of optical coupling structures and the second group of optical coupling structures are adjacent to each other in the third direction, wherein each optical coupling structure constituting the first group of optical coupling structures and each optical coupling structure constituting the second group of optical coupling structures do not overlap with each other in the third direction, and wherein the third light-transmitting layer in a first optical coupling structure included in the first group of optical coupling structures and the third light-transmitting layer in a second optical coupling structure included in the second group of optical coupling structures and adjacent to the first optical coupling structure are connected to each other by a connection portion composed of a material identical to the third light-transmitting layer.

2. The light capturing sheet according to claim 1, wherein the first light-transmitting layer and the second light-transmitting layer each have a plurality of high refractive-index portions and a plurality of low refractive-index portions that are alternately arranged in a direction parallel to the first and second principal surfaces of the light transmitting sheet, wherein refractive indices of the plurality of high refractive-index portions and the plurality of low refractive-index portions in each of the first and second light-transmitting layers are lower than the refractive index of the light transmitting sheet, wherein the refractive index of the third light-transmitting layer is higher than the refractive indices of the plurality of high refractive-index portions and the plurality of low refractive-index portions in each of the first and second light-transmitting layers, and wherein the refractive index of the plurality of high refractive-index portions is higher than the refractive index of the plurality of low refractive-index portions.

3. The light capturing sheet according to claim 1, wherein the first light-transmitting layer in the first optical coupling structure and the first light-transmitting layer in the second optical coupling structure are connected to each other by a connection portion composed of a material identical to the first light-transmitting layer, and wherein the second light-transmitting layer in the first optical coupling structure and the second light-transmitting layer in the second optical coupling structure are connected to each other by a connection portion composed of a material identical to the second light-transmitting layer.

4. The light capturing sheet according to claim 1, wherein the optical coupling structures in the first group and the optical coupling structures in the second group each have a rectangular shape in the plane parallel to the first and second principal surfaces, and wherein the first group of optical coupling structures and the second group of optical coupling structures are each arranged in a checkered pattern without overlapping when viewed from a direction orthogonal to the first and second principal surfaces.

5. The light capturing sheet according to claim 1, wherein the optical coupling structures in the first group and the optical coupling structures in the second group each have a hexagonal shape in the plane parallel to the first and second principal surfaces, and wherein in at least two adjacent optical coupling structures in each of the first group of optical coupling structures and the second group of optical coupling structures, the first light-transmitting layers, the second light-transmitting layers, and the third light-transmitting layers are respectively connected to each other.

6. The light capturing sheet according to claim 1, wherein in at least two of the plurality of optical coupling structures, the diffraction gratings extend in directions different from each other, or the diffraction gratings have pitches different from each other.

7. The light capturing sheet according to claim 1, wherein a surface, which is in contact with the light transmitting sheet, of the first light-transmitting layer in at least one of the plurality of optical coupling structures, a surface, which is in contact with the light transmitting sheet, of the second light-transmitting layer in at least one of the plurality of optical coupling structures, the first principal surface, or the second principal surface is provided with an irregular-surface structure whose pitch and height are smaller than or equal to $\frac{1}{3}$ of a central wavelength of light entering the optical coupling structure.

8. A light receiving device comprising:

the light capturing sheet according to claim 1; and a photoelectric converter provided at any one of the first principal surface and the second principal surface of the light capturing sheet, and an end surface adjacent to the first principal surface and the second principal surface.

9. A light receiving device comprising:

the light capturing sheet according to claim 1;

a second one of the light capturing sheet according to claim 1; and a photoelectric converter provided at the first principal surface of the light capturing sheet, wherein an end surface of the second one of the light capturing sheet is connected to the second principal surface of the light capturing sheet.

10. A light receiving device comprising:

the light capturing sheet according to claim 1; and an irregular-surface structure provided at a part of the first principal surface or the second principal surface of the light capturing sheet.

11. A light capturing rod comprising:

a light transmitting rod that has a principal surface and that is circular or elliptical in cross section; and a plurality of optical coupling structures that are disposed within the light transmitting rod and that are distant from the principal surface by a first distance or more, wherein the plurality of optical coupling structures each include a first light-transmitting layer, a second light-transmitting layer, and a third light-transmitting layer interposed between the first light-transmitting layer and the second light-transmitting layer, wherein a refractive index of each of the first and second light-transmitting layers is lower than a refractive index of the light transmitting rod, wherein a refractive index of the third light-transmitting layer is higher than the refractive index of each of the first and second light-transmitting layers, wherein the plurality of optical coupling structures each have a diffraction grating that is parallel to a central axis of the light transmitting rod, wherein the plurality of optical coupling structures are three-dimensionally arranged within the light transmitting rod in first and second directions, which are different from each other in a cylindrical side surface located at a predetermined distance from the central axis of the rod, and in a third direction extending from the cylindrical side surface toward the central axis, wherein a plurality of the optical coupling structures arranged in the first and second directions in the cylindrical side surface constitute a first group of optical coupling structures, wherein a plurality of the optical coupling structures arranged in the first and second directions in another cylindrical side surface whose distance from the central axis of the rod is different from the cylindrical side surface constitute a second group of optical coupling structures, wherein the first group of optical coupling structures and the second group of optical coupling structures are adjacent to each other in the third direction, wherein each optical coupling structure constituting the first group of optical coupling structures and each optical coupling structure constituting the second group of optical coupling structures do not overlap with each other in the third direction, and wherein the third light-transmitting layer in a first optical coupling structure included in the first group of optical coupling structures and the third light-transmitting layer in a second optical coupling structure included in the second group of optical coupling structures and adjacent to the first optical coupling structure are connected to each other by a connection portion composed of a material identical to the third light-transmitting layer.

12. The light capturing rod according to claim 11, wherein the first light-transmitting layer and the second light-transmitting layer each have a plurality of high refractive-index portions and a plurality of low refractive-index portions that are alternately arranged in a direction parallel to the principal surface of the light transmitting rod, wherein refractive indices of the plurality of high refractive-index portions and the plurality of low refractive-index portions in each of the first and second light-transmitting layers are lower than the refractive index of the light transmitting rod, wherein the refractive index of the third light-transmitting layer is higher than the refractive indices of the plurality of high refractive-index portions and the plurality of low refractive-index portions in each of the first and second light-transmitting layers, and wherein the refractive index of the plurality of high refractive-index portions is higher than the refractive index of the plurality of low refractive-index portions.

13. The light capturing rod according to claim 11, wherein the first light-transmitting layer in the first optical coupling structure and the first light-transmitting layer in the second optical coupling structure are connected to each other by a connection portion composed of a material identical to the first light-transmitting layer, and wherein the second light-transmitting layer in the first optical coupling structure and the second light-transmitting layer in the second optical coupling structure are connected to each other by a connection portion composed of a material identical to the second light-transmitting layer.

14. The light capturing rod according to claim 11, wherein the optical coupling structures in the first group and the optical coupling structures in the second group each have a rectangular shape in a plane parallel to the principal surface, and wherein the first group of optical coupling structures and the second group of optical coupling structures are each arranged in a checkered pattern without overlapping when viewed from a direction orthogonal to the principal surface.

15. The light capturing rod according to claim 11, wherein the optical coupling structures in the first group and the optical coupling structures in the second group each have a hexagonal shape in a plane parallel to the principal surface, and wherein in at least two adjacent optical coupling structures in each of the first group of optical coupling structures and the second group of optical coupling structures, the first light-transmitting layers, the second light-transmitting layers, and the third light-transmitting layers are respectively connected to each other.

16. The light capturing rod according to claim 11, wherein in at least two of the plurality of optical coupling structures, the diffraction gratings extend in directions different from each other, or the diffraction gratings have pitches different from each other.

17. The light capturing rod according to claim 11, wherein a surface, which is in contact with the light transmitting rod, of the first light-transmitting layer in at least one of the plurality of optical coupling structures, a surface, which is in contact with the light transmitting rod, of the second light-transmitting layer in at least one of the plurality of optical coupling structures, or the principal surface is provided with an irregular-surface structure whose pitch and height are smaller than or equal to $\frac{1}{3}$ of a central wavelength of light entering the optical coupling structure.

18. A light emitting device comprising:

the light capturing rod according to claim 11; and at least one light source disposed near a principal surface of the light transmitting rod.

19. The light emitting device according to claim 18, further comprising:

a prism sheet or an irregular-surface structure provided at a part of the principal surface of the light transmitting rod.

20. An optical-fiber amplifier comprising:

an excitation light source including the light capturing rod according to claim 11 and at least one infrared light source disposed near the principal surface of the light transmitting rod;

an optical multiplexer that combines light from the excitation light source and signal light; and an optical fiber that is optically coupled to the optical multiplexer and whose core has erbium added thereto.

* * * * *